US008446127B2

(12) United States Patent
Yazami et al.

(10) Patent No.: US 8,446,127 B2
(45) Date of Patent: May 21, 2013

(54) METHODS FOR THERMODYNAMIC EVALUATION OF BATTERY STATE OF HEALTH

(75) Inventors: Rachid Yazami, Los Angeles, CA (US); Joseph McMenamin, Glendale, CA (US); Yvan Reynier, Grenoble (FR); Brent T. Fultz, Pasadena, CA (US)

(73) Assignees: California Institute of Technology, Pasadena, CA (US); Centre National de la Recherche Scientifique, Paris (FR)

( * ) Notice: Subject to any disclaimer, the term of this patent is extended or adjusted under 35 U.S.C. 154(b) by 795 days.

(21) Appl. No.: 12/537,712

(22) Filed: Aug. 7, 2009

(65) Prior Publication Data

US 2010/0090650 A1 Apr. 15, 2010

Related U.S. Application Data

(63) Continuation-in-part of application No. 11/462,290, filed on Aug. 3, 2006, now Pat. No. 7,595,611.

(60) Provisional application No. 60/705,535, filed on Aug. 3, 2005, provisional application No. 61/159,727, filed on Mar. 12, 2009.

(51) Int. Cl.
*H02J 7/04* (2006.01)

(52) U.S. Cl.
USPC ............ 320/132; 320/153; 320/152; 320/134

(58) Field of Classification Search
USPC .................. 320/127, 128, 132, 153, 137, 152
See application file for complete search history.

(56) References Cited

U.S. PATENT DOCUMENTS

| 4,295,097 | A | 10/1981 | Thompson et al. |
| 4,438,086 | A | 3/1984 | Aramaki et al. |
| 4,725,784 | A | 2/1988 | Peled et al. |
| 6,016,047 | A * | 1/2000 | Notten et al. ................. 320/137 |
| 6,068,921 | A | 5/2000 | Yamana et al. |
| 6,392,385 | B1 | 5/2002 | Barker et al. |

(Continued)

FOREIGN PATENT DOCUMENTS

| CN | 1525592 A | 9/2004 |
| CN | 1604383 A | 6/2005 |

(Continued)

OTHER PUBLICATIONS

Al Hallaj et al. (2000) "Entropy Changes Due to Structural Transformation in the Graphite Anode and Phase Change of the $LiCoO_2$ Cathode," *J. Electrochem Soc.* 147:2432-2436.

(Continued)

*Primary Examiner* — Jay Patidar
(74) *Attorney, Agent, or Firm* — Lathrop & Gage LLP

(57) ABSTRACT

Described are systems and methods for accurately characterizing thermodynamic and materials properties of electrodes and battery systems and for characterizing the state of health of electrodes and battery systems. Measurement of physical attributes of electrodes and batteries corresponding to thermodynamically stabilized electrode conditions permit determination of thermodynamic parameters, including state functions such as the Gibbs free energy, enthalpy and entropy of electrode/electrochemical cell reactions, that enable prediction of important performance attributes of electrode materials and battery systems, such as energy, power density, current rate, cycle life and state of health. Also provided are systems and methods for charging a battery according to its state of health.

33 Claims, 60 Drawing Sheets

U.S. PATENT DOCUMENTS

| | | | |
|---|---|---|---|
| 6,667,131 | B1 | 12/2003 | Vitins et al. |
| 7,109,685 | B2 | 9/2006 | Tate, Jr. et al. |
| 7,132,832 | B2 | 11/2006 | Vaullancourt et al. |
| 7,227,336 | B1 | 6/2007 | Schalkwijk et al. |
| 7,563,542 | B2 | 7/2009 | Yazami et al. |
| 7,595,611 | B2 | 9/2009 | Reynier et al. |
| 2001/0001533 | A1 | 5/2001 | Stuck Andersen et al. |
| 2004/0046564 | A1 | 3/2004 | Klang et al. |
| 2004/0128089 | A1 | 7/2004 | Barsoukov et al. |
| 2004/0220758 | A1 | 11/2004 | Barsoukov et al. |
| 2005/0073315 | A1 | 4/2005 | Murakami et al. |
| 2006/0100833 | A1 | 5/2006 | Plett |
| 2006/0208704 | A1 | 9/2006 | Iwane et al. |
| 2007/0182418 | A1 | 8/2007 | Reynier et al. |
| 2011/0121786 | A1* | 5/2011 | Tsuruta et al. ............... 320/132 |

FOREIGN PATENT DOCUMENTS

| | | |
|---|---|---|
| EP | 0 867 958 | 9/1998 |
| EP | 1 460 441 | 9/2004 |
| EP | 1 643 260 | 4/2006 |
| JP | 07065833 A2 | 3/1995 |
| JP | 09-113589 | 5/1997 |
| JP | 10-275617 | 10/1998 |
| JP | 10-302765 | 11/1998 |
| JP | 2002521792 | 7/2002 |
| JP | 2003-502792 | 1/2003 |
| JP | 2003-523049 | 7/2003 |
| JP | 2005043339 A | 2/2005 |
| WO | WO 99/56121 | 11/1999 |
| WO | WO 00/05596 | 2/2000 |
| WO | WO 01/59443 | 8/2001 |
| WO | WO 2007/117263 | 10/2007 |
| WO | WO 2010/105062 | 9/2010 |

OTHER PUBLICATIONS

Al Hallaj et al. (2000) "Characterization of Commercial Li-ion Batteries Using Electrochemical-calorimetric Measurements" *J. Power Sources* 87(1-2):186-194.

Amatucci et al. (Mar. 1996) "$CoO_2$, the End Member of the $Li_xCoO_2$ Solid Solution," *J. Electrochem. Soc.* 143(3):1114-1123.

Amatucci et al. (1999) "The Elevated Temperature Performance of the $LiMn_2)_4$/C System: Failure and Solutions," *Electrochimica Acta* 45(1-2):255-271.

Amatucci et al. (Dec. 1997) "Surface Treatments of $Li_{1+x}Mn_{2-x}O_4$ Spinels for Improved Elevated Temperature Performance," *Solid State Ionics* 104(1-2):13-25.

Attidekou et al. (Web Release Jan. 18, 2007) "Thermodynamic Aspects of the Reaction of Lithium with SnP2O7 Based Positive Electrodes," *J. Electrochem. Soc.* 154(3):A217-A220.

Aurbach et al. (1999) "Capacity Fading of $Li_xMn_2O_4$ Spinel Electrodes Studied by XRD and Electroanalytical Techniques," *J. Power Sources* 81:472-479.

Aydinol et al. (Jul. 15, 1997) "Ab initio Study of Lithium Intercalation in Metal Oxides and Metal Dichalcogenides," *Phys. Rev. B.* 56(3):1354-1365.

Baddour et al. (1991) "A Thermodynamic, Structural and Kinetic-Study of the Electrochemical Lithium Intercalation into the Xerogel V2O5.1.6 H2O in a Propylene Carbonate Solution," *J. Electroanal. Chem.* 314(1-2):81-101.

Barbato et al. (2002) "Hollandite Cathodes for Lithium Ion Batteries. 2. Thermodynamic and Kinetics Studies of Lithium Insertion into $BaMmn_7O_{16}$ (M=Mg, Mn, Fe, Ni)," *Electrochim. Acta* 46(18):2767-2776.

Barker et al. (1995) "Kinetics and Thermodynamics of the Lithium Insertion Reaction in Spinel Phase $Li_xMn_2O_4$," *J. Power Sources* 54(2):475-478.

Bathia et al. (1997) "Effect of Sintering Temperature on the Characteristics of Carbons Based on Mesocarbon Microbeads" *J Mater. Sci.* 32:135-.

Benco et al. (1999) "First Principles Calculation of Electrode Material for Lithium Intercalation Batteries: $TiS_2$ and $LiTi_2S_4$ Cubic Spinel Structures," *J. Solid State Chem.* 145(2):503-510.

Bhatia et al. (1997) "Effect of Sintering Temperature on the Characteristics of Carbons Based on Mesocarbon Microbeads," *J. Mater. Sci.* 32(1):135-139.

Billaud et al. (1996) "Revisited Structures of Dense and Dilute Stage II Lithium-Graphite Intercalation Compounds," *J. Phys. Chem. Solids* 57(6-8):775-781.

Botte et al. (2000) "Mathematical Modeling of Secondary Lithium Batteries," *Electrochimica Acta* 45(15-16):2595-2609.

Carlier et al. (2003) "First-Principles Investigation of Phase Stability in the $O2$-$LiCoO_2$ System," *Chem. Mater.* 15(13):2651-2660.

Ceder et al. (1998) "Thermodynamics of Oxides with Substitutional Disorder: A Microscopic Model and Evaluation of Important Energy Contributions," *J. Am. Ceramic Soc.* 81(3):517-525.

Ceder et al. (1999) "Phase Diagrams of Lithium Transition Metal Oxides: Investigations from First Principles," *Electrochimica Acta* 45(1-2):131-150.

Chen et al.(2002) "Staging Phase Transitions in $Li_xCoO_2$," *J. Electrochem Soc.* 149(12):A1604-A1609.

Conway et al. (Web Release Jul. 22, 2003) "Double-Layer and Pseudocapacitance Types of Electrochemical Capacitors and Their Applications to the Development of Hybrid Devices," *J. Solid State Electrochem.* 7:637-644.

Dahn et al. (1983) "Entropy Measurements on $Li_xTiS_2$," *Can J. Phys.* 61:1093-1098.

Deiss et al. (Nov. 1997) "Average Voltage, Energy Density, and Specific Energy of Lithium-Ion Batteries—Calculation Based on First Principles," *J. Electrochem. Soc.* 144(11):3877-3881.

Doi et al. (Web Release Jun. 27, 2007) "Computer Simulation of a Porous Positive Electrode for Lithium Batteries," *J. Power Sources* 174(2):779-783.

Filhol et al. (Web Release Feb. 15, 2008) "Phase Diagrams for Systems with Low Free Energy Variation: A Coupled Theory/Experiments Method Applied to Li-Graphite," *J. Phys. Chem. C.* 112(10):3982-3988.

Fujiwara et al. (Web Release Jun. 11, 2003) "Determination of Standard Free Energy of Formation for Niobium Silicides by EMF Measurements," *J. Electrochem. Soc.* 150(8):J43-J48.

Funahashi et. al. (2002) "Thermal Simulation of Large-Scale lithium Secondary Batteries Using a Graphite-Coke Hybrid Carbon Negative Electrode and $LiNi_{0.7}Co_{0.3}O_2$ Positive Electrode" *J. Power Sources* 104(2):248-252.

Gabrisch et al. (Web Release May 15, 2008) "Transmission Electron Microscope Studies of $LiNi_{1/3}Mn_{1/3}Co_{1/3}O_2$ before and after Long-Term Aging at 70 Degrees C," *Electrochem. Solid-State Lett* 11(7):119-124.

Gabrisch et al. (Web Release May 4, 2004) "Hexagonal to Cubic Spinel Transformation in Lithiated Cobalt Oxide—TEM Investigation," *J. Electrochem. Soc.* 151(6):A891-A897.

Garcia-Belmonte et al. (2006) "Correlation Between Volume Change and Cell Voltage Variation with Composition for Lithium Intercalated Amorphous Films," *J. Phys. Chem. B.* 110(10):4514-4518.

Gautier et al. (1997) "Effect of the $ZnNi_yMn_{2-y}O_4$ ($0 \leq y \leq 1$) Spinel Composition on Electrochemical Lithium Insertion," *J. Solid Stat Electrochem.* 1(2):126-133.

Gong et al. (2000) "Electrochemical Intercalation of Lithium and Lithium Species into Disordered Carbon Prepared by the Heat-Treatment of Poly (p-Phenylene) at 650 Degrees C for Anode in Lithium-Ion Battery," *Electrochimica Acta* 45(11):1753-1762.

Graetz et al. (Web Release Jan. 12, 2002) "Electronic Structure of Chemically Delithiated $LiCoO_2$ Studied by Electron Energy-Loss Spectrometry," *J. Phys. Chem. B* 106(6):1286-1289.

Guzman et al. (1996) "Lithium Intercalation Studies in Hydrated Molbdenum Oxides," *Solid State Ionics* 86-8:407-413 part 1.

Hallstedt et al. (2007) "Thermodynamic Assessment of the Al-Li System," *Int. J. Mater. Res.* 98(10):961-969.

Hill et al. (1992) "Microcalorimetric Studies on Lithium Thionyl Chloride Cells—Temperature Effects Between 25-Degrees-C and -40-Degrees-C," *J. Power Sources* 39(1):83-94.

Hong et al. (2000) "Relationship Between Calorimetric and Structural Characteristics of Lithium-Ion Cells—I. Thermal Analysis and Phase Diagram," *J. Electrochem. Soc.* 147(9):3183-3189.

Hong et al. (May 1998) "Electrochemical-Calorimetric Studies of Lithium-Ion Cells," *J. Electrochem Soc.* 145(5):1489-1501.

Hu et al. (2010) "Effects of the LiFePO4 Content and the Preparation Method on the Properties of (LiFePO$_4$+AC)/Li$_4$Ti$_5$O$_{12}$ Hybrid Battery-Capacitors," *J. Serb. Chem. Soc.* 75(9):1259-1269.

Huang et al. (1999) "Correlating Capacity Loss of Stoichiometric and Nonstoichiometric Lithium Manganese Oxide Spinel Electrodes with Their Structural Integrity," *J. Electrochem Soc.* 146(10):3649-3654.

Huang et. al. (Web Release Aug. 1, 2005) "Thermal Study on Single Electrodes in Lithium Ion Battery" *J. Power Sources* 156(2):541-546.

Huggins, R.A. (1999) "Lithium Alloy Negative Electrodes," *J. Power Sources* 82:13-19.

Idemoto et al. (2006) "Dependence of Properties, Crystal Structure and Electrode Characteristics on Li Content for Li$_x$Co$_{1/3}$Ni$_{1/3}$Mn$_{1/3}$O$_{2+\delta}$ as a Cathode Active Material for Li Secondary Battery," *Electrochemistry* 74(9):752-757.

Idemoto et al. (Mar. 9, 2000) "Thermodynamic Stability and Cathode Performance of Li$_{1+x}$Mn$_{2-x}$O$_4$ as a Cathode Active Material for Lithium Secondary Battery," *J. Ceram. Soc. Jpn.* 108(9):848-853.

Idemoto et al. (2000) "Thermodynamic Stability and Cathode performance of Limn2-xmgxo4 as Cathode Active Material for the Lithium Secondary Battery," *Electrochemistry* 68(6):469-473.

Idemoto et al. (3003) "Crystal Structure and Cathode Performance Dependence on Oxygen Content of LiMn$_{1.5}$Ni$_{0.5}$O$_4$ as a Cathode Material for Secondary Lithium Batteries," *J. Power Sources* 119-121:125-129.

Idemoto et al. (2006) "Dependence of Properties, Crystal Structure and Electrode Characteristics on Li Content for Li$_x$(Ni,Co)O$_2$ as a Cathode Active Material for Li Secondary Batteries," 210th Meeting of the Electrochemical Society, Oct. 29-Nov. 3, 2006, Moon Palace Resort Hotel, Cancun Mexico, Abstract # 13.

International Search Report and Written Opinion, Corresponding to International Application No. PCT/US06/30137, Mailed Jun. 10, 2008.

International Search Report and Written Opinion, Corresponding to International Application No. PCT/2010/026991, Mailed May 12, 2010.

Joo et al. (Web Release Aug. 17, 2006) "Molecular Thermodynamics Approach for Phase Behaviors of Solid Polymer Electrolytes/Salt System in Lithium Secondary Battery on the Nonrandom Mixing Effect: Applicability of the Group-Contribution Method," *Polymer* 47(20):7153-7159.

Joo et al. (Web Release Nov. 23, 2005) "Phase Behaviors on Solid Polymer Electrolytes/Salt System in Lithium Secondary Battery by Group-Contribution Method: The Pressure Effect," *Polymer* 47(1):211-217.

Kalikmanov et al. (Feb. 15, 2002) "Role of Elasticity Forcesin Thermodynamics of Intercalation Compounds: Self-Consistent Mean-Field Theory and Monte Carlo Simulations," *J. Chem. Phys.* 116(7):3083-3089.

Kataoka et al. (2002) "Lithium Storage Mechanism of Disordered Mesophase Carbon Fibers Studies by [7]Li-Nuclear Magnetic Resonance," *Electrochem. Solid-State Lett.* 5(1):A10-A13.

Kim et al. (2001) "Thermodynamic and Kinetic Approached to Lithium Intercalation into a Li$_1$-Delta Mn$_2$O$_4$ Electrode Using Monte Carlo Simulation," *Electrochimica Acta* 46(7):987-997.

Kobayashi et al. (Web Release Dec. 1, 2003) "Structure Determination of Li$_{1-y}$Ni$_{0.5}$Mn$_{0.5}$O$_2$ (y=0.5) Using a Combination of Rietveld Analysis and the Maximum Entropy Method," *J. Mater. Chem.* 14(1):40-42.

Koudriachova et al. (2004) "First Principles Predictions for Intercalation Behavior," *Solid State Ionics* 175(1-4):829-834.

Kudo et al. (1998) "Theoretical Dependence of the Free Energy and Chemical Potential Upon Composition in Intercalation Systems with Repulsive Interaction Between Guest Ions," *Electrochim acta* 43(7):781-789.

Kuhn et al. (2001) "On the Synthesis of Ramsdellite LiTiMO$_4$ (M=TI, V, Cr, Mn, Fe): An Experimental and Computational Study of the Spinel-Ramsdellite Transformation," *Eur. J. Inorg. Chem.* (21):3375-3384.

Kumagai et al. (1997) "Thermodynamics and Kinetics of Electrochemical Intercalation of Lithium into Li0.50WO3.25 with a Hexagonal Tungsten Bronze Structure," *Solid State Ionics* 98(3-4):159-166.

Kumagai et al. (1997) "Electrochemical Intercalation of Lithium into Hexagonal Tungsten Trioxide," *Thermochimica Acta* 299(1-2):19-25.

Kumagai et al. (Nov. 1993) "Thermodynamic and Kinetic-Studies of Electrochemical Lithium Insertion Into Quaternary Li-Mn-V-O Spinel as Positive Materials for Rechargeable Lithium Batteries," *J. Electrochem. Soc.* 140(11):3194-3199.

Kumagai et al. (1999) "Thermodynamics and Kinetics of Lithium Intercalation into Mb2O5 Electrodes for a 2V Rechargeable Lithium Battery," *J. Electrochem. Soc.* 146(9):3203-3210.

Kumaresan et al. (Web Release Dec. 18, 2007) "Thermal Model for a Li-Ion Cell" *J. Electrochem. Soc.* 155:A164-A171.

Lee et al. (2003) "Identity and Thermodynamics of Lithium Intercalated in Graphite," *J. Power Sources* 114(2):285-291.

Letellier et al. (2004) "The First situ $^7$Li NMR Study of the Reversible Lithium Insertion Mechanism in Disorganized Carbons," *J. Phys. Chem. Solids* 65:245-251.

Limthongkul et al. (2003) "Electrochemically-Driven Solid-State Amorphization in Lithium-Metal Anodes," *J. Power Sources* 119:604-609.

Lu et al. (Web Release Aug. 8, 2005) "Determination of the Reversible and Irreversible Heats of LiNi$_{0.8}$Co$_{0.2}$O$_2$mesocarbon Microbead Li-Ion Cell Reactions Using Isothermal Microcalorimetery," *Electrochim. Acta* 51(7):1322-1329.

Lu et al (Web Release Sep. 15, 2006) "In Situ Thermal Study of Li$_{1+x}$[Ni$_3$Co$_{1/3}$Mn$_{1/3}$]$_{1-x}$O$_2$ Using Isothermal Micro-calorimetric Techniques" *J. Electrochem. Soc.* 153(11):A2147-A2151.

Lu et. al (Web Release Jun. 30, 2007) "Thermal Properties of Li$_{4/3}$Ti$_{5/3}$O$_4$/LiMn$_2$O$_4$ Cell" *J. Power Sources* 174:673-677.

Lu et al. (Web Release Mar. 7, 2007) "Isothermal Calorimetry Investigation of Li$_{1+x}$Mn$_{2-y}$AlzO$_4$ Spinel" *Electrochim. Acta* 52(19):5837-5842.

Mabuchi et al. (Apr. 1995) "Charge-Discharge Characteristics of the Mesocarbon Microbeads Heat-Treated at Different Temperatures," *J. Electrochem. Soc.* 142(4):1041-1046.

Maier, J. (Dec. 6, 2007) "Size Effects on Mass Transport and Storage in Lithium Batteries," *J. Power Sources* 174(2):569-574.

Mori et al. (Aug. 1995) "Lithium Doping/Undoping in Disordered Coke Carbons," *J. Power Sources* 56:205-208.

Nikiel, L.W. (1993) "Raman-Spectroscopic Characterization of Graphites—A Reevaluation of Spectra/Structure Correlation," *Carbon* 31(8):1313-1317.

Oberlin et al. (1975) "Graphitization Studies of Anthracites by High Resolution Electron Microscopy," *Carbon* 13(5):367-376.

Oberlin, A. (1984) "Carbonization and Graphitization," *Carbon* 22(6):521-541.

Ohshima et al. (2006) "Thermal Behavior of Small Lithium-ion Secondary Battery During Rapid Charge and Discharge Cycles" *Electrical Engineering in Japan* 157(3): 17-25.

Ohzuku et al. (Nov. 1994) "A Solid-State Redox Reactions of LiCoO$_2$(R(3)over-bar-m) for 4 Volt Secondary Lithium Cells," *J. Electrochemical Soc.* 141(11):2972-2977.

Okamoto et al. (2007) "Analysis of Heat Generation of Lithium Ion Rechargeable Batteries Used in Implantable Battery Systems for Driving Undulation Pump Ventricular Assist Device" *Artificial Organs* 31(7):538-541.

Ol'shanskaya et al. (2002) "Thermodynamics of Lithium Intercalates in Carbonized Fabric," *Russian J. Appl. Chem.* 75(5):740-744.

Paddon et al. (2007) "Kinetics and Thermodynamics of the Li/Li+ Couple in Tetrahydrofuran at Low Temperatures (195-295K)," *J. Phys. Org. Chem.* 20(9):677-684.

Papanek et al. (2001) "Neutron Scattering Studies of Disordered Carbon Anode Materials," *J. Phys. Condens. Matter* 13:8287-8301.

Papanek et al. (1996) "Lithium Insertion in Disordered Carbon-Hydrogen Alloys: Intercalation vs. Covalent Binding," *Chem. Mater.* 8(7):1519-1526.

Papanek et al. (2001) "Neutron Scattering Studies of Disordered Carbon Anode Materials" *J. Phys. Condens. Matter* 13:8287.

Quintin et al. (Web Release Jun. 27, 2006) "Study of Lithium Insertion-Deinsertion Mechanism in Nanocrystalline Gamma-Fe$_2$O$_3$ Electrodes by Means of Electrochemical Impedance Spectroscopy," *Electrochimica Acta* 51(28):6426-6434.

Rao et al. (1997) "Heat-Generation Rate and General Energy Balance for Insertion Battery Systems," *J. Electrochem. Soc.* 144(8):2697-2704.

Reynier et al. (2004) "Thermodynamics of Lithium Intercalation into Graphites and Disordered Carbons," *J. Electrochem. Soc.* 151(3):A422-A426.

Reynier et al. (2007) "Evolution of lithiation thermodynamics with the graphitization of carbons," *J. Power Sources* 165:552-558.

Reynier et al. (2003) "The entropy and enthalpy of lithium intercalation into graphite," *J. Power Sources* 119-121:850-855.

Reynier et al. (2004) "Entropy of Li intercalation in $Li_xCoO_2$," *Physical Review B* 70, 174304.

Rosalind E.F. (Oct. 23, 1951) "Crystallite Growth in Graphitizing and Non-Graphitizing Carbons," *Proc. Royal Soc. London. A. Math. Phys. Sci.* 209(1097):196-218.

Saito et al. (1997) "Thermal Studies of a Lithium-ion Battery" *J. Power Sources* 68(2):451-454.

Sandhu et al. (1999) "Thermodynamic Equations for a Model Lithium-ion Cell" *Electrochimica Acta* 45(6):969-976.

Schoonman, J. (2003) "Nanoionics," *Solid State Ionics* 157(1-4):319-326.

Selman et. al. (2001) "Cooperative Research on Safety Fundamentals of Lithium Batteries" *J. Power Sources* 97(8):726-732.

Shi et al. (2003) "First-Principles Studies of Cation-Doped Spine $LiMn_2O_4$ for Lithium Ion Batteries," *Phys. Rev. B* 67(11):115130.

Shi et al. (Jul. 10, 2007) "Effect of Mg-Doping on the Structural and Electronic Properties of $LiCoO_2$: A First-Principles Investigation," *J. Power Sources* 171(2):908-912.

Shin et al. (Web Release Jan. 8, 2004) "Factors Influencing the Capacity Fade of Spinel Lithium Manganese Oxides," *J. Electrochem. Soc.* 151(2):A204-A208.

Shiraishi et al. (2001) "EELS Analysis of Electrochemically Deintercalated Li1-xMn2O4 and Substitutes Spinels $LiMn_{1.6}M_{0.4}O_4$ (M=CO, Cr, Ni)," *J. Power Sources* 97(8):461-464.

Stevens et al. (Aug. 2001) "The Mechanisms of Lithium and Sodium Insertion in Carbon Materials," *J. Electrochem. Soc.* 148(8):A803-A811.

Takahashi et al. (Web Release Oct. 29, 2006) "Structure and Electron Density Analysis of Electrochemically and Chemically Delithiated $LiCoO_2$ Single Crystals," *J. Solid State Chem.* 180(1):313-321.

Takano et. al. (2002) "Entropy Change in Lithium Ion Cells on Charge and Discharge" *J. App. Electochem.* 32(3):251-258.

Tarascon et al. (Oct. 1991) "Li Metal-Free Rechargeable Batteries Based on $Li_{1+x}Mn_2O_4$ Cathodes (0 less-than-or-equal-to x less-than-or-equal-to 1) and Carbon Anodes," *J. Electrochem. Soc.* 138(10):2864-2868.

Thomas et al. (2003) "Heats of Mixing and of Entropy in Porous Insertion Electrodes," *J. Power Sources* 119:844-849.

Thomas et al. (2001) "Measurement of the Entropy of Reactions as a Function of State of Charge in Doped and Undoped Lithium Manganase Exide," *J. Electrochem. Soc.* 148(6):A570-A575.

Thomas et al. (2003) "Thermal Modeling of Porous Insertion Electrodes," *J. Electrochem. Soc.* 150(2):A176-A192.

Tuinstra et al. (Aug. 1, 1970) "Raman Spectrum of Graphite," *J. Chem. Phys.* 53(3):1126-1130.

Van der Ven et al. (1998) "First-Principles Evidence for Stage Ordering in $Li_xCoO_2$," *J. Electrochem. Soc.* 145(6):2149-2155.

Vicente et al. (2004) "Understanding the Voltage Profile of Li Insertion into $LiNi_{0.5-y}FeMn_{1.5}O_4$ in Li Cells," *Electrochim. Acta* 49(12):1963-1967.

Vitins et al. (1997) "Lithium Intercalation into Layered LiMnO2," *J. Electrochem. Soc.* 144(8):2587-2592.

Wada et al. (1980) "'Diamond-Like' 3-fold Coordinated Amorphous Carbon," *J. Non-Cryst. Solids* 35:543-548.

Wagemaker et al. (Web Release Jun. 20, 2005) "Thermodynamics of Spinel $Li_xTiO_2$ from First Principles," *Chem. Phys.* 317(2-3):130-136.

Wakihara, M. (2005) "Lithium Manganese Oxides with Spinel Structure and Their Cathode Properties for Lithium Ion Battery," *Electrochemistry* 73(5):328-335.

Wang et al. (2004) "Enthalpy of Formation of $LiNiO_2$, $LiCoO_2$ and their Solid Solutions LiNi1-xCoxO2," *Solid State Ionics* 166(1-2):167-173.

Wang et al. (2005) "Li$M$O$_2$ ($M$=Mn, Fe, and Co): Energetics, Polymorphism and Phase Transformation," *J. Solid State Chem.* 178(4):1230-1240.

Wang et al. (2007) "A First-Principles Approach to Studying the Thermal Stability of Oxide Cathode Materials," *Chem. Mater.* 19(3):543-552.

Whitacre et al. (2007) "Enhanced Low-Temperature Performance of Li-CF$_x$ Batteries," *Electrochem. Solid-State Lett.* 10(7):A166-A170.

Xu et al. (Mar. 1, 2003) "Nanocrystalline Ferric Oxide Cathode for Rechargeable Lithium Batteries," *Electrochem. Solid Stet Lett.* 6(9):A190-A193.

Yamaki et al. (2000) "Potential and Thermodynamics of Graphite Anodes in Li-Ion Cells," *J. Electrochem. Soc.* 147(2):460-465.

Yamaki et al. (2001) "Voltage Prediction from Coulomb Potential Created by Atoms of Spinel $LiMn_2O_4$ Cathode Active Material for Li Ion Cells," *J. Power Sources* 97-8:349-353.

Yamaki et al. (2001) "Thermodynamics and Phase Separation of Lithium Intercalation Materials Used in Lithium Ion Cells," *Electrochemistry* 69(9):664-669.

Yazami et al. (Web Release Apr. 30, 2007) "Fluorinated Carbon Nanofibres for High Energy and High Power Densities Primary Lithium Batteries," *Electrochem. Commun.* 9:1850-1855.

Yazami, R. (Dec. 2009) "Thermodynamics of Electrode Materials for Lithium-Ion Batteries," In; Kazunori Ozawa Ed., *Lithium Ion Rechargeable Batteries: Materials, Technology, and New Applications*, Wiley-VCH Verlag GmbH and Co. CH. 5, pp. 67-101.

Yazami et al. (2006) "Thermodynamics and crystal structure anomalies in lithium-intercalated graphite," *J. Power Sources* 153:312-318.

Zhou et al. (2006) "Configurational Electronic Entropy and the Phase Diagram of Mixed-Valance Oxides: The Case of Lixfwpo4," *Phys. Rev. Lett.* 97(15).

Office Action corresponding to Chinese Patent Application No. 200680028690.5, issued Jun. 28, 2012—includes English translation.

Notice of Reasons for Rejection corresponding to Japanese Patent Application No. P2008-525161, Dispatch Date May 22, 2012—includes English translation.

McMenamin et al. (Dec. 8, 2008) "Using Electrochemical Thermodynamic Measurements to Detect Effects of Battery Aging," Lithium Mobile Power 2008, Las Vegas; Power Point Presentation.

Chen Zhiwu et al. (2003) "First Principle Investigation of Positive Electrode Material for Lithium Ion Batteries," *Rare Metal Mater. Eng.* 32(9):693-698.

Korovin, N.V. (1998) "Electrochemical Intercalation into Cathodic Materials: Electrode Potentials," *Russian J. Electrochem.* 34(7):669-675.

Mering et al. (1960) "Le Processus de la Graphitation," *J. Chim. Phys. Fr.* 57:803-814.

\* cited by examiner

Entropy of Li intercalation during charge and discharge of coke HTT at 2600°C

Entropy of intercalation and OCV during insertion

Layered structure of LiCoO₂

OCV profile of $Li_xCoO_2$ shown for 2 cells

Entropy profile for $Li_xCoO_2$ shown for 2 cells

Cell made with 25% of coke no HTT and 75% coke HTT 2600°C compared with simulation

METHODS FOR THERMODYNAMIC EVALUATION OF BATTERY STATE OF HEALTH

CROSS-REFERENCE TO RELATED APPLICATIONS

This application is a continuation-in-part of U.S. application Ser. No. 11/462,290 filed on Aug. 3, 2006, which claims priority under 35 U.S.C. 119(e) to U.S. Provisional Patent Application 60/705,535 filed Aug. 3, 2005. This application also claims priority under 35 U.S.C. 119(e) to U.S. Provisional Patent Application 61/159,727 filed on Mar. 12, 2009. Each of these applications is hereby incorporated by reference in their entireties.

STATEMENT REGARDING FEDERALLY SPONSORED RESEARCH OR DEVELOPMENT

This invention was made with United States governmental support awarded by the following agencies: Department of Energy DE-FG03-00ER15035 and DE-FG02-03ER15425. The United States government has certain rights in this invention.

BACKGROUND OF INVENTION

Over the last few decades, significant advances have been made in electrochemical storage and conversion devices, expanding the capabilities of these systems in a variety of fields including portable electronic devices, air and space craft technologies, and biomedical devices. Current state of the art electrochemical storage and conversion devices tend to have designs and performance attributes specifically selected for compatibility with the diverse range of user applications. For example, current electrochemical storage systems span a range from light weight, stable batteries providing reliable, long runtimes to high capacity batteries capable of providing extremely high discharge rates. Despite recent advances, widespread development and demand for high power portable electronic products has created significant pressure for researchers to develop even more high performance batteries suitable for the wide range of these applications. Furthermore, demands of miniaturization in the field of consumer electronics and instrumentation continue to stimulate research into novel design and material strategies for reducing the sizes, weights and form factors of high performance batteries.

Many recent advances in electrochemical storage and conversion technology are directly attributable to discovery and integration of new materials for battery components. Lithium-ion battery technology, for example, continues to rapidly develop, at least in part, due to the integration of novel cathode and anode materials for these systems. From the pioneering discovery and optimization of intercalated carbon anode materials to more recent discoveries of nanostructured transition metal oxide intercalation cathode materials and nano-phosphate cathode materials, development of new materials has revolutionized the design and performance capabilities of primary and secondary lithium ion batteries. For example, advanced electrode materials have significantly enhanced the energy capacities, energy densities, discharge current rates and cycle life provided by these systems, thus positioning lithium ion batteries to be the preferred technology for the next generation of high-power portable electronic systems, hybrid electric car (HEV) and electric vehicles (EV). Advances in electrode materials also has great promise to positively impact other systems including electrochemical capacitors and supercapacitors, and fuel cells, and is likely to be critical to implementation of these technologies for a range of device applications. Accordingly, the identification and performance evaluation of novel electrode materials is currently a research priority in the development of new and improved electrochemical energy storage and conversion systems.

Electrochemical energy storage and conversion devices use two electrodes; an anode and a cathode, which are electrical conductors, separated by a purely ionic conductor, the electrolyte. The electric current generated during discharge results from chemical reactions and physical processes (e.g., transport) taking place at the electrodes' surfaces, in which positively or negatively charged ions are exchanged with the electrolyte. These processes, in turn, generate or absorb electrons so as to keep the electrical neutrality of the system. The charge exchange induces important modifications in the electrodes surface and bulk structures properties. In particular, charge transfer processes affect each electrode's potential and reaction rate, which set the energy and the power density outputs of an electrochemical power generating device. In the case of a rechargeable battery, for example, the mechanism(s) and extent of changes in the electrodes surface and bulk structure determine the cycle life under specific thermodynamic and kinetic operating conditions (e.g., temperature, charge and discharge voltage limits, current rates and so on).

Knowing the thermodynamics of electrode reactions and physical transformations is essential in predicting the performance and stability of any electrochemical storage and conversion system. For example, important thermodynamic state functions establish, at least in part, the energy, the power and the cycle life of an autonomous electrochemical power source. In fact, the energy density reflects the total amounts of charges reversibly exchanged and the potential at which the exchange occurs. On the other hand, cycle life relates to the stability of states or phases resulting from electrode transformations in the process of charge and discharge. All these processes are controlled, at least to a certain degree, by the thermodynamics of the electrode reactions.

A number of techniques have been developed and applied to evaluating the thermochemical kinetics of electrode reactions including electroanalytical methods (e.g., cyclic voltammetry, potentiometry etc.) and spectroscopic techniques (e.g. x-ray diffraction, NMR, LEEDs, etc.). Given the importance of thermodynamics in virtually all electrochemical energy storage and conversion systems, however, there is currently a need in the art for systems and methods for measuring key thermodynamic parameters, such as changes in entropy, enthalpy and Gibbs free energy, with the accuracy needed for predicting and optimizing the performance attributes and capabilities of these systems. Such systems would play a significant role in identifying new materials for the next generation of electrochemical energy storage and conversion systems, and would significantly contribute to enhancing understanding of the thermochemical kinetics of established cathode and anode materials. New thermodynamic analysis systems also have great potential as versatile test instruments for characterizing materials properties and performance in commercially manufactured electrode systems, including batteries and fuel cells.

SUMMARY OF THE INVENTION

The present invention provides systems and methods for accurately characterizing thermodynamic and materials properties of electrodes and electrochemical energy storage and conversion systems. Systems and methods of the present invention are capable of simultaneously collecting a suite of measurements characterizing a plurality of interconnected electrochemical and thermodynamic parameters relating to the electrode reaction state of advancement, voltage and temperature. Enhanced sensitivity provided by the present methods and systems combined with measurement conditions that reflect thermodynamically stabilized electrode conditions allow very accurate measurement of thermodynamic parameters, including state functions such as the Gibbs free energy, enthalpy and entropy of electrode/electrochemical cell reactions, that enable prediction of important performance attributes of electrode materials and electrochemical systems, such as the energy, power density, current rate and the cycle life of an electrochemical cell.

The present systems and methods also allow sensitive characterization of the composition, phase and materials properties important for design and performance of electrodes in electrochemical systems. The present methods enable identification and characterization of phase transitions, crystallite size, surface and bulk defects and crystal structure defects in electrode materials that dramatically impact the electrochemical properties of electrodes and the performance of electrochemical storage and conversion systems. For example, thermodynamic state functions can be measured by the present systems and methods with an accuracy that enables identification of major or small phase transformations, which may be difficult, if not impossible, to detect via conventional means such as x-ray diffactometry or simple open-circuit cell potential measurements. Some small transformations may be the onset or the prelude of more drastic ones, which upon prolonged cycling will affect the battery's energy, power and cycle life performances. Detection of such transformations and understanding their origin is crucial for optimized electrode materials design.

Systems and methods of the present invention are also applicable for characterizing a range of thermodynamic parameters useful for designing, testing and characterizing electrochemical cells, such as primary and secondary batteries and electrode materials, including but not limited to intercalating electrode materials. The capabilities of the present systems and methods, however, extend beyond batteries and encompass electrode reactions in other electrochemical devices/systems including fuel cells, EDLCs, gas electrodes, catalysis, corrosions, electro-deposition, and electrosynthesis, where the acquisition of thermodynamics data also provides important insights on the energetics of electrode reactions and device performance.

In one aspect, the present invention provides a measurement system for thermodynamically evaluating an electrochemical cell having an electrode pair (e.g., cathode and anode). A measurement system of the present invention comprises: (i) a means for measuring open circuit voltages of the electrochemical cell as a function of time; (ii) a composition controller electrically connected to the electrochemical cell for establishing selected electrochemical cell compositions, (iii) a temperature controller in thermal contact with the electrochemical cell for establishing a plurality of selected electrochemical cell temperatures for each of the selected compositions, and (iv) an open circuit voltage analyzer provided such that it receives open circuit voltage measurements as a function of time from the a means for measuring open circuit voltages. The composition controller is capable of establishing a plurality of the selected compositions and, therefore, the combination of functionalities provided by the temperature and composition controller provides the capability of establishing a plurality of selected electrochemical cell temperature and composition combinations. The open circuit voltage analyzer receives open circuit voltage measurements as a function of time corresponding to the selected electrochemical cell temperature and composition combinations, and identifies open circuit voltages for thermochemically stabilized conditions of the electrochemical cell for the selected electrochemical cell temperature and composition combinations established by composition and temperature controllers.

In the context of this description, the term "thermodynamically stabilized conditions" refers to experimental conditions wherein measured open circuit voltages approximate equilibrium cell voltage such that the measurements can be used to determine thermodynamic parameters and materials properties with accuracies such that these parameters may be used to evaluate the electrochemical, materials and performance attributes of the electrodes and/or electrochemical cell. Measurement of open circuit voltages for thermodynamically stabilized conditions enables determination of state functions such as the Gibbs free energy, enthalpy and entropy of electrode/electrochemical cell reactions. It is intended that thermodynamically stabilized conditions include some deviations from absolute equilibrium conditions. In some embodiments open circuit voltages for thermodynamically stabilized conditions deviate from true equilibrium voltages by less than 1 mV and preferably, for some embodiments, conditions deviate from true equilibrium voltages by less than 0.1 mV. Under some experimental conditions of the present invention, the open circuit voltages are nearly an exact measure of the difference in Gibbs free energy of Li in the anode and cathode and any observed deviations originate from limitations in the measurement techniques employed during analysis. The ability to accurately identify open circuit voltage measurements reflecting thermodynamically stabilized conditions is useful for providing measurements of open circuit voltage, temperature and composition that may be used for characterization of important thermodynamic, electrochemical and materials properties of the electrodes analyzed.

In some embodiments, the expression "electrochemical cell" refers to a device comprising of three major active materials:

anode: is typically the electrode where an oxidation takes place. Oxidation is a loss of electron and can be schematized as: $R_a \rightarrow O_a + n_a e$, wherein $R_a$ is the reduced form and $O_a$ is the oxidized form of a chemical specie or used for the anode material. It comprises a neutral or positively charged (cation) or negatively charged (anion), $n_a$=number of electron moles exchanged in the anode reaction per $R_a$ mole. The anode is the negative pole of the cell during discharge;

cathode: is typically the electrode where a reduction (electron gain) takes place. The reaction is the reverse of the previous one, i.e. $O_c + n_c e \rightarrow R_c$, wherein $O_c$ is the oxidized form and $R_c$ is the reduced form of a chemical specie or used for the cathode material. It comprises a neutral or positively charged (cation) or negatively charged (anion), $n_c$=number of electron moles exchanged in the anode reaction per $O_c$ mole. The cathode is the positive pole of the cell during discharge; and electrolyte: is an ionically conductive material, which role is to provide anions and cations needed for the electrode reactions to be achieved. It usually comprises a solvent medium and a solute material such as a salt, an acid or a base. In some cases, the electrolyte changes composition a result of the cell's charge and discharge (see, lead-acid batteries for example where sulfuric acid is consumed during discharge: $Pb+PbO_2+2H_2SO_4 \rightarrow 2PbSO_4+2H_2O$)

As used herein, the expressions "electrochemical cell composition" or "composition of an electrochemical cell" are used synonymously and refer to compositions and/or physical states of active materials comprising the electrochemical cell (i.e., electrodes such as cathode and anode, and the electrolyte). Accordingly, in some embodiments electrochemical cell composition refers to surface and/or bulk compositions of cathode and anode materials, the composition of the electrolyte or any combination of these). In some embodiments of the present invention, the expression "composition of an electrochemical cell" refers to the state of charge of the electrochemical cell or any component thereof (e.g. active material such as electrodes or electrolyte).

Examples of electrochemical cells useful in the present invention include, but are not limited to, batteries (primary and secondary) and fuel cells. While the above anode and cathode reactions are characteristic of electrode processes in batteries and fuel cells and involve electron transfer between the electrolyte and the electrode in a so called faradaic process (or Redox process), there are other non-faradaic processes that allow for electrical charges storage at the electrode surface without a charge transfer or a Redox process.

Examples of electrochemical cells useful in the present invention include, but are not limited to, electrochemical double layer capacitors (EDLC) and electrochemical double layer supercapacitors. In an electrochemical double layer capacitor EDLC (or supercapacitor), an anion $A^-$ or a cation $C^+$ is stored on the electrode surface owing to accumulation of electrons ($e^-$) or electron holes ($h^+$) at the electrode-electrolyte interface to balance the adsorbed charge species and form neutral species in a double layer structure: ($A^-$, $h^+$) and ($C^+$, $e^-$). During charge and discharge the anions and/or cations are adsorbed or desorbed from the surface, which causes an electric current flow in the external circuit (charger or load) to balance for surface charges.

Hybrid supercapacitors are an intermediary category of electrical power sources between batteries and EDLC. They are hybrid because they combine two electrodes, one is a faradaic electrode like in a battery, and the other is a non-faradaic (capacitive) electrode like in an EDLC.

Batteries, fuel cells and EDLC are polarized systems in that the voltage of the anode and the cathode are different. During discharge, the cathode has the higher voltage $V^+$, therefore it is the positive pole, whereas the anode bears the lower voltage $V^-$ and is the negative pole. The difference in voltage $U=V^+-V^-$ depends on different parameters, the most important are:

State of charge: (SOC) of each electrode. SOC is usually given in % of the total charge theoretically stored in the anode ($Q_{th}$(an) or the cathode ($Q_{th}$(ca);

Density of discharge current (i). Under zero current, $U_{i=0}$ is the open-circuit voltage, which with time tends to an equilibrium value $U_\infty$ fixed by SOC and temperature;

Temperature;

State of health (SOH) of the system components: anode, cathode and electrolyte. The SOH varies with the system 'history', such as for the most common charge/discharge cycles, overcharge and overdischarge and thermal aging. Since a battery, a fuel cell and an EDLC function in a 'series' mode, any degradation of one of the active components: anode, cathode and electrolyte, will affect the cell's SOH.

With changing SOC, the electrodes surface or bulk composition changes and in some cases the electrolyte composition changes too. These changes in electrode surface and/or bulk composition and/or electrolyte composition establish, at least in part, the composition of the electrochemical cell (i.e. electrochemical cell composition) as described herein. Change in electrode composition is especially relevant for battery systems wherein electrolyte is consumed (e.g., lead acid, NiCd and Zn-silver batteries (See: reactions below)) and in normal or hybrid EDLCs.

A. Reactions for Lead Acid Battery

Negative Electrode:

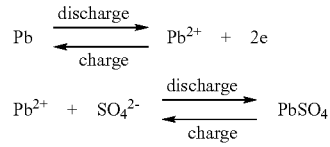

Positive Electrode:

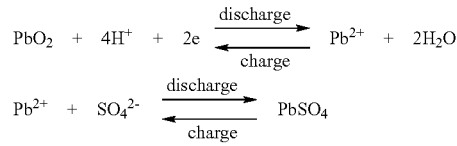

Overall Reaction:

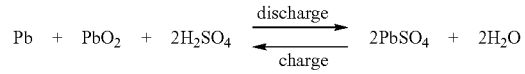

B. Reactions for Nickel-cadmium System

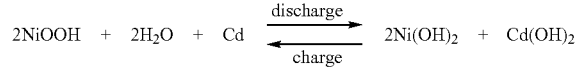

C. Reactions for Silver-zinc, Silver-cadmium and Silver-iron Systems

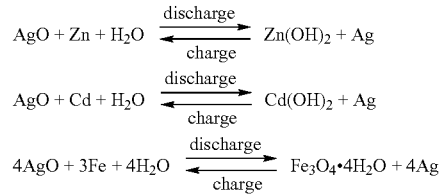

The present measurement system is capable of measuring thermodynamic functions of a half- or a full-cell at different SOC of the anode, cathode and electrolyte.

Means of measuring open circuit voltages useful in the present invention include, but are not limited to, voltmeters, multimeters, potentiometers, and/or galvanometers electrically connected to the electrodes (e.g., cathode and the anode) of the electrochemical cell. In some embodiments, a voltmeter having a very large internal impedance is used to measure open circuit voltages so as to avoid discharging the cell in the instrument. For some applications, for example, use of an a voltmeter with an internal impedance in the order of 1 G Ohm is preferable, and for some applications an internal impedance in the order of 10 G Ohm is preferable. A useful means of measuring open circuit voltages is a National Instrument Card Lab-PC-1200. In an embodiment, the means for measuring open circuit voltages is capable of measuring the open circuit voltages of the electrochemical cell with an accuracy to within about 1 mV, and preferably for some applications with an accuracy to within about 0.5 mV, and more preferably for some applications with an accuracy to within about 10 μV to about 100 μV. Optionally, the means for measuring open circuit voltages measures the open circuit voltages as a function of time with a temporal resolution ranging from a few seconds (e.g., 1 second) to a few minutes (e.g., 5 minutes). In some embodiments, open circuit voltage measurements are made about every 10 seconds. Use of a means for measuring open circuit voltages providing good accuracy and temporal resolution provides measurements enabling accurate thermodynamic analysis of the electrochemical cell and also enhances the systems ability to correctly identify open circuit voltages representative of thermodynamically stabilized conditions.

As used herein the expression "composition of an electrochemical cell" refers generally to bulk compositions and/or surface compositions of components of an electrochemical cell. In some embodiments, composition of an electrochemical cell refers to the composition of electrodes of the electrochemical cell, such as compositions of electrodes (e.g., cathode and/or anode electrodes) of the electrochemical cell. In embodiments wherein the electrode(s) is an intercalating electrode, the composition of an electrochemical cell may refer to the stoichiometry of the intercalating electrode materials with respect to the amount of intercalant physically associated with the electrode, the absolute amount of intercalant physically associated with the electrode, or the concentration of intercalant physically associated with the electrode. In some embodiments, the expression "composition of the electrochemical cell" refers to the composition of the electrolyte (e.g., the concentration(s) of components (ionic and/or nonionic) of the electrolyte). In some useful embodiments of the present invention, the expression "composition of an electrochemical cell" refers to the state of charge of the electrochemical cell or any component thereof, such as the state of charge of an electrode (cathode, anode, working, counter etc.) or combination of electrodes.

Any composition controller can be used in the present invention that is capable of establishing selected electrochemical cell compositions. In one embodiment, the composition controller is an electrochemical cell charger capable of charging the electrochemical cell to a state corresponding to selected cell compositions, and/or an electrochemical cell discharger capable of discharging the electrochemical cell to a state corresponding to selected cell compositions. Useful composition controllers for some applications are capable of charging and/or discharging the electrochemical cell under galvanostatic conditions. In one embodiment, the composition controller is capable of establishing selected states of charge (SOC) of the electrochemical cell corresponding to each of the selected electrochemical cell compositions. In the context of the present description SOC of an electrochemical cell may refer to SOC of an electrode (such as SOC of a cathode or anode) or combination of electrode. In some embodiments of the present invention, the composition controller is capable of determining the composition of the electrochemical cell using coulometry. In one embodiment, the composition controller is a coulometer capable of determining the state(s) of charge of an electrochemical cell using coulometry, for example by measuring the amount of electricity passed in the electrochemical cell. Optionally, states of charge are selected with an accuracy to within 5% or less, preferably for some applications with an accuracy to within 1% or less, and more preferably for some applications with an accuracy to within 0.1%. Alternatively, composition controllers of the present invention are capable of establishing selected open circuit voltages corresponding to each of the selected electrochemical cell compositions, and optionally selected open circuit voltages having an accuracy to within 1 mV.

Coulometry is a technique useful in the present invention for measuring and/or selecting the electrochemical cell composition by establishing and/or determining the SOC of an electrochemical cell. In some embodiments, therefore, the composition controller comprises a coulometer. For example, let i(t) be the current intensity in the cell at time 't'. The total amount of charge Q(t) at time τ is given by the time integration of i(t):

$$Q(\tau) = \int_0^\tau i(t)\,dt \quad (1)$$

The SOC of anode (an), cathode (cat) and electrolyte (elec) is given in % as:

$$SOC(an, cat, elec.) = 100 \frac{Q(t)}{Q_{th}(an, cat, elec.)} \quad (2)$$

The SOC of the full cell is fixed by that of the limiting component, anode, cathode or electrolyte:

SOC(full cell)=inf(SOC(an), SOC(cat), SOC(elec))  (3)

(the 'inf' function designs the lowest value of a group of parameters). The electrochemical techniques for acquiring i(t) include, but are not limited to, the following:

Galvanostatic method: here the applied current or current density is constant i(t)=I. The amount of electricity passed is therefore proportional to time: Q(t)=It. Usually the electrode or cell voltage is plotted versus time, a technique called chronopotentiometry.

Constant voltage: applying a constant voltage different from the thermodynamic OCV will cause a current i(t) to flow in the cell. The later is recorded versus time, a technique called chronoamperometry. A variant of this method is the 'voltage step' method, where a series of voltage steps $U_n$ (n=step number) are applied usually with a constant increment δU ($U_n=U_0\pm n\delta U$). At each step, the current is recorded and integrated.

Potentio-dynamic methods such as linear sweep voltammetry and cyclic voltammetry: in this method the voltage is driven between two limit values $U_{up}$ and $U_{low}$ at a constant pace (U(t)=Uo±kt, k=constant, $U_{low}<U(t)<U_{up}$). The current response i(t) is recorded and generally plotted against U(t).

Discharge under constant load: the cell is connected to a resistance and the current is recorded versus time.

By proper selection of the compositions, design and/or experimental conditions of the electrochemical cell, the measurement system of the present invention can probe the materials properties, SOH, thermodynamics and/or materials properties of a single component of the electrochemical cell, such as a selected electrode (cathode or anode) or the electrolyte, and chemical reactions occurring on or in a single component of the electrochemical cell. Selection of such electrochemical cell and measurement system configurations are beneficial for using the present measuring system to generate useful information (thermodynamic, composition, physical properties etc.) relating to a single active component of an electrochemical cell and chemical reactions thereof. For example, by choice of an electrochemical cell having a first electrode (e.g. counter electrode) having a chemical potential that is independent of the state of charge of the electrochemical cell, the system of the present invention is capable of generating measurements of open circuit voltage for thermodynamically stabilized conditions for different compositions and/or states of charge of the second electrode (e.g. working electrode). In one embodiment, for example, use of a first electrode (e.g. counter electrode) comprising a pure electrode material (e.g., a lithium, cadmium or zinc pure metal electrode) is useful for providing open circuit voltage measurements that principally reflect the state of charge, composition and/or chemical reactions of the second electrode (e.g. working electrode). More generally, however, systems of the present invention employing a reference electrode (i.e., a third electrode), in addition to first and second electrodes, may be used to provide measurements of open circuit voltage for thermodynamically stabilized conditions as a function of the composition and/or state of charge (SOC) of a selected electrode (e.g., cathode or anode). In these embodiments, the incorporation of a reference electrode (i.e. a third electrode), therefore, allows accurate measurements of open circuit voltage for thermodynamically stabilized conditions for different compositions, temperatures and chemical reactions of a selected electrode of the electrochemical cell. Use of such system configurations is highly beneficial for providing thermodynamic and other useful information that principally reflects the chemistry, physical properties, thermodynamics and structure of a single electrochemical cell component. For example, use of a reference electrode or selection of an electrode having a chemical potential that is independent of the state of charge of the electrochemical cell allows thermodynamic state functions ($\Delta H$, $\Delta S$ and $\Delta G$) to be determined that correspond to a single electrode reaction. Such information is useful for the structural, thermodynamic and chemical characterization of electrochemical cell components, and may serve the basis for testing and quality control methods for evaluating components of electrochemical cells.

Any temperature controller capable of establishing and maintaining an electrochemical cell at selected temperature(s) is useable in the present invention. In an embodiment, the temperature controller establishes the selected electrochemical cell temperatures with an accuracy equal to or greater than about 0.1 degrees Kelvin, and preferably for some applications an accuracy equal to or greater than about 0.05 degrees Kelvin. Useful temperature controllers for some applications provide and maintain stable selected electrochemical cell temperatures, for example selected temperatures stable to within about 1 degree Kelvin, preferably for some applications stable to within about 0.5 degree Kelvin and more preferably for some applications stable to within about 0.1 degree Kelvin. In an embodiment, the temperature controller establishes the selected electrochemical cell temperatures over a temperature range equal to about 10 degrees Kelvin, preferably for some applications equal to about 20 degrees Kelvin and more preferably for some applications equal to about 40 degrees Kelvin. For example, the present systems include use of temperature controllers capable of establishing selected electrochemical cell temperatures for each of the selected compositions by establishing a sequence of about 2 to about 10 selected temperatures over temperatures selected from the range of about 213 degrees Kelvin to 333 degrees Kelvin (depending on electrochemical cell chemistry, conditions and composition) with a temperature sequence step selected over the range of about 2 degrees Kelvin to about 5 degrees Kelvin. The present systems also include temperature controllers capable of providing selected discrete electrochemical cell temperatures or providing a continuous increase or decrease in temperature (e.g., a temperature ramp).

Temperature controllers useable in the present invention include heaters or coolers, such as thermoelectric coolers, thermoelectric heaters, resistive heaters, temperature baths, heat pumps and/or radiative coolers. Use of a temperature controller comprising a Peltier plate thermoelectric cooler or heater is beneficial for some embodiments because it is capable of rapidly changing temperatures and establishing thermally stable electrochemical cell temperature conditions on a fast time scale. Use of a Peltier plate thermoelectric cooler or heater is also beneficial because it is capable of providing electrochemical cell temperatures preselected with good accuracy and is easily interfaced for computer control. Temperature controllers of the present systems may further comprise a means of measuring the temperature of the electrochemical cell such as a thermocouple in thermal contact with the electrochemical cell, and optionally may further comprises a processor for receiving temperature measurements from the thermocouple and for providing feedback control of a heater or cooler so as to establish and maintain selected electrochemical cell temperatures. In an embodiment, a temperature controller of the present system comprises a processor that uses a control algorithm, such as a proportional-integral derivative algorithm, to provide the feedback control of the heater or cooler so as to access thermally stable electrochemical cell conditions.

Open circuit voltage analyzers of the present invention are capable of determining open circuit voltages that correspond to thermodynamically stabilized conditions. In some embodiments, the open circuit voltage analyzer is also capable of open circuit voltage data acquisition and, of optionally providing analysis of the data generated by the measurement system including calculating thermodynamic state functions, such as changes in entropy and enthalpy, and generating plots of thermodynamic state functions versus open circuit voltage or electrochemical cell composition useful for characterizing electrochemical cells and electrode materials. Useful open circuit analyzers are processors capable of executing algorithms that utilize open circuit measurements as a function of time to identify open circuit voltages that correspond to thermodynamically stabilized conditions. In an embodiment, the open circuit voltage analyzer is capable of calculating observed rates of change in open circuit voltage per unit time ($\Delta OCV/\Delta t)_{observed}$ for a selected electrochemical cell temperature and composition combination using the open circuit voltage measurements as a function of time received from the means of measuring open circuit voltage. For example, the open circuit voltage analyzer is configured such that it receives open circuit voltages from the means of measuring open circuit voltage and calculates observed rates of change in open circuit voltage per unit time. For each observed rate of change in open circuit voltage per unit time, the open circuit voltage analyzer compares the absolute value of the observed rates of change in open circuit voltage per unit time for the selected electrochemical cell temperature and composition combination to a threshold rate of change in open circuit voltage per unit time ($\Delta OCV/\Delta t)_{threshold}$. The analyzer determines that an open circuit voltage is equal to the open circuit voltage of the electrochemical cell for thermochemically stabilized conditions for the selected electrochemical cell temperature and composition combination when the absolute value of the observed rate of change in open circuit voltage per unit time is equal to or less than the threshold rate of change in open circuit voltage per unit time:

$$\left| \left( \frac{\Delta OCV}{\Delta t} \right)_{observed} \right| \leq \left( \frac{\Delta OCV}{\Delta t} \right)_{Threshold}.$$

In exemplary embodiments, the threshold rate of change in open circuit voltage as a function of time is equal to or less than 1 mV h$^{-1}$ (millivolt per hour) and preferably for some applications the threshold rate of change in open circuit voltage as a function of time is equal to or less than 0.3 mV h$^{-1}$, and more preferably for some applications the threshold rate of change in open circuit voltage as a function of time is equal to or less than 0.1 mV h$^{-1}$.

In one embodiment, for example, the analyzer receives open circuit voltage measurements corresponding to various times and uses this information to repeatedly (periodically or aperidocially) calculate observed rates of change in open circuit voltage per unit time. When the observed rate of change $(\Delta OCV/\Delta t)_{observed}$ calculated by the analyzer is equal to or less than the threshold rate of change $(\Delta OCV/\Delta t)_{threshold}$, the analyzer may determine that the open circuit voltage measurement most recently received from the means for measuring open circuit voltages is equal to the open circuit voltage for thermochemically stabilized conditions, may determine the next open circuit voltage measurement received from the means for measuring open circuit voltages is equal to the open circuit voltage for thermochemically stabilized conditions, or may calculate a time averaged valued of open circuit voltage corresponding to experimental conditions when $|(\Delta OCV/\Delta t)_{observed}| \leq (\Delta OCV/\Delta t)_{threshold}$.

A significant capability of the present system is that it provides a means of establishing electrochemical cell conditions and collecting voltage, time and temperature measurements with the enhanced accuracy required to enable accurate thermodynamic analysis. Selection of a combination of a means for measuring open circuit voltage accurate to within about 1 mV and a temperature controller capable of establishing electrochemical cell temperatures to within about 0.1 degrees Kelvin, for example, provides a number of benefits. For example, this combination of system component performance attributes provides measurements accurate enough to determine a range of important thermodynamic parameters and materials properties of many electrode materials and/or electrochemical energy conversion and storage systems. Further, these performance attributes enable thermodynamic state functions, such as the Gibbs free energy, enthalpy and entropy of electrode/electrochemical cell reactions, to be determined using measurements corresponding to a relatively narrow range of temperatures (e.g. less than or equal to about 10 degrees Kelvin). For some applications, confining measurements to a narrow range of electrochemical cell temperatures is beneficial for avoiding thermally activated phase changes in electrode materials that make thermodynamic analysis difficult and for avoiding electrochemical cell temperatures where self discharge of the electrochemical cell is significant.

The present invention includes methods and systems wherein selected electrochemical cell temperature and composition combinations are established by selecting the composition of the electrochemical cell and sequentially accessing a series of temperatures for each composition established, and includes methods wherein selected electrochemical cell temperature and composition combinations are established by selecting the temperature of the electrochemical cell and accessing a series of compositions for each temperature established. The present invention also includes, however, embodiments wherein specific selected electrochemical cell temperatures and compositions are established and experimentally characterized. The present invention includes embodiments wherein electrochemical cell temperature is varied by stepwise selection of discrete cell temperatures and embodiments wherein cell temperatures are continuously varied at a selected rate (e.g. a temperature ramp).

The present system is capable of providing measurements and characterization of a variety of different kinds of electrochemical cells. In one embodiment, a 3-electrode cell (working, counter and reference) is employed to study of the working electrode's reaction thermodynamics. In another embodiment, a 2-electrode cell is employed wherein the counter electrode can be assimilated to a reference electrode for the study of the working electrode's reaction thermodynamics. In another embodiment, a 2-electrode cell is employed with two working electrodes, positive and negative, that compose a primary or a secondary battery.

The present invention also includes systems wherein a 3 electrode system (working electrode, counter electrode and reference electrode) is incorporated into the electrochemical cell. A 3-electrode system (working, counter, reference) is useful for accurate OCV measurements of the working electrode potential at equilibrium. A 3-electrode system is also useful for determining the voltage contribution of the working and the counter electrode to the overall cell OCV. In a battery consisting of a positive electrode and a negative electrode, it is useful to independently measure each electrode's potential versus a reference electrode, which can be achieved using a 3-electrode cell. A 3-electrode system (working, counter and reference) is also useful for experimental conditions when current is flowing in the electrochemical cell. The working electrode potential is measured against a reference electrode, which by definition takes a constant potential at a defined temperature. Usually the temperature dependence of the reference electrode is negligible compared to that of the working electrode. In lithium batteries research, for example, typically a 3-electrode cell comprises metallic lithium for the reference and for the counter electrode. Reference electrodes useful for aqueous batteries include $Hg/Hg_2Cl_2/KCl$, $Hg/HgO/Ba(OH)_2$, $Ag/AgCl/HCl$, $Pt/quinonehydroquinone/HCl$.

In some embodiments, the measurement system further comprises a reference electrode to measure the working electrode (first electrode) potential. In these embodiments, the counter electrode (second electrode) is used for selectively varying the working electrode's composition. This system allows for open circuit voltages to be measured for a variety of working electrode compositions. Open circuit voltages measured in these embodiments can then be used to characterize the materials properties, thermodynamics and physical properties of the working electrode and/or probe chemical reactions occurring on/in the working electrode. This is a substantial benefit of use of the present methods and system with a 3-electrode electrochemical cell. There are some case cases where the counter electrode can also play the role of reference electrode, such as cells based on metallic lithium anodes (sometimes called half-cells). In these cases, a 2 electrode cell is sufficient to determine the working electrode potential at equilibrium and therefore its reaction thermodynamics functions.

In another aspect the present invention provides a method for thermodynamically evaluating an electrochemical cell having an electrode pair (e.g., cathode and an anode) comprising the steps of: (i) controlling the composition of the electrochemical cell to establish a plurality of selected electrochemical cell compositions; (ii) controlling the temperature of the electrochemical cell to establish a plurality of selected electrochemical cell temperatures for each of the selected electrochemical cell compositions, thereby establishing a plurality of selected electrochemical cell temperature and composition combinations; (iii) measuring open circuit voltages of the electrochemical cell as a function of time for the selected electrochemical cell compositions and the selected electrochemical cell temperatures; and (iv) identifying open circuit voltages for thermochemically stabilized conditions of the electrochemical cell for the selected electrochemical cell temperature and composition combinations. In an embodiment wherein the electrochemical cell comprises a secondary battery, the method further comprises the step of cycling the secondary battery several times (e.g. 2-20 times) prior to thermodynamic evaluation. In an embodiment, the step of controlling the composition of said electrochemical cell is carried out by establishing selected states of charge of the electrochemical cell and/or selected states of charge of the electrode(s) corresponding to each of said selected electrochemical cell compositions.

In some methods of the present invention, open circuit voltages of the electrochemical cell are measured with an accuracy to within 1 mV for some applications, optionally with an accuracy to within 0.5 mV for some applications, and preferably for some applications with an accuracy to within 0.1 mV, and open circuit voltages of the electrochemical cell are measured as a function of time with temporal resolution equal to or greater than 1 second. In some embodiments, the step of controlling the composition of the electrochemical cell is carried out by establishing open circuit voltages corresponding to each of the selected electrochemical cell compositions, optionally with an accuracy to within 1 mV, and preferably for some applications with an accuracy to within 0.1 mV. In some embodiments, the step of controlling the temperature of the electrochemical cell establishes the selected electrochemical cell temperatures to within about 0.5 degrees Kelvin, preferably to within about 0.25 degrees Kelvin for some applications, and more preferably to within about 0.05 degrees Kelvin for some applications.

In an embodiment, the step of controlling the temperature of the electrochemical cell comprises the steps of: (i) measuring the temperature of the electrochemical cell; (ii) providing feedback control of a heater or cooler in thermal contact with the electrochemical cell to establish the selected electrochemical cell temperatures, optionally using a feedback control algorithm such as a proportional-integral derivative algorithm.

In an embodiment, the step of identifying open circuit voltages for thermochemically stabilized conditions of the electrochemical cell comprises the steps of: (i) calculating observed rates of change in open circuit voltage per unit time for the combinations of selected electrochemical cell compositions and selected electrochemical cell temperatures using the open circuit voltage measurements as a function of time; (ii) comparing the absolute value of observed rates of change in open circuit voltage per unit time for a combination of a selected electrochemical cell composition and a selected electrochemical cell temperature to a threshold rate of change in open circuit voltage per unit time; and (iii) identifying an open circuit voltage is equal to the open circuit voltage of the electrochemical cell for thermochemically stabilized conditions for a selected electrochemical cell composition and a selected electrochemical cell temperature when the absolute value of the observed rate of change in open circuit voltage per unit time is equal to or less than the threshold rate of change in open circuit voltage per unit time. In some embodiments, these steps are carried out by a processor capable of executing an algorithm for determining open circuit voltages that correspond to thermodynamically stabilized conditions. In some embodiments the threshold rate of change in open circuit voltage per unit time is equal to or less than about 1 mV $h^{-1}$.

Methods of the present invention may further comprise a number of analysis steps wherein measurements of open circuit voltage, electrochemical cell composition, time and/or temperature are used to characterize thermodynamics and materials properties of the electrodes, electrolyte and/or electrochemical cell and/or to predict electrochemical performance parameters for these systems such as energy, energy density, power density, current rate, discharge voltage, capacity and the cycle life.

One method of the present invention, for example, further comprises analysis steps of generating plots of the open circuit voltages of the electrochemical cell for thermochemically stabilized conditions versus temperature for each of the selected electrochemical cell compositions. In this embodiment, determination of slopes and intercepts for each of the plots corresponds to measured changes in entropy ($\Delta S$) and enthalpy ($\Delta H$), respectively, for reactions at the electrodes for each of the cell compositions. Analysis steps of this aspect of the present invention may further comprise calculating changes in Gibbs free energy ($\Delta G$) for reactions at the electrodes for each of the cell compositions using the determined entropy and enthalpy data.

Another method of the present invention, for example, further comprises analysis steps of: (i) generating a plot of measured changes in entropy ($\Delta S$) versus electrochemical cell composition and/or (ii) generating a plot of measured changes in enthalpy ($\Delta H$) versus electrochemical cell composition; (iii) generating a plot of measured changes in entropy ($\Delta S$) versus open circuit voltage and (iv) generating a plot of changes in entropy ($\Delta S$) versus changes in enthalpy ($\Delta H$). Features in such plots of $\Delta S$ or $\Delta H$ versus electrochemical cell composition or open circuit voltage are useful for characterizing phase (and changes in phase), morphology and/or structural defects in electrode materials. Furthermore, such parametric entropy and enthalpy curves can be used as a 'fingerprint' for characterizing and/or identifying an electrode (e.g., cathode and an anode) material, an electrolyte and/or an electrochemical cell. As the material cycles in the battery, these traces change due to physical and/or chemical changes occurring in the electrode materials. The present methods, therefore, are useful for evaluating the 'state of health' of an electrode material upon heavy cycling or exposing to high temperatures or to overpotentials (overcharge and overdischarge for a cathode and an anode, respectively) or to provide quality control information regarding the presence of defects in electrodes and electrochemical systems.

Even when the composition of the electrode material is not well known, it is still very useful to plot the $\Delta S$ versus the OCV or electrochemical cell composition to ascertain the materials properties of the electrodes. The $\Delta S$ and the $\Delta H$ are functions of the chemical composition of the electrode material, and parametric plots of $\Delta S$ and $\Delta H$ versus open circuit voltage or composition is very sensitive to differences in the composition and structures of different materials. Accordingly, these parametric plots can serve as a "fingerprinting" for different materials so as to ascertain the identity, composition, structure, defect structure etc. of electrode materials, even when composition is not well known in advance.

Thermodynamic measuring methods and systems of the present invention enable a broad range of functionalities. In embodiments, methods of the present invention comprise a method of predicting one or more performance parameter of an electrode and/or electrochemical cell including the capacity, specific energy, power, cycle life, cell voltage, stability, self discharge or discharge current of the electrochemical cell. In embodiments, methods of the present invention comprise a method of assessing the composition, morphology, phase or physical state of an electrode(s) or electrochemical cell. In embodiments, methods of the present invention comprise a method of identifying surface, bulk and crystal defect structures in electrode materials or electrochemical cell. In embodiments, methods of the present invention comprise a method of identifying a phase transition in electrode materials.

In one aspect, the SOH of a battery is related to the SOH of one (or a combination) of three major cell components: anode, cathode and electrolyte. The thermodynamic functions ($\Delta G$, $\Delta S$ and $\Delta H$) of each electrode reaction are used as the fingerprint of the corresponding electrode's SOH. These functions can be plotted versus the 'electrode composition' or the 'electrode Potential' to provide a quantitative characterization of the electrochemical cell or any component thereof.

The present invention also provides methods for determining the SOH of an electrochemical cell, for example an electrochemical cell comprising a host material. An embodiment of this aspect comprises the steps of: determining a $\Delta G$, $\Delta S$ and/or $\Delta H$ of the electrochemical cell for a plurality of selected electrochemical cell compositions; determining states of charge of the electrochemical cell for each of the plurality of selected electrochemical cell compositions; identifying the states of charge and $\Delta G$, $\Delta S$ and/or $\Delta H$ corresponding to an event or condition of the electrochemical cell; and comparing the $\Delta G$, $\Delta S$ and/or $\Delta H$ corresponding to the event or condition of the electrochemical cell to reference $\Delta G$, $\Delta S$ and/or $\Delta H$ corresponding to the event or condition of a reference electrochemical cell.

In specific embodiments, the event or condition includes, but is not limited to: a 0% charge state of the electrochemical cell, a 100% charge state of the electrochemical cell, a partial charge state of the electrochemical cell and a phase transition taking place within the electrochemical cell. For certain embodiments, the selected electrochemical cell compositions correspond to compositions of an electrode of the electrochemical cell, compositions of an electrolyte of the electrochemical cell and/or compositions or more than one electrode of the electrochemical cell. In an exemplary embodiment, the reference $\Delta G$, $\Delta S$ and/or $\Delta H$ are $\Delta G$, $\Delta S$ and/or $\Delta H$ for the electrochemical cell at a previous charge cycle.

In one embodiment, the plurality of electrochemical cell compositions corresponds to a plurality of states of charge of the electrochemical cell for a single electrochemical cell temperature. In certain embodiments, the temperature of the electrochemical cell is controlled, for example to establish a plurality of electrochemical cell temperatures.

As described herein, the step of determining $\Delta G$, $\Delta S$ and/or $\Delta H$ of the electrochemical cell for a plurality of selected electrochemical cell compositions, for example, comprises the steps of: controlling the composition of the electrochemical cell to establish a plurality of selected electrochemical cell compositions; controlling the temperature of the electrochemical cell to establish a plurality of selected electrochemical cell temperatures for each of the selected electrochemical cell compositions; measuring open circuit voltages of the electrochemical cell as a function of time for the selected electrochemical cell compositions and temperatures; and identifying open circuit voltages for thermochemically stabilized conditions of the electrochemical cell for the selected electrochemical cell compositions and temperatures. A specific method further comprises the step of: determining the change in open circuit voltages of the electrochemical cell for thermochemically stabilized conditions between two or more of the selected electrochemical temperatures for each of the selected electrochemical cell compositions. A specific method also comprises the step of: generating plots of the open circuit voltages of the electrochemical cell for thermochemically stabilized conditions versus temperature for each of the selected electrochemical cell compositions. A further method comprises the step of: determining slopes and intercepts for each plot, wherein the slopes correspond to $\Delta S$ and the intercepts correspond to $\Delta H$.

Also described are methods for charging an electrochemical cell, for example an electrochemical cell comprising a host material. An embodiment of this aspect comprises the steps of: characterizing the state of health of the electrochemical cell; selecting a charging voltage and/or current according to the characterized state of health of the electrochemical cell; and providing the selected voltage and/or current to electrodes of the electrochemical cell to charge the electrochemical cell.

In embodiments, the SOH of the electrochemical cell is a function of the number of charge/discharge cycles the electrochemical cell has experienced. In a specific embodiment, the voltage and/or current provided to the electrochemical cell is preselected according to the number of charge/discharges cycles the electrochemical cell has experienced. In a specific embodiment, when the characterized state of health corresponds to a first state of health of the electrochemical cell, a first charging voltage is selected and wherein when the characterized state of health corresponds to a second state of health of the electrochemical cell, a second charging voltage less than the first charging voltage is selected. For example, when the characterized state of health of a an electrochemical cell corresponds to a charge/discharge cycle number of 20 to 2000, the charging voltage is selected over the range of 1.5 to 5.5 volts and/or when the characterized state of health corresponds to a charge/discharge cycle number of 200 to 1000, the charging voltage is selected over the range of 2.5 to 5.3 volts. In specific embodiments, the methods of charging according to the state of health of the electrochemical cell may be selectively adjusted, for example to provide a longer useable Also described are systems for charging an electrochemical cell, for example an electrochemical cell comprising a host material. An embodiment of this aspect comprises: means for delivering a voltage and/or current to electrodes of the electrochemical cell; means for characterizing a state of health of the electrochemical cell; and a control circuit for: receiving the characterized state of health; and controlling the means for delivering a voltage and/or current. In one embodiment, the means for delivering a voltage and/or current comprises a voltage and/or current source. In a specific embodiment, the means for delivering a voltage and/or current comprises a voltage and/or current controller. For certain embodiments, the means for characterizing the state of health of the electrochemical cell comprises a system configured for performing methods described herein. In certain embodiments, the means for characterizing the state of health of the electrochemical cell comprises a system for thermodynamically evaluating an electrochemical cell, for example an ETMS.

In exemplary embodiments, the control circuit selectively provides voltage and/or current to electrodes of the electrochemical cell from the means for delivering a voltage and/or current. For example, in certain embodiments the voltage and/or current delivered to the electrodes of the electrochemical cell from the means for delivering a voltage and/or current is determined by the control circuit based upon the characterized state of health of the electrochemical cell.

In one embodiment, a system for charging an electrochemical cell is configured for performing methods described herein. In a specific embodiment, the system is miniaturized, for example, such that it comprises a component of a mobile electronic device, for example a cellular phone, a portable music player, a laptop, a battery charger, etc. In an exemplary embodiment, the electrochemical cell is a battery for a mobile electronic device, for example a cellular phone, a portable music player, a laptop, etc.

In a specific embodiment of this aspect, methods are provided for charging an electrochemical cell in a mobile electronic device. A method of this aspect comprises the steps of: monitoring a voltage profile of the electrochemical cell over at least one charge cycle and/or at least one discharge cycle; determining a charging voltage and/or current based upon the monitored discharge voltage profile; and providing the charging voltage and/or current to electrodes of the electrochemical cell, thereby charging the electrochemical cell. Optionally, a method of this aspect comprises measuring a plurality of open circuit voltages of the electrochemical cell. Optionally, a method of this aspect comprises monitoring a temperature of the electrochemical cell over at least one charge cycle and/or at least one discharge cycle.

Systems and methods of the present invention are useful for thermodynamically evaluating a range of electrochemical cells including primary and secondary batteries such as lithium ion batteries, zinc-carbon (Leclanche and saline) batteries, zinc-manganese oxide alkaline batteries, lithium ion polymer batteries, lithium batteries, nickel cadmium batteries, nickel-metal hydride batteries, lead acid batteries, nickel hydrogen batteries, and other types of electrochemical cells including, but not limited to, fuel cells, photovoltaics cells and electrochemical capacitors (and supercapacitors) and double-layer capacitors. Exemplary battery systems that may be evaluated, characterized and/or analyzed by the present invention are summarized in Table I (primary batteries) and Table II (secondary batteries). Analysis of battery systems having a pure counter electrode, such as pure lithium metal, are convenient for some applications of the present invention, because the chemical potential of the pure material in the counter electrode (e.g., lithium metal) is independent of the state of charge.

TABLE 1

Exemplary primary battery systems

| Primary Battery System | Chemistry | | | Cell Voltage, V | | | | Operating Temperature, °C. |
|---|---|---|---|---|---|---|---|---|
| | Anode | Cathode | Electrolyte | Nominal | Open-circuit | Midpoint | End | |
| Zinc-carbon (Leclanché) | Zn | $MnO_2$ | $NH_4Cl$ and $ZnCl_2$ (aqueous solution) | 1.5 | 1.5-1.75 | 1.25-1.1 | 0.9 | −5 to 45 |
| Zinc-carbon (zinc chloride) | Zn | $MnO_2$ | $ZnCl_2$ (aqueous solution) | 1.5 | 1.6 | 1.25-1.1 | 0.9 | −10 to 50 |
| $Mg/MnO_2$ | Mg | $MnO_2$ | $MgBr_2$ or $Mg(ClO_4)$ (aqueous solution) | 1.6 | 1.9-2.0 | 1.8-1.6 | 1.2 | −20 to 60 |
| Zn/Alk./$MnO_2$ | Zn | $MnO_2$ | KOH (aqueous solution) | 1.5 | 1.5-1.6 | 1.25-1.15 | 0.9 | −20 to 55 |
| Zn/HgO | Zn | HgO | KOH or NaOH (aqueous solution) | 1.35 | 1.35 | 1.3-1.2 | 0.9 | 0 to 55 |
| Cd/HgO | Cd | HgO | KOH (aqueous solution) | 0.9 | 0.9 | 0.85-0.75 | 0.6 | −55 to 80 |
| Zn/$Ag_2O$ | | $Ag_2O$ or AgO | KOH or NaOH (aqueous solution) | 1.5 | 1.6 | 1.6-1.5 | 1.0 | 0 to 55 |
| Zinc/air | Zn | $O_2$ (air) | KOH (aqueous solution) | 1.5 | 1.45 | 1.3-1.1 | 0.9 | 0 to 50 |
| Li/$SO_2$ | Li | $SO_2$ | Organic solvent, salt solution | 3.0 | 3.1 | 2.9-2.75 | 2.0 | −55 to 70 |
| Li/$SOCl_2$ | Li | $SOCl_2$ | $SOCl_2$ w/$AlCl_4$ | 3.6 | 3.65 | 3.6-3.3 | 3.0 | −60 to 85 |
| Li/$MnO_2$ | Li | $MnO_2$ | Organic solvent, salt solution | 3.0 | 3.3 | 3.0-2.7 | 2.0 | −20 to 55 |
| Li/$FeS_2$ | Li | $FeS_2$ | Organic solvent, salt solution | 1.5 | 1.8 | 1.6-1.4 | 1.0 | −20 to 60 |
| Solid State | Li | I2(P2VP) | Solid | 2.8 | 2.8 | 2.8-2.6 | 2.0 | 0 to 200 |

TABLE 2

Exemplary secondary battery systems

| Secondary Battery System | Common Name | Chemistry | | | Cell voltage (typical), V | | | | Operating Temperature, °C |
|---|---|---|---|---|---|---|---|---|---|
| | | Anode | Cathode | Electrolyte | Nominal | Open-Circuit | Operating | End | |
| Lead-acid | SLI | Pb | $PbO_2$ | $H_2SO_4$ (aqueous solution) | 2.0 | 2.1 | 2.0-1.8 | 1.75 (lower operating and end voltage during cranking operation) | −40 to 55 |
| | Traction | Pb | $PbO_2$ | $H_2SO_4$ (aqueous solution) | 2.0 | 2.1 | 2.0-1.8 | 1.75 | −20 to 40 |
| | Stationary | Pb | $PbO_2$ | $H_2SO_4$ (aqueous solution) | 2.0 | 2.1 | 2.0-1.8 | 1.75 (except when on float service) | −10 to 40 |
| | Portable | Pb | $PbO_2$ | $H_2SO_4$ (aqueous solution) | 2.0 | 2.1 | 2.0-1.8 | 1.75 (where cycled) | −40 to 60 |
| Nickel-cadmium | Vented pocket plate | Cd | NiOOH | KOH (aqueous solution) | 1.2 | 1.29 | 1.25-1.00 | 1.0 | −20 to 45 |
| | Vented sintered plate | Cd | NiOOH | KOH (aqueous solution) | 1.2 | 1.29 | 1.25-1.00 | 1.0 | −40 to 50 |
| | Sealed | Cd | NiOOH | KOH (aqueous solution) | 1.2 | 1.29 | 1.25-1.00 | 1.0 | −40 to 45 |
| | PNC | Cd | NiOOH | KOH (aqueous solution) | 1.2 | 1.29 | 1.25-0.85 | 1.00-4.00 | −90 to 80 |
| Nickel-iron (conventional) | | Fe | NiOOH | KOH (aqueous solution) | 1.2 | 1.37 | 1.35-1.05 | 1.0 | −10 to 45 |
| Nickel-zinc | | Zn | NiOOH | KOH (aqueous solution) | 1.65 | 1.73 | 1.6-1.4 | 1.2 | −10 to 50 |
| Zinc/silver oxide (silver-zinc) | | Zn | AgO | KOH (aqueous solution) | 1.5 | 1.86 | 1.7-1.3 | 1.0 | −20 to 60 |
| Cadmium/silver oxide (silver-cadmium) | | Cd | AgO | KOH (aqueous solution) | 1.1 | 1.41 | 1.4-1.0 | 0.7 | −25 to 70 |
| Nickel-hydrogen | | $H_2$ | NiOOH | KOH (aqueous solution) | 1.4 | 1.32 | 1.3-1.15 | 1.0 | 0 to 50 |
| Nickel-metal hydride | | MH | NiOOH | KOH (aqueous solution) | 1.2 | 1.4 | 1.25-1.10 | 1.0 | −20 to 50 |
| Rechargeable "primary" types, $Zn/MnO_2$ | | Zn | $MnO_2$ | KOH (aqueous solution) | 1.5 | 1.5 | 1.3-1.0 | 1.0 | −20 to 40 |
| Lithium ion systems | | C | $LiCoO_2$ | Organic solvent | 4.0 | 4.1 | 4.0-3.0 | 3.0 | −20 to 50 |

The methods and systems of the present invention also are capable of thermodynamically evaluating virtually any electrochemical system having an electrode pair including, but not limited to, gas electrodes, electrochemical sensors, catalysis materials, corrosion systems, electro-deposition systems and electrosynthesis systems.

The methods and systems of the present invention also are capable of thermodynamically evaluating and otherwise analyzing virtually any type of electrode or any electrode material including, but not limited to, host electrode materials and intercalating electrode materials such as carbon electrodes, nanostructure metal oxide electrodes and nano-phosphate electrodes.

BRIEF DESCRIPTION OF THE DRAWINGS

FIG. 17 provides entropy versus compositions curves for charge and discharge conditions.

DETAILED DESCRIPTION OF THE INVENTION

Figure 1:
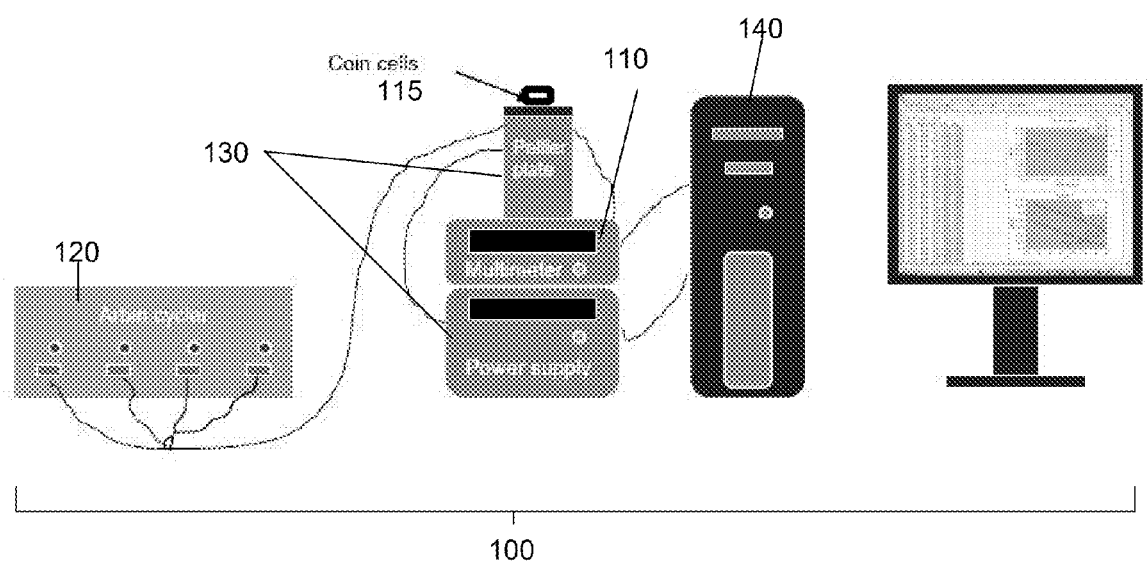
FIG. 1 provides a schematic diagram of an electrochemical thermodynamic measurement system of the present invention.

Referring to the drawings, like numerals indicate like elements and the same number appearing in more than one drawing refers to the same element. In addition, hereinafter, the following definitions apply:

The term "electrochemical cell" refers to devices and/or device components that convert chemical energy into electrical energy or electrical energy into chemical energy. Electrochemical cells typically have two or more electrodes (e.g., cathode and anode) wherein electrode reactions occurring at the electrode surfaces result in charge transfer processes. Electrochemical cells include, but are not limited to, primary batteries, secondary batteries, galvanic cells, fuel cells and photovoltaic cells.

The term "open circuit voltage" refers to the difference in potential between terminals (i.e. electrodes) of an electrochemical cell when the circuit is open (i.e. no load conditions). Under certain conditions the open circuit voltage can be used to estimate the composition of an electrochemical cell. The present methods and system utilize measurements of open circuit voltage for thermochemically stabilized conditions of an electrochemical cell to determine thermodynamic parameters, materials properties and electrochemical properties of electrodes, electrochemical cells and electrochemical systems.

The term "capacity" is a characteristic of an electrochemical cell that refers to the total amount of electrical charge an electrochemical cell, such as a battery, is able to hold. Capacity is typically expressed in units of ampere-hours.

The expression "state of charge" or "SOC" is a characteristic of an electrochemical cell or component thereof (e.g. electrode—cathode and/or anode) referring to its available capacity, such as a battery, expressed as a percentage of its rated capacity.

The term "host material" refers to a component of an electrochemical cell configured for accommodating a molecule, atom, ion and/or group into the host material. In this context, accommodating includes insertion of a molecule, atom, ion and/or group into the host material, intercalation of a molecule, atom, ion and/or group into the host material and/or reaction of a molecule, atom, ion and/or group with the host material. In embodiments, accommodation of a molecule, atom, ion and/or group is a reversible process, such that a molecule, atom, ion and/or group can be released from the accommodating host material. For certain embodiments, reversible accommodation by host materials does not result in significant degradation or significant structural deformation of the material upon multiple accommodation/release cycles. In some embodiments a host material is an intercalation material. In some embodiments a host material is a framework material. In some embodiments a host material is a host electrode of an electrochemical cell and/or an intercalation electrode of an electrochemical cell.

"Intercalation" refers to refers to the process wherein an ion inserts into a host material to generate an intercalation compound via a host/guest solid state redox reaction involving electrochemical charge transfer processes coupled with insertion of mobile guest ions, such as fluoride ions. Major structural features of the host material are preserved after insertion of the guest ions via intercalation. In some host materials, intercalation refers to a process wherein guest ions are taken up with interlayer gaps (e.g., galleries) of a layered host material. Examples of intercalation compounds include, but are not limited to, fluoride ion intercalation compounds wherein fluoride ions are inserted into a host material, such as a layered fluoride host material or carbon host material.

The present invention provides methods and systems for thermodynamically evaluating electrochemical systems and components thereof, including electrochemical cells such as batteries, fuel cells and photovoltaics. The present systems and methods are capable of establishing selected electrochemical cell conditions, such as temperature and composition, and carrying out measurements of a number of cell parameters, including open circuit voltage, time and temperature, with accuracies large enough to allow for precise determination of thermodynamic state functions and materials properties relating to the composition, phase and electrochemical properties of electrodes and electrolytes in an electrochemical cell. Thermodynamic measurement systems of the present invention are highly versatile and provide information for predicting a wide range of performance attributes for virtually any electrochemical system having an electrode pair.

To demonstrate the components, performance and functionality of the present systems and methods, entropies and enthalpies of lithium intercalation into various materials is examined using an electrochemical thermodynamics measurement system (ETMS) of the present invention. First, a background explanation is provided, establishing the relationships between experimental measurements provided by the ETMS and important thermodynamic parameters which govern important electrochemical properties of the electrode.

Second, a description of the components of the ETMS is provided. Third, example data is shown and analysis methods of the present invention are demonstrated which are used to determine thermodynamic parameters useful for characterizing intercalating electrode materials and predicting electrochemical performance.

To determine the evolution of the entropy and enthalpy of lithium intercalation into a material $Li_xM$ as a function of x, the temperature dependence of the open circuit voltage is examined using the present invention. This voltage is related to the Gibbs free energy of reaction by the thermodynamic identity:

$$\Delta G = -nFU \tag{4}$$

where U is the equilibrium potential of the electrode and F the Faraday number. For the $Li^+/Li$ electrochemical couple one electron is exchanged, so n=1.

The partial molar enthalpy, $\Delta H$, and entropy, $\Delta S$, of the lithium intercalation reaction are derived with respect to the amount of charge passed. In the following, $\Delta H$ and $\Delta S$ are assumed independent of temperature. Since the measurements are made between 5° C. and room temperature, this assumption is reliable as long as there are no phase transitions in this temperature range. Such is, for instance, the case for lithium cobalt oxide at the composition $Li_{0.5}CoO_2$, where a slight temperature change triggers the monoclinic to hexagonal phase transition close to room temperature.

The values measured are partial molar variables. From the first law of thermodynamics relating the internal energy of the system E to the work W and heat dissipated Q, the differential of the enthalpy can be obtained:

$$dE = \delta W + \delta Q \tag{5}$$
$$= -PdV + \mu dn + TdS$$

$$dH = dE + PdV + VdP \tag{6}$$
$$= \mu dn + TdS + VdP$$

with $\mu$, the chemical potential of the cathode, referred to the metallic lithium anode, and n the number of lithium atoms exchanged. The term $\mu dn$ is the electrical work of the charge exchanged. In this study, the pressure P is constant, so the third term, VdP, is neglected. Using (6) the Gibbs free energy can then be written as:

$$dG = dH - TdS - SdT \tag{7}$$
$$= \mu dn - SdT$$

To get molar values we use x=n/N, where N is Avogadro's number. The chemical potential is related to the open circuit voltage U by $\mu = -eU$ where e is the charge of the electron.

$$dG = -NeUdx - SdT \tag{8}$$
$$= -FUdx - SdT$$

Since F=Ne. Then using Maxwell's relation for mixed second derivatives, we get the partial molar entropy of lithium intercalation as a function of the open circuit voltage:

$$\left.\frac{\partial S}{\partial x}\right|_T = F\left.\frac{\partial U}{\partial T}\right|_x = \Delta S \tag{9}$$

Since by definition H=G+TS we find:

$$\left.\frac{\partial H}{\partial x}\right|_T = \left.\frac{\partial G}{\partial x}\right|_T + T\left.\frac{\partial S}{\partial x}\right|_T \tag{10}$$
$$= N\left.\frac{\partial G}{\partial n}\right|_T + TF\left.\frac{\partial U}{\partial T}\right|_x$$

By definition $(\partial G/\partial n)_T$ is the chemical potential $\mu = -eU$. We thus obtain the partial molar enthalpy of lithium intercalation as a function of the open circuit voltage, U:

$$\left.\frac{\partial H}{\partial x}\right|_T = -FU + TF\left.\frac{\partial U}{\partial T}\right|_x = \Delta H \tag{11}$$

It must be noted that $\mu = \mu_c - \mu_a$, is the difference of chemical potential between the cathode and the anode. As a consequence all our results are referred to the lithium anode, for which the chemical potential is supposed to be a constant at different states of charge.

FIG. 1 provides a schematic diagram of an electrochemical thermodynamic measurement system for thermodynamically evaluating an electrochemical cell. As shown in FIG. 1, electrochemical thermodynamic measurement system 100 comprises: (i) a means 110 for measuring open circuit voltages of the electrochemical cell 115 as a function of time, (ii) a composition controller 120 electrically connected to the electrochemical cell; (iii) a temperature controller 130 in thermal contact with the electrochemical cell for establishing a plurality of selected electrochemical cell temperatures for each of the selected compositions; and (iv) an open circuit voltage analyzer 140 for receiving open circuit voltage measurements as a function of time from the means for measuring open circuit voltages and for identifying open circuit voltages for thermochemically stabilized conditions. In the embodiment shown in FIG. 1, electrochemical cell 115 is a coin cell, means 110 for measuring open circuit voltages is a digital multimeter electrically connected to the electrodes of the electrochemical cell 115, composition controller 120 is an Arbin BT4+ battery test instrument electrically connect to the electrochemical cell 115 such that is capable of charging or discharging the electrochemical cell 115 to a desired composition. Temperature controller 130 is a combination of a Peltier plate thermoelectric cooler, power supply, thermocouples in thermal contact with the Peltier plate and electrochemical cell 115 and feedback temperature control processor. These components are assembled such that temperature controller 130 is capable of establishing and maintaining a range of selected electrochemical cell temperatures. Open circuit voltage analyzer 140 is a processor capable of executing an algorithm for determining open circuit voltages for thermodynamically stabilized conditions.

Two temperature control setups are exemplified in this description. In the same experiments, temperature cycle was controlled manually using a Boekel Peltier cooler. Two batteries (to ensure reproducibility) were first discharged to a given voltage, corresponding to the desired insertion composition x. The cells were then isolated in a plastic bag and put in contact with the Peltier plate. Several temperature steps, usually five, were made. They comprised a temperature ramp followed by a temperature plateau until the open circuit voltage reached equilibrium. This cycle took approximately thirty minutes for each temperature. The temperature was controlled at ±0.5° C., and measured with a Chromel-Alumel thermocouple. Voltage was monitored with a National Instruments Lab-PC-1200 card within a 0.1 mV precision.

In other experiments the apparatus used is that shown in FIG. 1 and the whole process was computer controlled. A program written in Visual Basic for Applications was developed to control an Agilent 3633 power supply which provided current to a Peltier plate in order to make the temperature steps. For that purpose a proportional-integral-derivative (PID) algorithm was chosen to get a fast temperature variation without overshoots. The program also controlled the data acquisition of the open circuit voltage of up to four cells along with their temperatures. An Agilent 34970 6.5-digit multimeter accurate to 10 μV was used for that purpose. Two RTD elements accurate to 0.1° C. were attached to the plate and to the cells to monitor their temperatures. The temperature of the plate was used to control the feedback loop of the power supply whereas the cell temperature was acquired to calculate the thermodynamic parameters. A four channel Arbin BT4+ discharged or charged the test cells to a chosen composition, and then they were allowed to equilibrate for usually four hours before the temperature cycle was launched automatically.

The alarm output of the multimeter sending a voltage step to the auxiliary channels of the Arbin, made it possible to start the discharge on demand from the Visual Basic program. About 600 data points were acquired during each temperature cycle, which lasted two and a half hours. It takes about six days to collect twenty points over the full composition range using intermittent 30 minute C/10 discharges, and steps corresponding to Δx=0.05. The temperature range was chosen to minimize the self discharge effects occurring at higher temperatures.

Figure 2A:
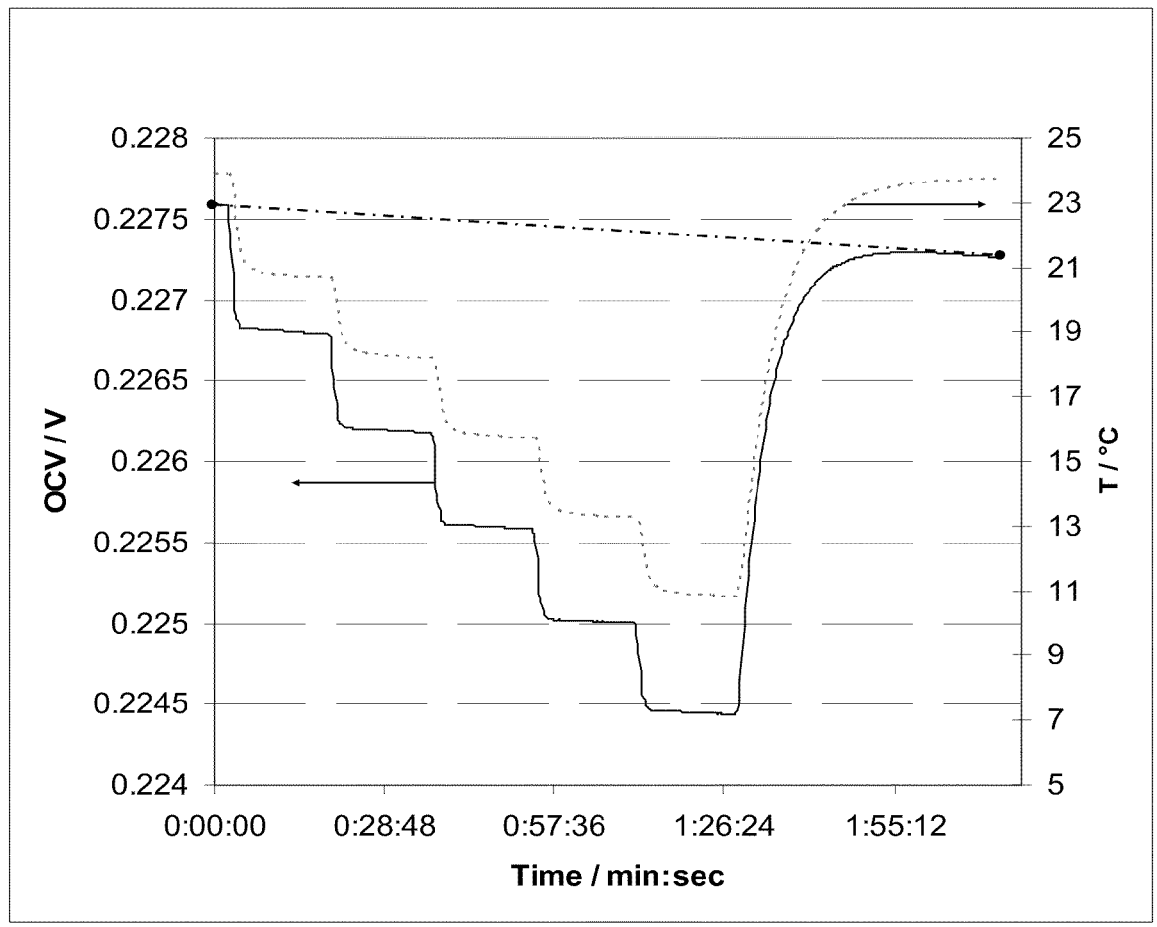
FIG. 2A provides temperature and open circuit voltage measurements for a typical temperature cycle for a graphite cell at x~0.2 in $Li_xC_6$. The dashed curve represents the temperature of the cell and the solid curve the OCV.

FIG. 2A illustrates one of the temperature cycles for a cell at a state of charge corresponding to x=0.2. It can be seen that the open circuit voltage is different at the beginning and the end of the measurement. This can be explained by the self discharge and/or potential drop due to side reactions and non-equilibrium conditions during the experiment. To correct for this error, the voltage drift plotted as a dashed line on was subtracted from the experimental data.

Figure 2B:
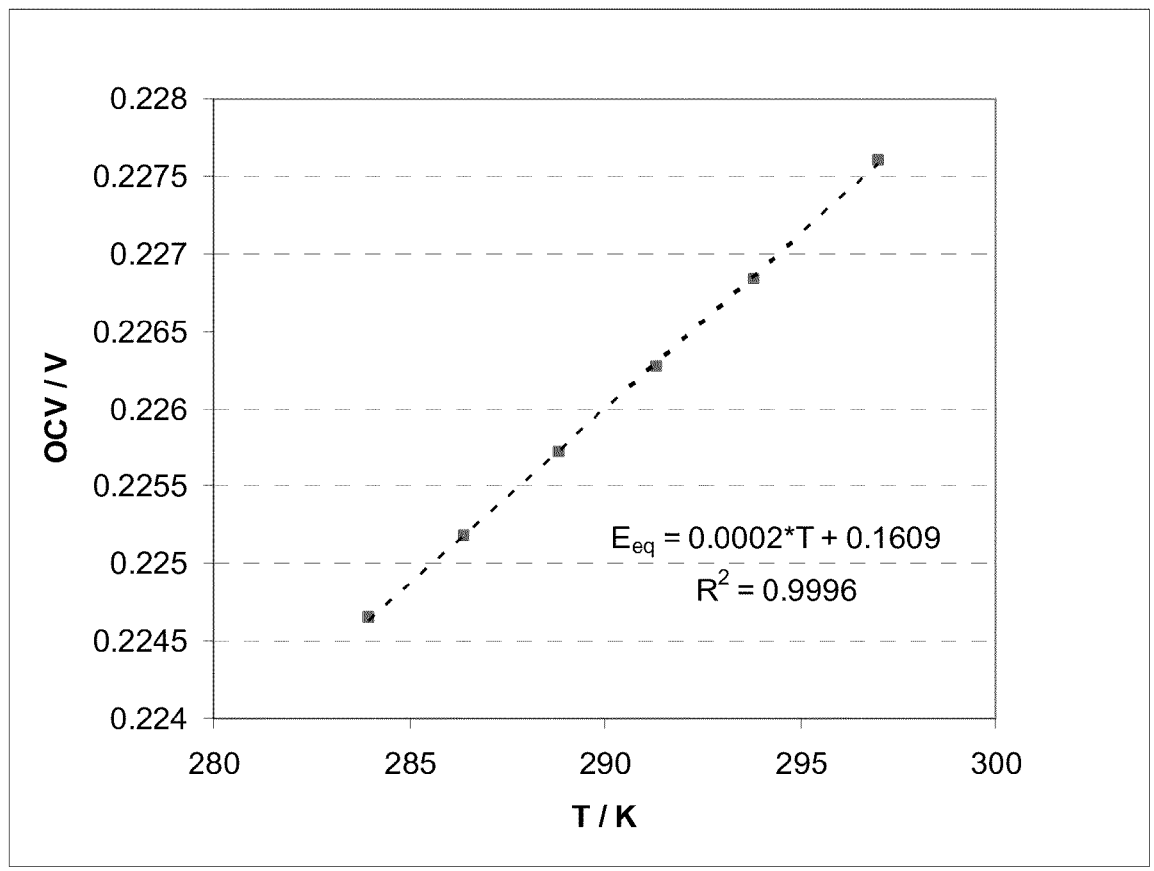
FIG. 2B provides a linear regression of the OCV vs. T for a graphite at x~0.2. The linear slope of the voltage as a function of temperature gives ΔS through equation (7). Equation (8) shows that ΔH can be calculated with the y-intercept of the open circuit voltage U vs. temperature, obtained from a linear regression (FIG. 2B). Note in this case the excellent linear behavior of the U(T) curve, with $R^2=0.9996$.

FIG. 2B provides a linear regression of the OCV vs. T for a graphite at x~0.2. The linear slope of the voltage as a function of temperature gives ΔS through equation (9). Equation (8) shows that ΔH can be calculated with the y-intercept of the open circuit voltage U vs. temperature, obtained from a linear regression (FIG. 2B). Note in this case the excellent linear behavior of the U(T) curve, with $R^2$=0.9996.

For ordered materials like graphite or lithium cobalt oxide, the fit is always very good, since the structure at a certain composition is usually well defined, and the entropy value was large (on the order of 10 J/mol/k). On the other hand for disordered compounds the quality of the linear regression is sometimes less perfect.

The simplest case that can be considered to get an idea of the entropy evolution is the entropy of mixing for an ideal solid solution. With this model, only the configurational entropy is considered. Starting from the Boltzmann definition of entropy:

$$S = k \ln \Omega \qquad (12)$$

Assuming a completely random process for the intercalation of n lithium on a lattice containing N identical sites, equation (12) transform to:

$$S = k \ln\left(\frac{N!}{n!(N-n)!}\right) \qquad (13)$$

Since N and n are large numbers, on the order of the Avogadro's number, Stirling's approximation can be used (ln N!~N ln N−N) and S becomes:

$$S = k(N \ln N - n \ln n - (N-n)\ln(N-n)) \qquad (14)$$

$$S = k((N-n+n)\ln N - n \ln n - (N-n)\ln(N-n)) \qquad (15)$$

$$S = -k\left(n \ln \frac{n}{N} + (N-n)\ln \frac{N-n}{N}\right) \qquad (16)$$

Then by setting x=n/N it follows that:

$$S = -kN(x \ln x + (1-x)\ln(1-x)) \qquad (17)$$

Finally differentiating with respect to the composition x, the partial molar entropy of the lithium intercalation reaction can be obtained:

$$\Delta S = \left.\frac{\partial S}{\partial x}\right|_{T,P} = R\ln\left(\frac{1-x}{x}\right) \qquad (18)$$

where R is the ideal gas constant if N is taken as a mole. Equation 18 can be generalized for an ordering process taking place between compositions $x_1$ and $x_2$ ($x_1$<x<$x_2$) and becomes:

$$\Delta S = R\ln\left(\frac{x_2 - x}{x - x_1}\right) \qquad (19)$$

In fact other sources of entropy can be present, such as vibrational, electronic or magnetic, and the interpretation becomes more complex when the intercalation reaction takes place on sites having a range of different energies, leading to succession of entropy increases and decreases. Also, when a first order transition occurs an entropy plateau is expected, by virtue of the Gibbs phase rule.

The invention may be further understood by the following non-limiting examples.

EXAMPLE 1

Evolution of Lithiation Thermodynamics with the Graphitization of Carbons

Abstract

Instrumentation is provided for the study the thermodynamics of lithium intercalation in cokes that were heat treated at different temperatures. The method measures the open circuit voltages of electrochemical cells as a functions of temperature, and obtains the entropy and enthalpy of the lithiation reaction. X-ray diffractometry and Raman spectroscopy were used to determine the structure of the carbon materials after heat treatment. The effect of the degree of graphitization on the entropy and enthalpy of lithium intercalation was thereby determined. A model is proposed to correlate the degree of graphitization to entropy profiles. It is shown that graphs of entropy versus open circuit voltage for different states of charge give quantitative information on graphitization, making them useful for the structural characterization of partially-graphitized carbons.

Introduction

Carbonaceous materials, especially graphite, are the active materials in most anodes of commercial rechargeable lithium batteries. The crystallinity and defect structures in these materials affect the lithium intercalation reaction, altering the cyclability, stability, and rate capability of the battery. In the present work, a series of cokes subjected to various heat treatment temperatures were prepared for a systematic study of the effect of graphitization on the thermodynamics of lithium intercalation.

In previous work we showed that curves of the entropy and enthalpy of the lithiation reaction vary greatly between graphite and disordered carbons. This is perhaps expected because the structures of these two carbonaceous materials are very different. The long-range order of graphite accommodates lithium up to $LiC_6$, and the lithiation reaction occurs in stages with the formation of different orderings of lithium atoms. The entropy curves consequently show several distinct regions with plateaus, typical of first order phase transitions. On the other hand, the mechanism of lithium insertion into carbonaceous materials is not well understood.

Our previous work showed that measurements of the entropy and enthalpy differed between graphite materials subjected to different processings, and some sources of entropy could be identified in the curves of entropy versus state of lithiation. The present Example is focused on carbonaceous materials with low and intermediate degrees of graphitization. It is shown that graphs of entropy versus open circuit voltage at different states of charge can be used to deduce the degree of graphitization of the carbonaceous materials. These thermodynamics results are at least as sensitive to structural changes in partially-graphitized carbons as are x-ray diffractometry and Raman spectrometry.

Experimental

A series of coke samples was provided by Superior Graphite Co. (Chicago, Ill., USA). Along with the precursor that had undergone no heat treatment, materials were obtained after heat treatments at 900° C., 1100° C., 2200° C. and 2600° C. under an argon atmosphere. The average particle size was 30 microns. A petroleum coke heat treated at 1700° C. (provided by Carbone Lorraine, Aubervillier, France) was also studied. Composite electrodes were made by casting a slurry composed of 85% active material and 15% PVDF dissolved in acetone. No electronic binder was used because it could influence the thermodynamic measurements.

Coin cells of the CR2016 design were assembled in an argon-filled glove box. The electrolyte consisted on a molar solution of $LiPF_6$ in an EC:DMC (vol. 1:1) solvent mixture. The cells were first cycled five times with a rate of C/10 between 5 mV and 1.5V vs. Li to achieve a stable capacity. An automated thermodynamic measurement system (TMS) was the used to measure open circuit voltage versus temperature on pairs of cells with the same carbon material. A precision voltmeter (Agilent 34970, 10 µV resolution) measured the open circuit voltage while the cells were cooled with a Peltier plate controlled by a power supply. Six temperature steps were made with a 2° C. difference between each. Twenty minutes of equilibration was allowed for each step, which was confirmed to be enough time for the potential to stabilize. The temperature was measured with two RTD elements accurate to 0.1° C., one attached to the Peltier plate and the other to the test cell. Owing to the reasonable thickness of the cell and adequate thermal conductivities, the temperature of both RTD elements became equal a few minutes after each step. After each 6-step potential measurement, the composition was changed by a galvanostatic charge or discharge, and a rest time of four or eight hours was used before the next temperature cycle. The temperature dependence of the open circuit voltage was then reduced to the entropy and enthalpy of lithium intercalation at different states of charge.

Considering the high resolution of the instrumentation, a temperature range of 10° C. is sufficient to get accurate data while minimizing the chance of a temperature induced phase transition or a large change in electrochemical kinetics, for example. Going below room temperature minimizes self-discharge during the experiment, and the remaining voltage drift is automatically subtracted by measuring the voltage difference between the start of the experiment and two hours after termination. The lithium composition, x, is determined by using the current passed through the cell and the active mass to calculate the capacity, and then comparing it to the theoretical capacity of graphite (372 mAh/g).

X-ray diffraction (XRD) patterns were acquired with a Philips X'Pert diffractometer using the copper $K_\alpha$ x-rays. Ten percent of silicon powder was added to each sample to provide an internal reference and give an accurate peak position measurements. Raman spectra were acquired on a Renishaw micro Raman spectrometer using the 514.5 nm radiation of an argon ion laser. The spectral resolution was 1 $cm^{-1}$.

Results

Figure 3:
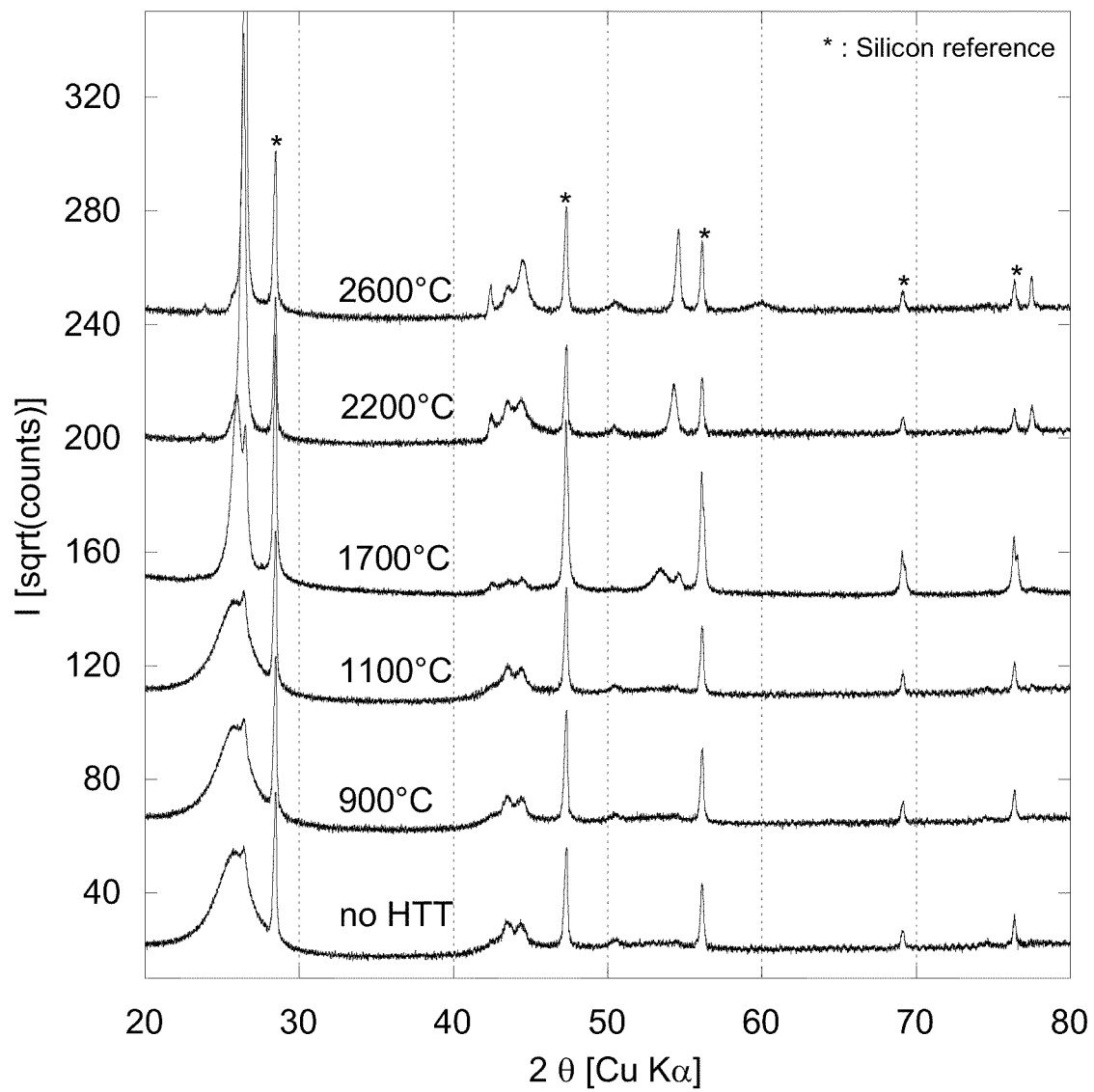
FIG. 3. XRD pattern of the coke samples heat treated at different temperatures, with an internal silicon reference (labeled *).

X-ray diffraction patterns from the different materials are presented in FIG. 3. With increasing heat treatment temperature, there is a sharpening of the graphite 002 diffraction at about $2\theta=26°$. For temperatures of 2200° C. and higher, the 004 peak is visible at $2\theta=54°$. The presence of the 004 peak is indicative of higher crystallinity.

The materials heat treated at the three lowest temperature cannot be distinguished from their XRD patterns alone, as expected since graphitization treatments are not so effective for temperatures below 1000° C. The 101 diffraction peak of the rhombohedral phase can be seen near 45°, indicating that the crystalline domains of the cokes consisted of a mixture of hexagonal and rhombohedral graphite. Noteworthy is the shape of the 002 peak for the materials heat treated at low temperatures, where a sharp peak at $2\theta=26.4°$ is present next to a broader peak at 25.7°. The sharp peak shows that well-graphitized domains are present even in these samples with low temperature heat treatments.

The degree of graphitization G was determined from the d-spacing of the 002 peaks, using the following formula:

$$G = \frac{3.461 - d_{002}}{3.461 - 3.352} \quad [E1]$$

where 3.461 Å is the d-spacing for a fully turbostratic disordered material, and 3.352 Å is the d-spacing of highly oriented pyrolytic graphite. The parameter G decreases with the proportion of turbostratic disorder, and is a measure of the degree of graphitization.

Figure 4:
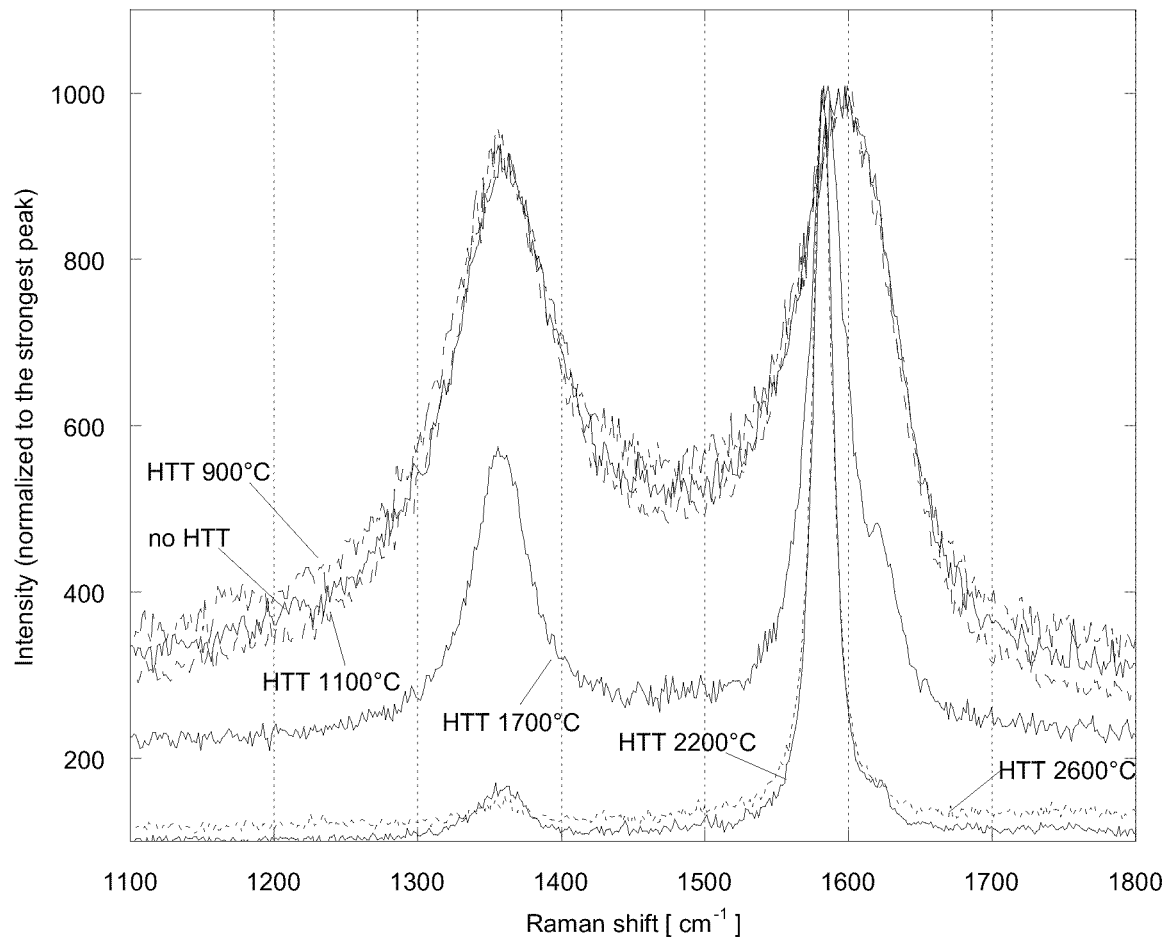
FIG. 4. Raman spectra for all samples.

Some Raman spectra of the samples are shown in FIG. 4. Raman spectra can provide information on the disorder in the 'a' direction from the intensity ratio of the D band peak ($A_{1g}$ breathing mode) at 1355 $cm^{-1}$ and the G band peak ($E_{2g2}$ stretching mode) at 1590 $cm^{-1}$. The D band is caused by vibrations that occur only when the graphene planes are small, and indicate disorder in the carbonaceous material. The crystallite size in the 'a' direction, $L_a$, can be estimated with the equation suggested by Tuinstra et al.:

$$L_a = \frac{4.3}{R} \quad [E2]$$

with R defined as the ratio of the integrated intensity of the D and G peaks.

With increasing temperature of heat treatments, there is a decrease in intensity of the D band peak, and the G band peak becomes sharper, while shifting downward. The calculated $L_a$ versus temperature is presented in FIG. 5, and is compared to the $L_c$ values obtained by XRD. The values found for $L_a$ are similar to those determined for $L_c$ from x-ray diffractometry, and confirm the increase in size of crystallites for heat treatments above 1500° C. Below this temperature, $L_a$ and $L_c$ both have a value of about 4 nm. The size of the crystalline domains increases rapidly with heat treatment temperature, reaching about 65 nm at 2600° C. X-ray lineshape analysis is only qualitative after crystallite sizes exceed 40 nm, however.

Figure 6:
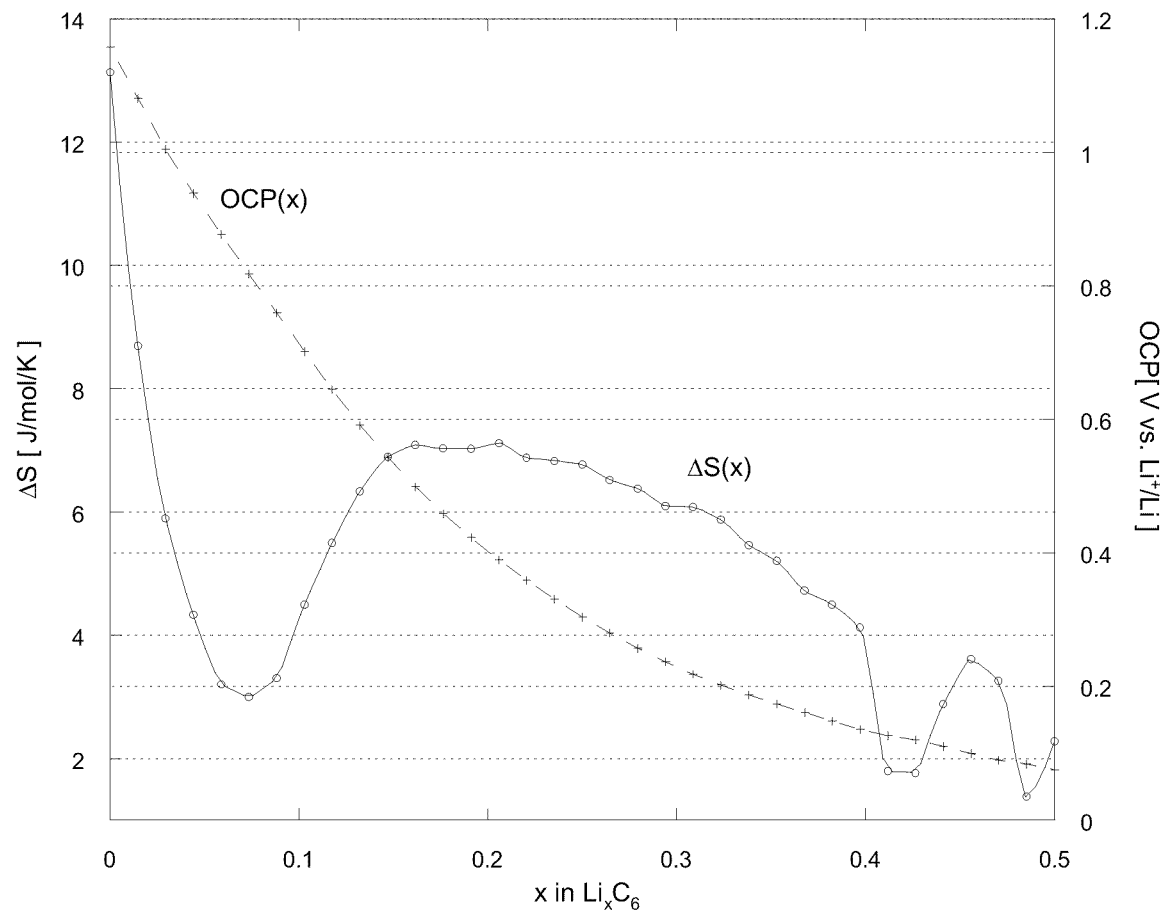
FIG. 6. Entropy of lithium intercalation into coke with no heat treatment and corresponding OCV during charge (delithiation).

FIG. 6 shows the entropy profile of the precursor material with no heat treatment, and the open circuit voltage (OCV) curve for the same material. These data were recorded during charging of the cell (increasing voltage), using eight hours rest before each temperature cycle. Charging was performed at a C/20 rate. The OCV curve has a shape typical of samples with lower temperatures of heat treatments: it decreases steadily with concentration, and the potential is high compared to graphite, exceeding 1 V vs. Li$^+$/Li, and decreases below 0.2 V only at the end of lithium insertion. The entropy curve has several visible features. After a sharp drop for compositions below x=0.1, it increases and makes a plateau between x=0.2 and 0.4. It then decreases to 1 J/mol/K, and finally increases at the very end of insertion.

Figure 7:
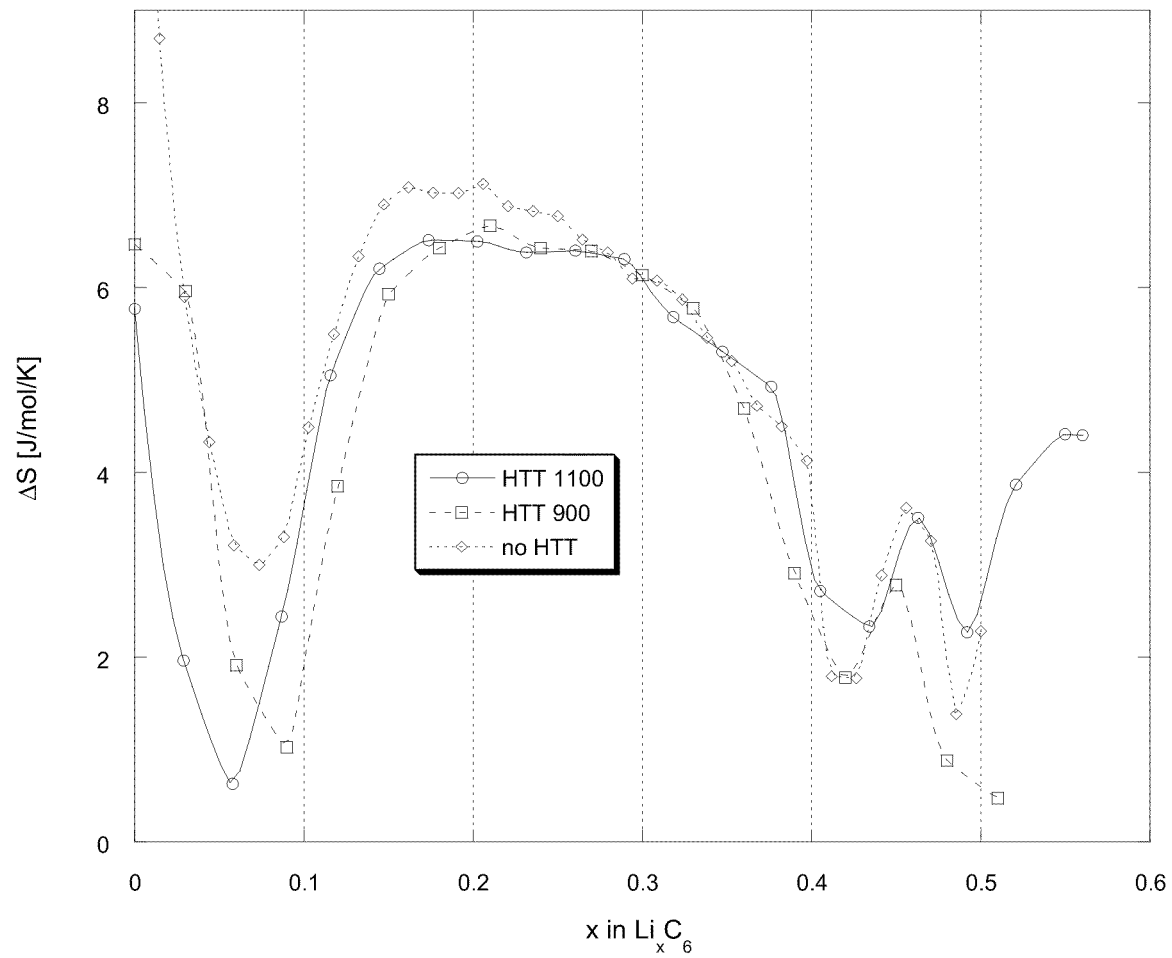
FIG. 7. Comparison of the entropy of lithiation for the samples with low heat treatment temperatures (precursor, 900° C. and 1100° C.).

The entropy curves for lithiation of the three materials with lower temperature heat treatments are presented in FIG. 7. Profiles for the precursor material, and materials heat treated at 900° C. and 1100° C. look similar, apart from the region above x=0.4. The capacity of these compounds, about 200 mAh/g, is low compared to graphite but seems to increase a bit with heat treatment.

Figure 8:
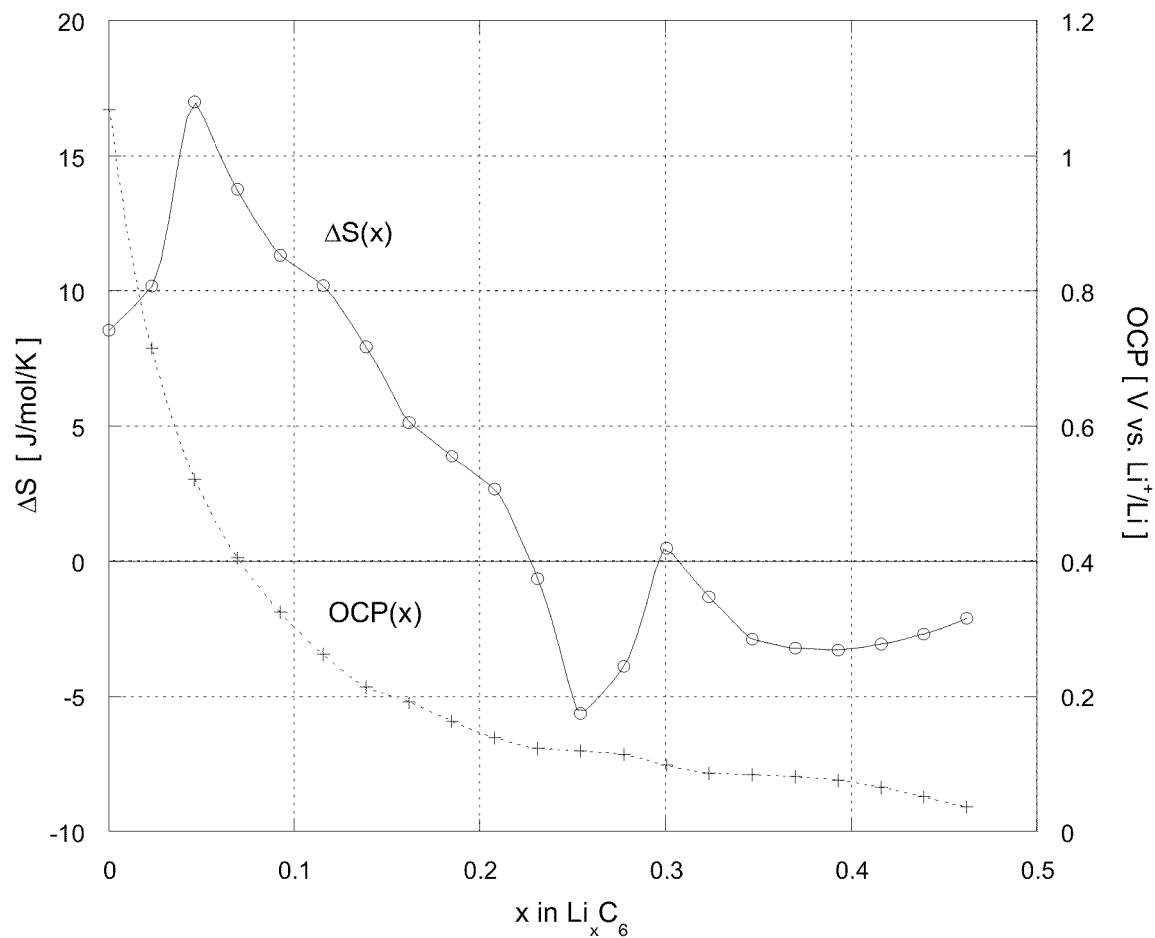
FIG. 8. Entropy of lithiation and OCV of a coke heat treated at 1700° C. (discharge curve).

For heat treatments at higher temperatures, some typical features of ordered graphite appear in the entropy curve and the OCV curve. FIG. 8 shows the entropy and OCV curves for a coke heat treated at 1700° C.: the potential first drops, and makes two sloping plateaus, hinting at staging. A plateau is also visible in the entropy for x between about 0.3 and 0.5 after an initial peak around x=0.05, and the curve decreases for lithium concentrations up to x=0.25.

Figure 9:
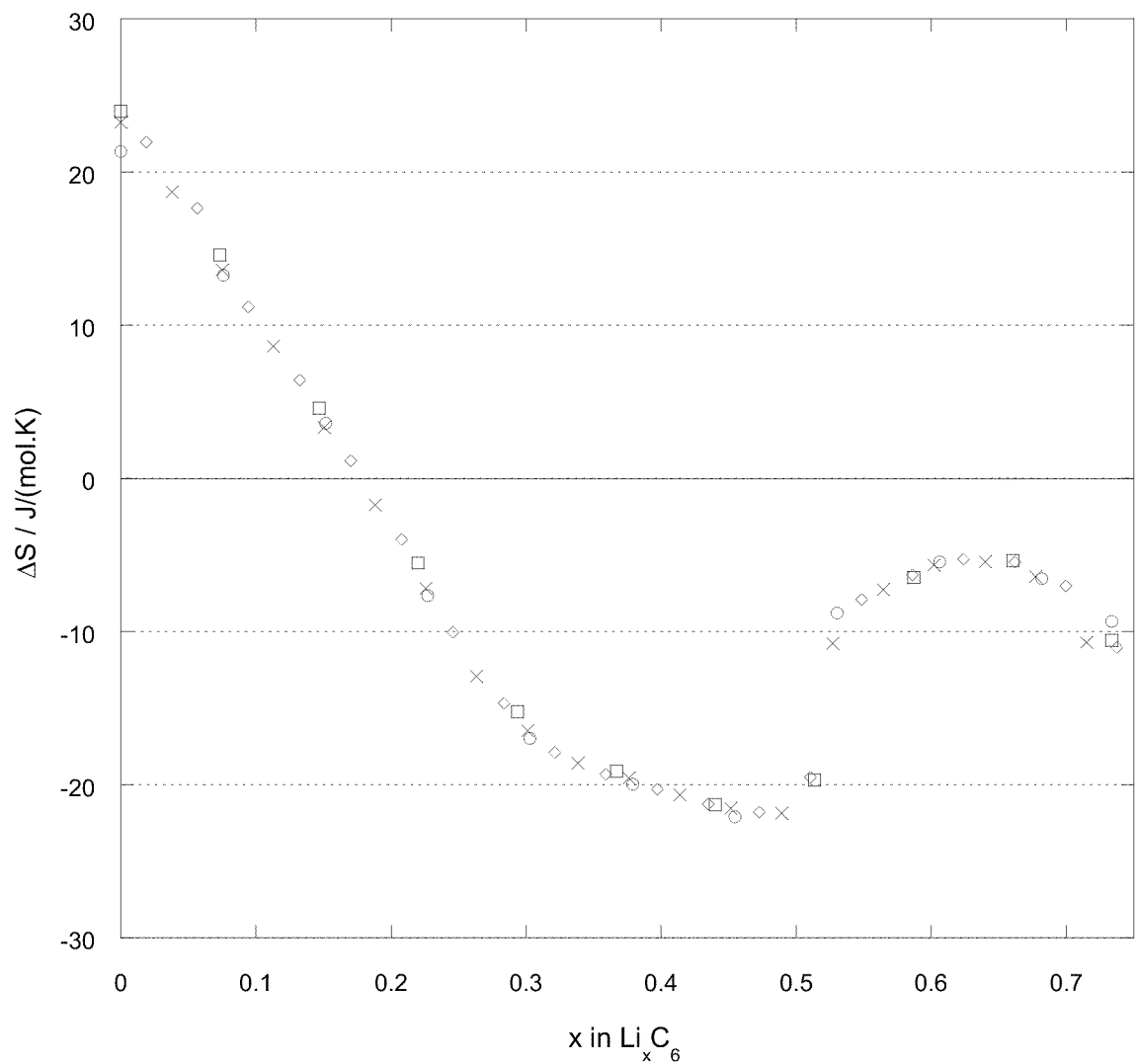
FIG. 9. Entropy of lithiation for the material heat treated at 2200° C. Data were averaged from two pairs of cells during discharge to show reproducibility.

With a heat treatment temperature of 2200° C., the material develops a high degree of crystallographic order. Large graphene planes form and can accommodate lithium in staged reactions. This is seen in FIG. 9 where the sharp entropy step at x=0.5 is indicative of the formation of a stage one compound. The capacity is greatly improved by this heat treatment, reaching 275 mAh/g.

Figure 10:
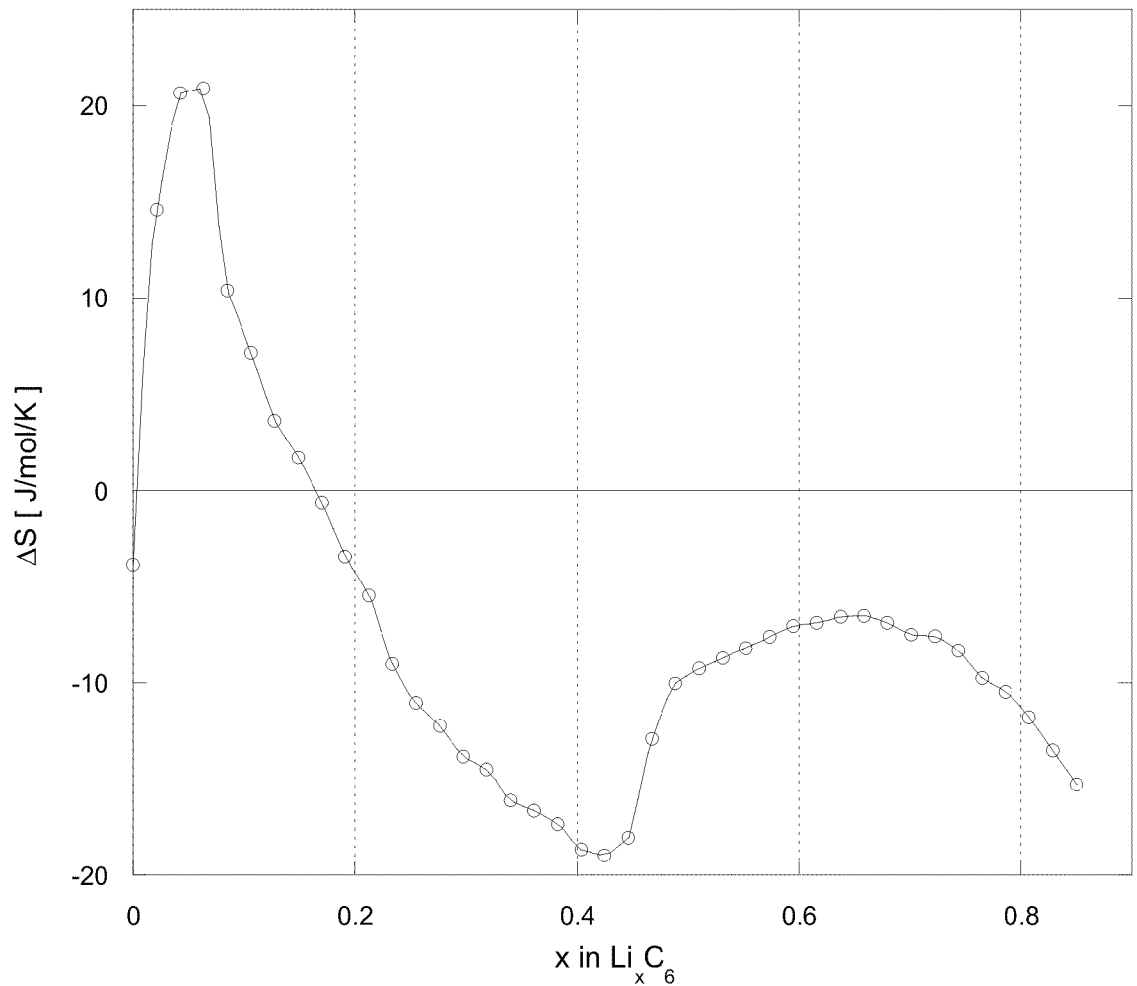
FIG. 10. Entropy of lithiation during discharge of the material heat treated at 2600° C.

Finally, the coke sample with highest heat treatment temperature of 2600° C. had the highest capacity of our materials, 316 mAh/g. The OCV and entropy curves (FIG. 10) of this sample are similar to those of natural graphite. The rise of the entropy at the lowest x does not originate from lithium intercalation in the material under study, but rather some other electrochemical couple at high potential above 0.5V vs. Li$^+$/Li, perhaps from lithium adsorption on the surfaces of disordered carbonaceous domains, which may occur prior to intercalation. After the entropy curve decreases rapidly with x below x=0.1, it becomes negative and slowly levels off at approximately x=0.3. The sharp increase near x=0.5 can be seen in the data from the sample heat treated at 2200° C. Finally the entropy curve makes a semi-plateau around −8 J/mol/K until the full capacity is reached, then begins to fall faster.

Figure 11:
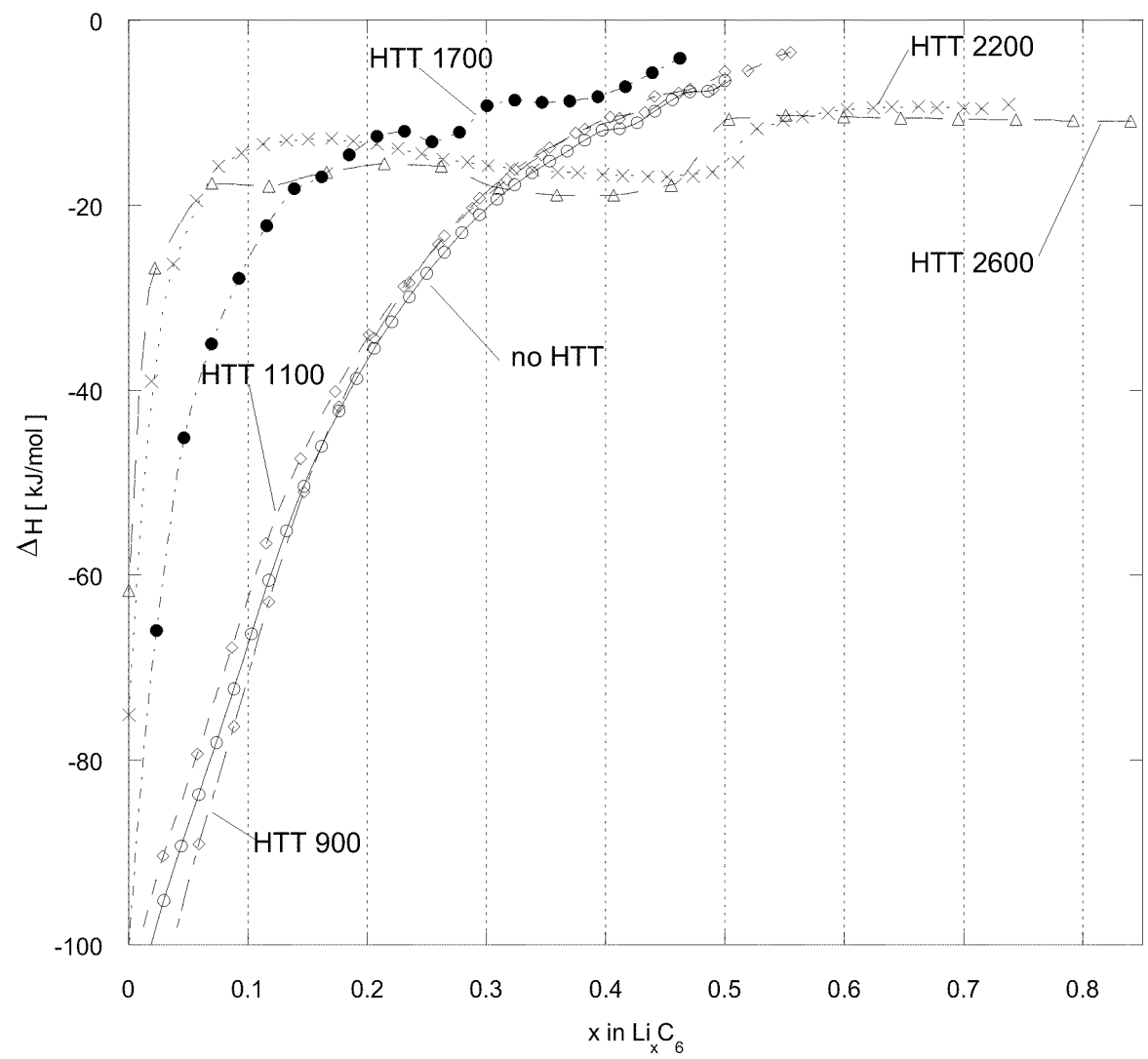
FIG. 11. Enthalpy of lithium intercalation for the five coke samples.

The enthalpies of lithiation for the six samples are presented in FIG. 11. For the precursor material, and materials heat treated at the low temperatures of 900° C. and 1100° C., the enthalpy curve mirrors the OCV profiles, because the entropy term in the free energy, TS, is small compared to the average value of enthalpy. This is not the case for the heat treatments at higher temperatures. After a rapid increase, ΔH makes a first peak around x=0.15 and then shows two plateaus. These plateaus can be related to staging, much as for the entropy profiles.

Discussion a) Analysis of the Entropy Profiles

The enthalpy and entropy curves are greatly influenced by the degree of graphitization, G. Upon a first examination, there seems to be no obvious transition in the shapes of curves for the group of samples with heat treatments at low temperatures and those at high temperatures. This apparent issue is one of data presentation. Comparing curves based on composition, x, does not account for the fact that the inserted sites do not depend on x, but rather on the potential at which the sites become active. Above 0.2 V vs. Li$^+$/Li, the intercalation sites between well-ordered graphene layers are not electrochemically active. This voltage region corresponds to most of the capacity of disordered cokes.

Many theories have been proposed to explain the mode of lithium storage for partially-graphitized carbon materials. Some proposed that lithium could bind covalently with hydrogen at the small graphene plane edges, since these materials heat treated at low temperatures are known to have a high content of hydrogen. Using NMR evidence, Mori et al. postulated the existence of two types of lithium insertion sites, some between graphene planes and others at the surfaces of crystallites, or between them. Another model, called the 'house of cards' model, proposes that single-layer graphene fragments are stacked randomly, and lithium is adsorbed on both sides of graphene sheets. Mabuchi et al. proposed a model involving clusters of metallic lithium atoms forming in cavities and pores. In our case this last possibility seems unlikely, since the clustered lithium atoms would be nearly metallic, and should contribute an extra capacity above x=0.5. They would be inserted at a potential close to 0V vs. Li$^+$/Li, but this is not observed.

Carbons heat treated at low temperatures below 1100° C. consist of turbostratically disordered graphene planes of different shapes and sizes. For lithium insertion, these materials have a wide range of sites of different energies, resulting in a sloping OCV curve. The change of insertion sites can be seen on potential relaxation curves. The equilibration time after intermittent de-lithiation of a coke with no heat treatment is shorter for potentials below 0.2 V than for potentials between 0.2 and 1 V, indicating differences in kinetic processes.

By applying this interpretation to FIG. 6, it appears that above about x=0.33 the sharp drop in entropy could come from the intercalation of lithium into crystallites of ordered graphite. By analogy with graphite it may be possible that the increase in the entropy curve at larger x may occur after embryos of a lower stage nucleate from the domains of higher staging. The rapid decrease of the entropy curve at small x can be explained by the concentration-dependence of the entropy of mixing. Filling the first available sites in a solid solution causes the entropy of lithiation to change rapidly. From x=0.15 to x=0.33, the wide energy distribution of the available sites causes the entropy to be almost zero, since a lithium atom can select only a small number of equivalently-favored sites. As a result the partial entropy of insertion should be zero, and the nearly constant value of about 5.5 J/mol/K could be explained by the difference of electronic or vibrational entropy between lithium in the metallic anode and the carbonaceous cathode. (Proving this hypothesis would require information on the phonon or electronic entropy of lithiation for disordered carbons.)

At higher temperatures of heat treatment, the region above x=0.33 shows more features. This is consistent with the graphitization process, which should make more graphitic sites available below 0.2 V. It is difficult however to attribute the successive peaks in the ΔS(x) curves of FIG. 7 to particular staging transitions. The entropy curve for the material heat treated at 1700° C. is interesting because it constitutes an important link between the behaviors of materials with low and high temperature heat treatments. The electrochemical capacity of the material heat treated at 1700° C. is low, even compared to the carbons with heat treatments at lower temperatures. The hydrogen content decreases rapidly in the temperature range from 750° C. to 1500° C., starting at about 10% hydrogen atoms below 750° C. and falling to less than 0.5% for heat treatments above 1500° C. Fewer sites are consequently available for lithium bonding, but the long range order of graphite is not yet attained, resulting in a low capacity. The OCV curve for the material heat treated at 1700° C. (FIG. 8) shows two kinds of behaviors, with a sloping decrease of potential at low x, followed by two plateaus from intercalation between graphene planes as stage 2 and then stage 1 compounds are formed. This mechanism is confirmed in the entropy curve. For materials heat treated at low temperatures, at low lithium concentrations the entropy curve makes a peak, then decreases and becomes negative when the first plateau appears in the OCV. At x near 0.3, the entropy makes a step increase and reaches a plateau corresponding to stage 1 formation.

The materials heat treated at 2200° C. and 2600° C. do not show this dual behavior, but have features very similar to natural graphite. For these materials the only mode of lithiation is lithium intercalation. Their crystallinity is not as good as for natural graphite, however, so the capacity is somewhat lower.

b) A Two-phase Mixture Model

We model carbonaceous materials with intermediate degrees of graphitization as a mixture of graphitic and non-graphitic domains. This model suggests a fit of the entropy curves with reference curves from graphitic coke (heat treated at 2600° C.) and from disordered coke (no heat treatment). However, as pointed out in the previous section, the fit is not a linear combination of the curves based on composition x, but should be based on the OCV, which determines when a lithium insertion site becomes active. For any given potential U, the reference component entropy curves must be combined as:

$$\Delta S(U) = (1-\alpha)\Delta S_{noHTT}(U) + \alpha \Delta S_{HTT\,2600}(U) \quad [E3]$$

where ΔS is the entropy of the material, and α is the fraction of graphitic domains, assuming that the material heat treated at 2600° C. is fully graphitized.

Figure 12:
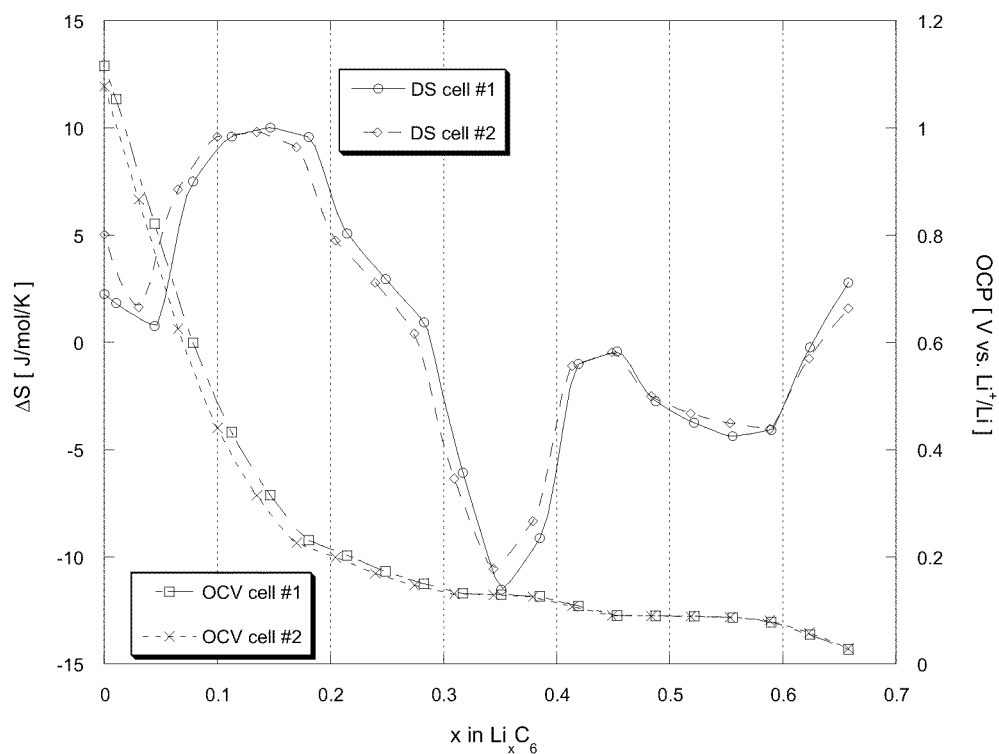
FIG. 12. Evolution of the entropy of intercalation and OCV for a mixture of 50% precursor material and 50% of material heat treated at 2600° C. (charge curve).

To test this hypothesis, electrodes were prepared using different mixtures of precursor material with no heat treatment and material heat treated at 2600° C. First, equal amounts by weight of these two materials were mixed to make an electrode. The measured profiles are shown in FIG. 12. Both entropy and OCV curves look very similar to those of the material heat treated at 1700° C. (FIG. 8), suggesting that from the standpoint of the lithiation reaction, this material is composed of graphitic and disordered domains.

Figure 13:
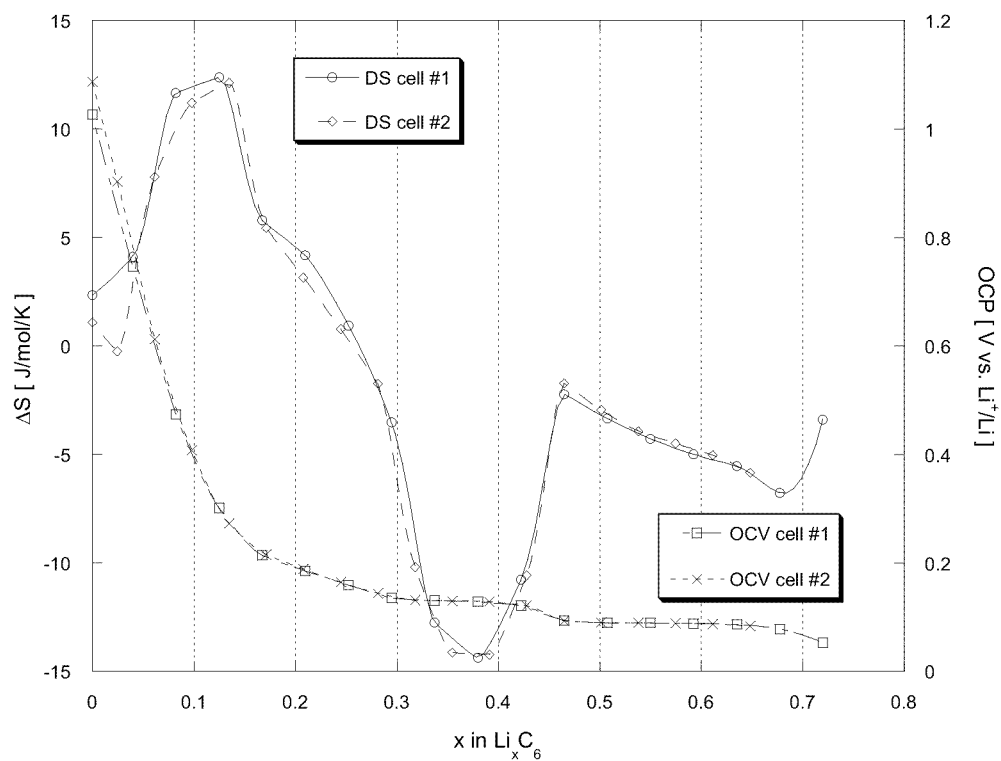
FIG. 13. Evolution of the entropy of intercalation and OCV for a mixture of 25% precursor material and 75% material heat treated at 2600° C. (charge curve).
Figure 14:
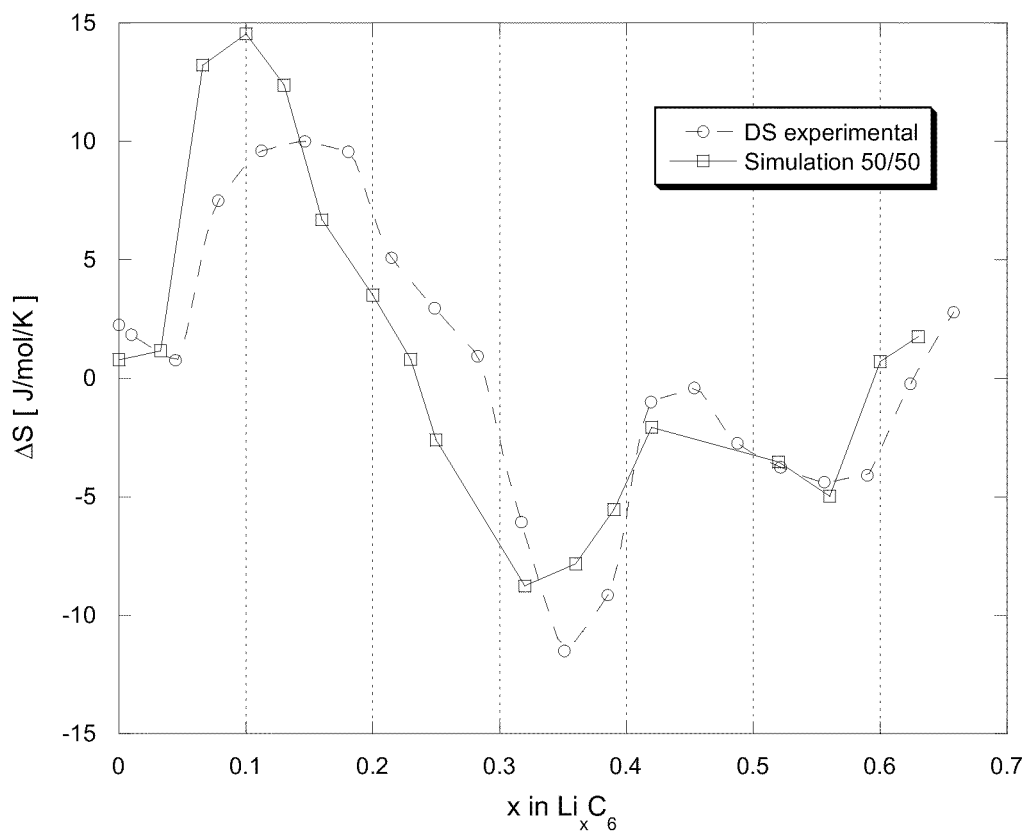
FIG. 14. Entropy of two composite electrodes made with 50% precursor material and 50% material heat treated at 2600° C., compared with the calculation of the entropy based on Equation E3 ($\alpha=0.50$).
Figure 15:
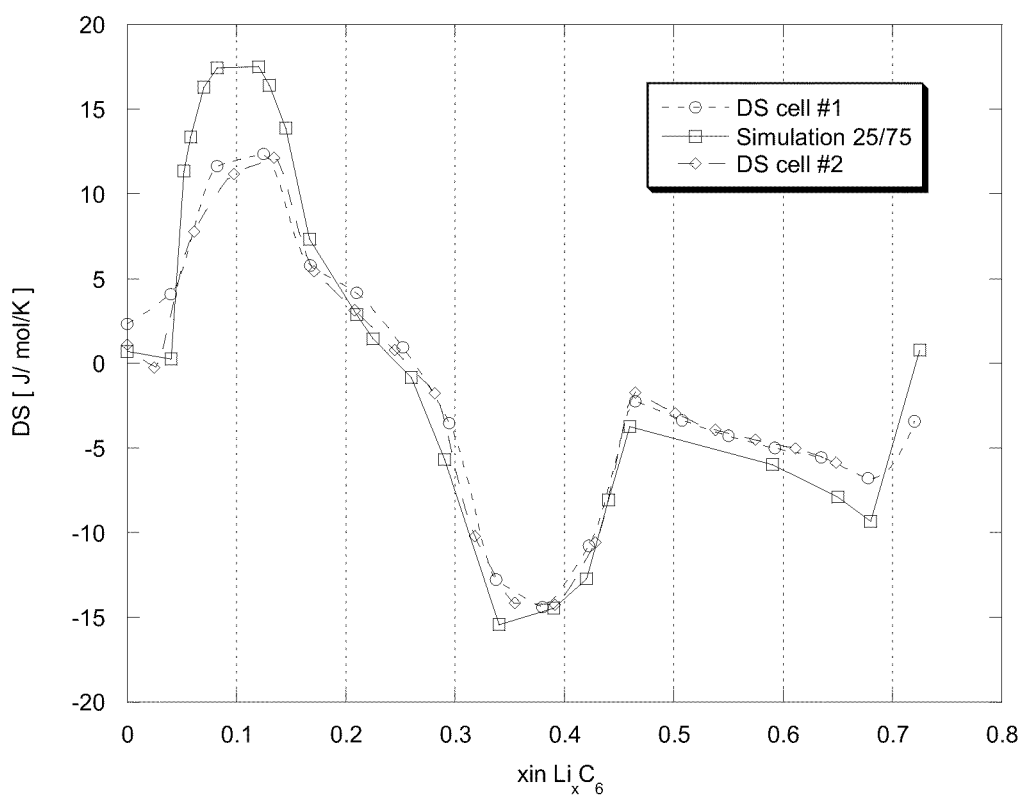
FIG. 15. Entropy of two composite electrodes made with 25% of precursor material and 75% material heat treated at 2600° C., compared with the calculation of the entropy based on Equation E3 ($\alpha=0.75$).

Another sample was prepared containing a mixture of 25 wt % of precursor material plus 75 wt % of material heat treated at 2600° C. As seen in FIG. 13, the capacity increases slightly while the stage-2 to stage-1 plateau of the OCV has a larger range than for the 50/50 sample. It is not surprising to see the curve appear closer to that of the sample heat treated at 2600° C. because the amount of graphitic material in the electrode was larger. The entropy curves of FIGS. 12 and 13 can be compared to the theoretical entropy curve obtained from Equation E3, with α equal to 0.5 and 0.75 respectively. FIG. 14 compares the entropy of lithium intercalation of a composite electrode made with 50% precursor material and 50% of material heat treated at 2600° C., with a calculation based on Equation E3 using the reference curves. The result from Equation E3 is in good agreement with experiment, although the entropy is a bit overestimated at low concentrations. The calculation with α=0.75 is shown in FIG. 15, and is compared to electrodes made with 75% of material heat treated at 2600° C. There is a very good agreement between experiment and calculation, except again at low concentrations where the entropy is higher for the calculation. These results seem to validate the mixture model of Equation E3, suggesting that it can be used to determine the fraction of graphitic phase in cokes with different heat treatment temperatures.

Figure 16:
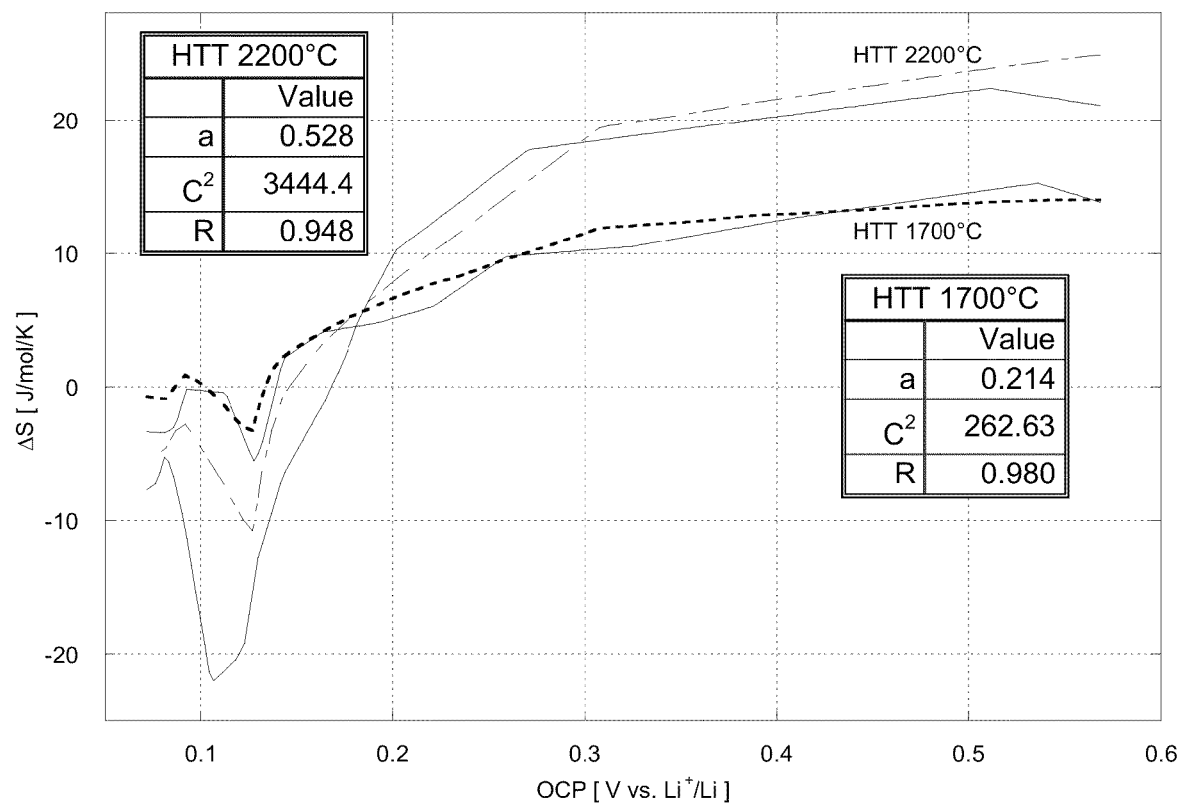
FIG. 16. Parametric plots of entropy curve versus OCV curve for two samples, heat treated at 1700° C. and 2200° C.

The entropy curve was then plotted against the OCV curve for each material. These entropy vs. OCV plots for the precursor material and for the material heat treated at 2600° C. were combined following Equation E3, and α was adjusted to fit similar curves obtained from samples heat treated at intermediate temperatures. Least squares fits for these entropy vs. OCV plots for the cokes heat treated at 1700° C. and 2200° C. are shown in FIG. 16. The regression coefficient for the material heat treated at 1700° C. is good. A value of 21% was obtained for α, close to the 30% graphitization obtained from XRD measurement of the 002 peak position. The degree of graphitization is higher for the material heat treated at 2200° C., for which α=53%, somewhat lower than the value of 77% from the XRD analysis. These values are encouraging and show a good trend, but it must be remembered that even the precursor material used as a reference contained some graphitic domains, thereby introducing an error in α. Likewise the material heat treated at 2600° C. was used as a reference curve for graphite, but it is not completely graphitized. The use of a coke heat treated at a higher temperature would improve the accuracy of the result. On the other hand, it might be difficult to find a good reference sample of disordered carbon, since these materials usually have poor electrochemical cyclability.

TABLE 3

Crystallite size in the c-direction based on the 002 peak broadening, and degree of graphitization for materials with different heat treatment temperatures (HTT)

| Sample | Full width at half maximum FWHM (2θ) | d-spacing (Å) | 002 peak angle (2θ) | G (%) | $L_c$ (Å) |
|---|---|---|---|---|---|
| Coke no HTT | 1.97 | 3.461 | 25.72 | 0 | 43 |
|  | 0.37 | 3.372 | 26.41 | 82 | 277 |
| Coke HTT 900° C. | 1.93 | 3.461 | 25.72 | 0 | 44 |
|  | 0.35 | 3.372 | 26.41 | 82 | 297 |

TABLE 3-continued

Crystallite size in the c-direction based on the 002 peak broadening, and degree of graphitization for materials with different heat treatment temperatures (HTT)

| Sample | Full width at half maximum FWHM (2θ) | d-spacing (Å) | 002 peak angle (2θ) | G (%) | $L_c$ (Å) |
|---|---|---|---|---|---|
| Coke HTT 1100° C. | 2.05 | 3.461 | 25.72 | 0 | 41 |
| | 0.33 | 3.372 | 26.41 | 82 | 320 |
| Coke HTT 1700° C. | 0.58 | 3.428 | 25.97 | 30 | 160 |
| | 0.23 | 3.359 | 26.51 | 94 | 523 |
| Coke HTT 2200° C. | 0.25 | 3.377 | 26.37 | 77 | 458 |
| Coke HTT 2600° C. | 0.20 | 3.361 | 26.50 | 92 | 643 |

Conclusion

Measurements of open circuit voltage versus temperature were used to study the effect of graphitization on the thermodynamics of lithium intercalation into cokes. Partially graphitized materials show two distinct modes of lithium insertion: cokes subjected to low heat treatment temperatures have lithium insertion into a variety of sites with a wide distribution of energies. As the graphitization improves, lithium atoms intercalate into sites similar to those of graphite. The number of sites of the first type decreases as graphitization proceeds, which results in a mixed behavior for carbonaceous materials that are heat treated at intermediate temperatures. Experimental results indicate that these carbonaceous materials with intermediate graphitization differ primarily in the amounts of the two types of lithium sites, and the chemical potentials of these sites remain largely unchanged with graphitization. A new method for measuring the degree of graphitization is provided, based on this model.

EXAMPLE 2

Electrothermodynamic Characterization of Electrode Materials

The present methods and systems are useful for identifying and characterizing physical and chemical properties of a variety of electrode materials, including intercalating electrode materials. For example, analysis of thermodynamic parameters generated using the present methods and systems provide a very sensitive and quantitative means of probing the phase, morphology and presence of defects in electrode materials in electrochemical cells. This aspect of the present invention provides an attractive method for diagnosing candidate electrode materials prior to and after implementation in commercial batteries. To demonstrate this functionality of the present invention, a number of anode materials and cathode materials for lithium ion batteries were evaluated and characterized using the present measuring system and analysis methods.

Figure 17:
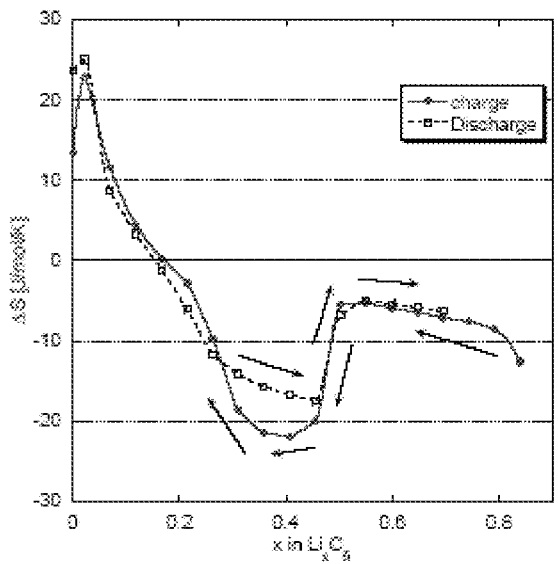
FIG. 17 shows plots of changes in entropy ($\Delta S$) of lithiation (i.e., entropy of lithium insertion) determined using the present electrochemical thermodynamics measurement system as a function of the composition of a coke anode (i.e, the stoichiometry with respect to intercalant).

FIG. 17 shows a plot of changes in entropy (ΔS) of lithiation (i.e., entropy of lithium insertion) determined using the present electrochemical thermodynamics measurement system as a function of the composition of a coke anode (i.e, the stoichiometry with respect to intercalant) during charge and discharge of coke HTT (HTT=exposed to conditions of heat treatment) at 2600 degrees Celsius. FIG. 17 provides entropy versus compositions curves for charge and discharge conditions. The profiles shown in FIG. 17 are very close to natural graphite. A hysteresis appears between charge and discharge conditions which possibly indicates that loading and unloading paths are different.

Figure 18:
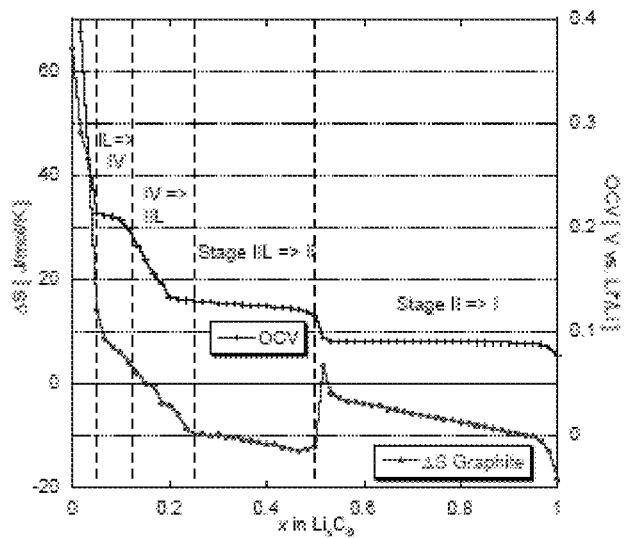
FIG. 18 shows plots of changes in entropy ($\Delta S$) determined using the present electrochemical thermodynamics measurement system as a function of the composition of the anode (i.e, the stoichiometry with respect to intercalant). Also shown in FIG. 18 is the open circuit voltage as a function of composition.
Figure 19:
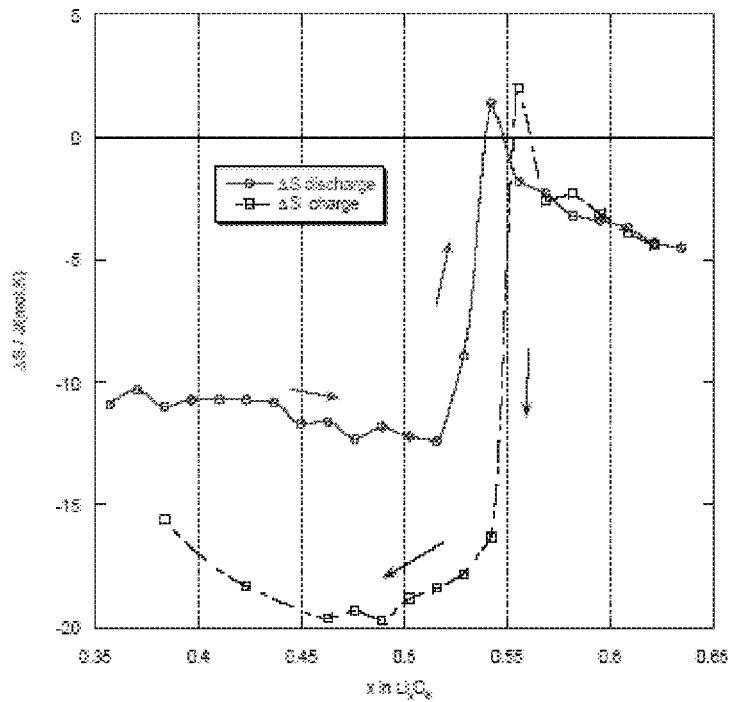
FIG. 19 provides plots of changes in entropy ($\Delta S$) determined using the present electrochemical thermodynamics measurement system as a function of the composition of a natural graphite anode that indicate entropy hysteresis at around x=0.5.

FIG. 18 provides a plot of changes in entropy (ΔS) of determined using the present electrochemical thermodynamics measurement system as a function of the composition of a natural graphite anode. Also shown in FIG. 18 is a plot of open circuit voltage as a function of anode composition. FIG. 18 shows the entropy of intercalation and OCV during insertion. FIG. 19 provides plots of changes in entropy (ΔS) of determined using the present electrochemical thermodynamics measurement system as a function of the composition of a natural graphite anode that indicate entropy hysteresis at around x=0.5. At x=0.45, a difference of nearly 7 J mol$^{-1}$K$^{-1}$ is observed.

Figure 20:
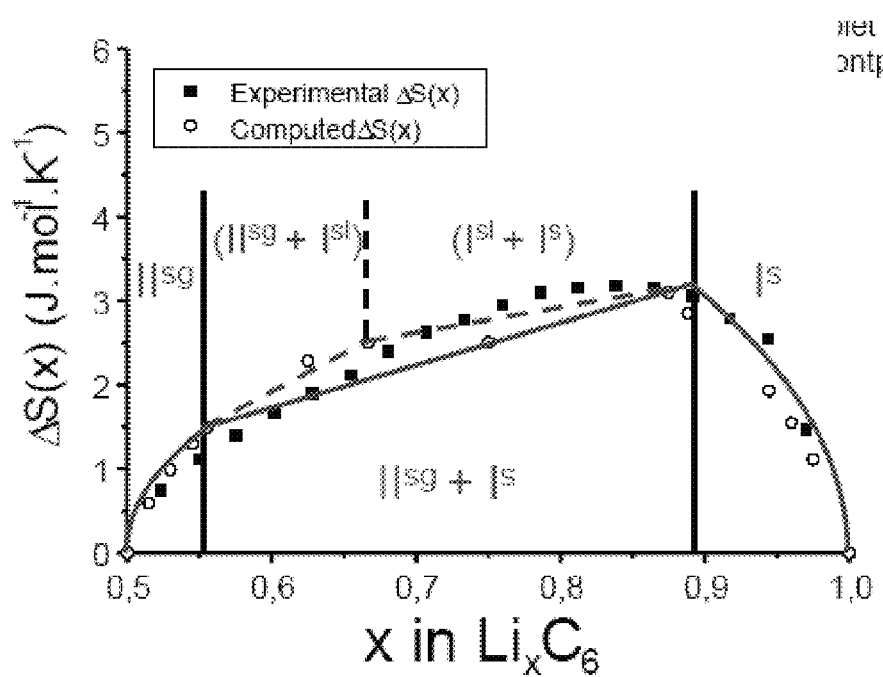
FIG. 20 provides experimentally determined $\Delta S$ values as a function of anode composition that provides phase diagram information for $Li_xC_6$. Also shown in FIG. 20 are computed $\Delta S$ values as a function of anode composition.

FIG. 20 provides experimentally determined ΔS values as a function of anode composition that provides phase diagram information for $Li_xC_6$. Also shown in FIG. 20 are computed ΔS values as a function of anode composition.

Figure 21:
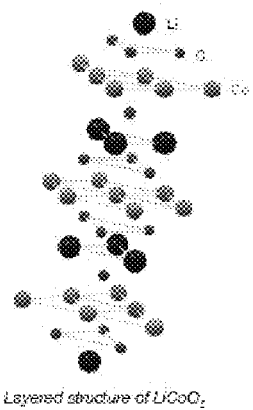
FIG. 21 shows the layered structure of $Li_xCoO_2$ cathode materials.
Figure 22:
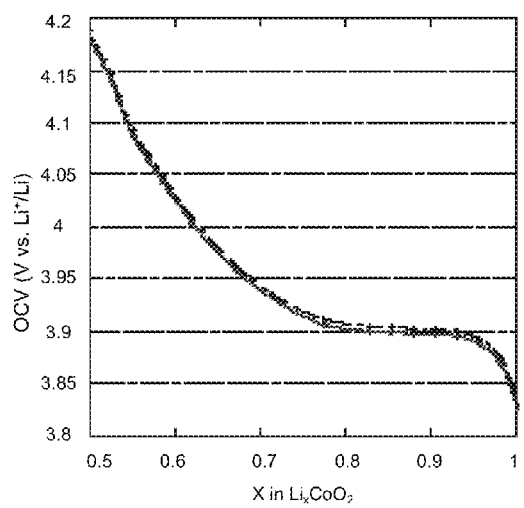
FIG. 22 provides plots of experimentally determined open circuit voltages (OCV) and changes in entropy ($\Delta S$) for lithium insertion as a function of composition for a $Li_xCoO_2$ cathode. A comparison of the two plots shows that the entropy profile exhibits many more features that the OCV profile, highlighting application of the present systems and analysis methods for characterizing cathode materials.
Figure 22:
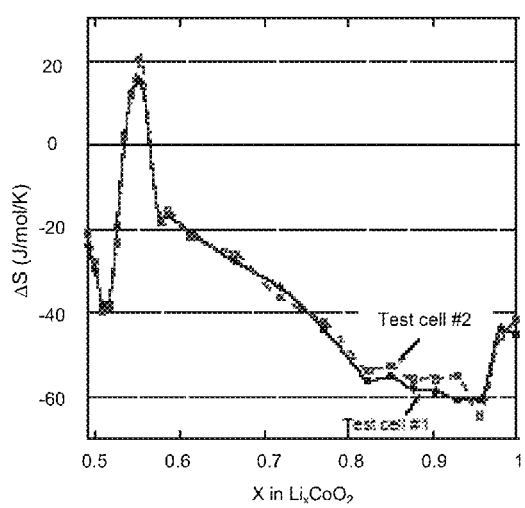
Figure 23:
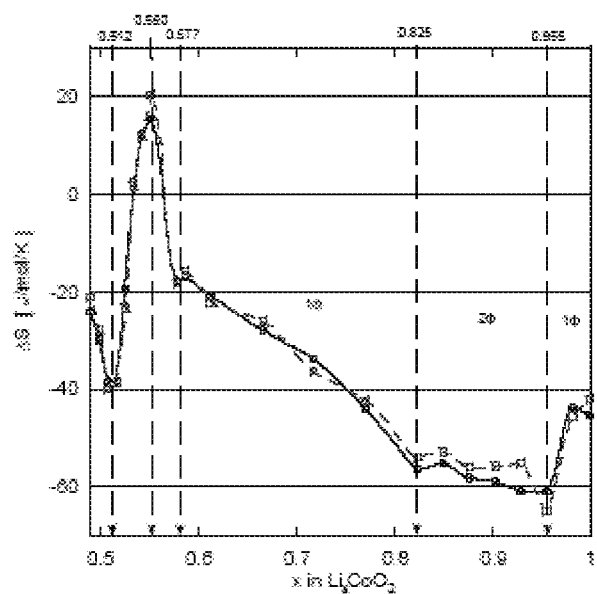
FIG. 23 shows an experimentally determined phase diagram in $Li_xCoO_2$.

FIG. 21 shows the layered structure of $Li_xCoO_2$ cathode materials. FIG. 22 provides plots of experimentally determined open circuit voltages (OCV) and changes in entropy (ΔS) for lithium insertion as a function of composition for a $Li_xCoO_2$ cathode. A comparison of the two plots shows that the entropy profile exhibits many more features that the OCV profile, highlighting application of the present systems and analysis methods for quantitative characterization of cathode materials. FIG. 23 shows an experimentally determined phase diagram in $Li_xCoO_2$.

Figure 24:
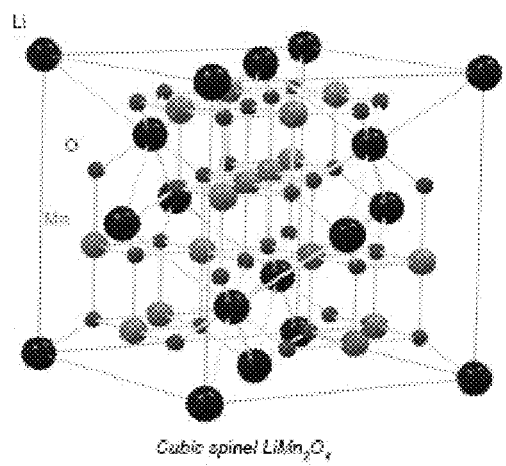
FIG. 24 shows the cubic spinel structure of $LiMn_2O_4$ cathode materials.

FIG. 24 shows the cubic spinel structure of $LiMn_2O_4$ cathode materials.

Figure 25A:
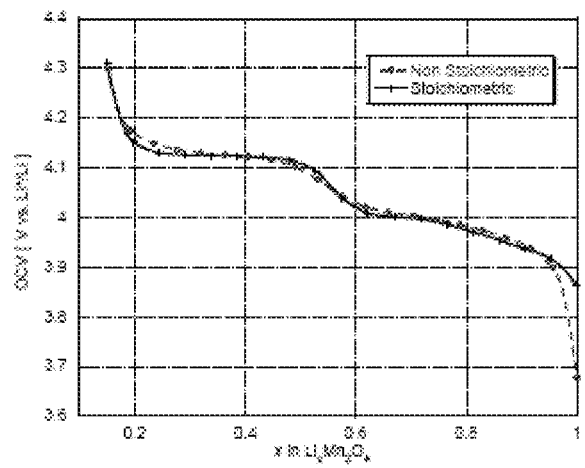
FIGS. 25A and 25B provide plots of experimentally determined open circuit voltages (OCV) and changes in entropy ($\Delta S$) for lithium insertion as a function of composition for a $LiMn_2O_4$ cathode.
Figure 25B:
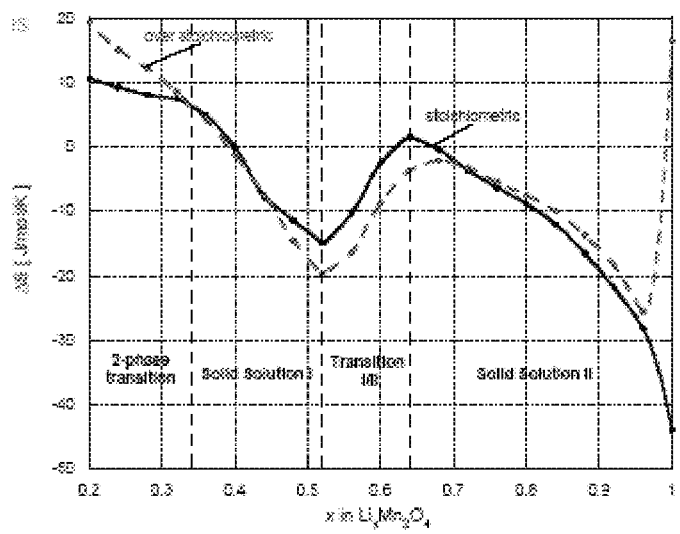

FIGS. 25A and 25B provides plots of experimentally determined open circuit voltages (OCV) and changes in entropy (ΔS) for lithium insertion as a function of composition for a $LiMn_2O_4$ cathode.

Figure 26A:
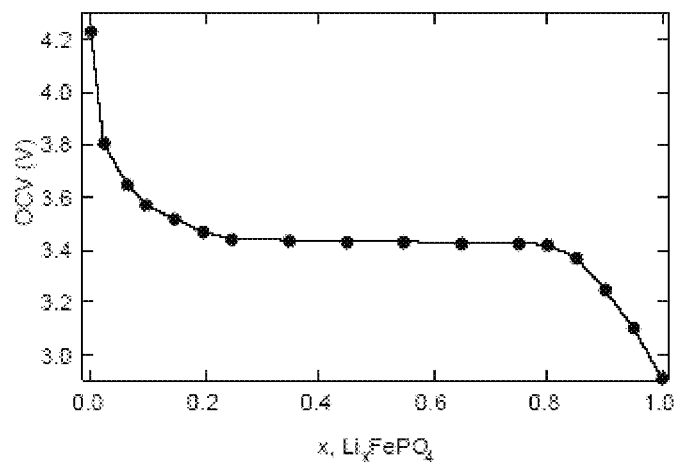
FIGS. 26A and 26B provide plots of experimentally determined open circuit voltages (OCV) and changes in entropy ($\Delta S$) for lithium insertion as a function of composition for a $Li_xFePO_4$ cathode.
Figure 26B:
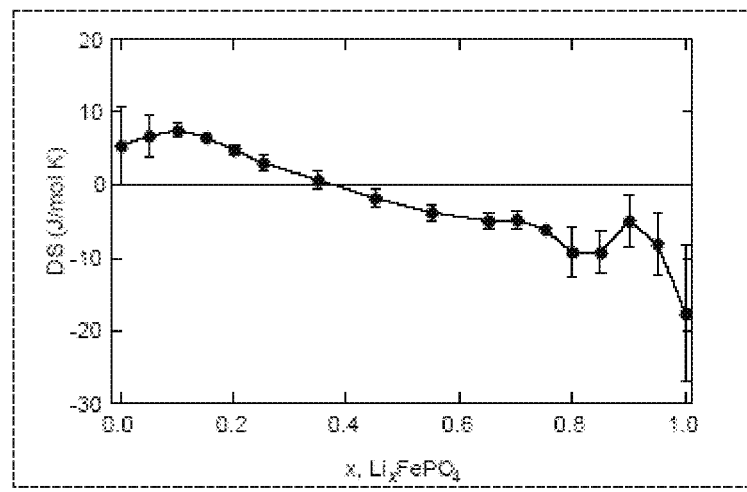

FIGS. 26A and 26B provides plots of experimentally determined open circuit voltages (OCV) and changes in entropy (ΔS) for lithium insertion as a function of composition for a $Li_xFePO_4$ cathode.

Figure 27:
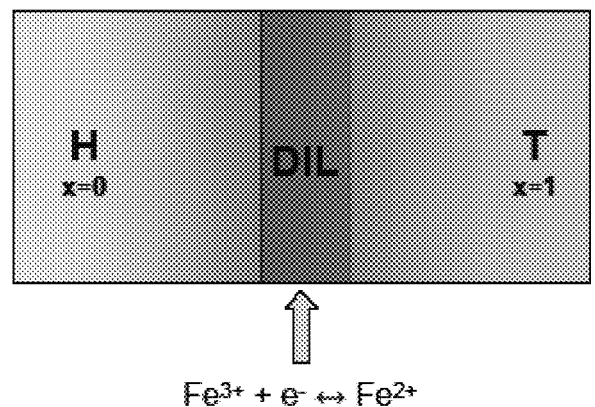
FIG. 27 shows a schematic illustrating the diffuse interphase layer model.

FIG. 27 shows a schematic illustrating a diffuse interphase layer model.

Figure 28:
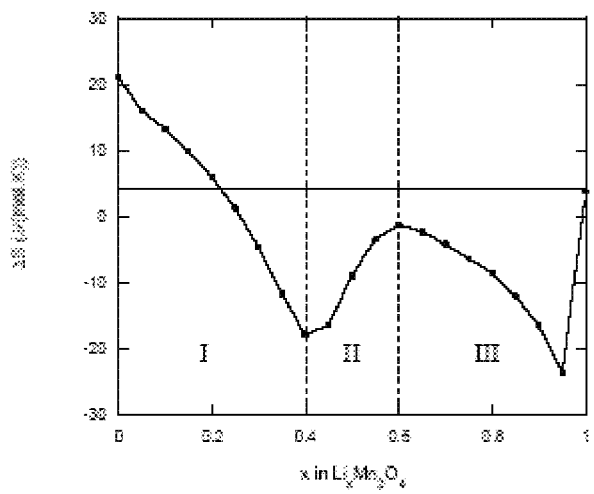
FIG. 28 provides a plot of experimentally changes in entropy ($\Delta S$) for lithium insertion as a function of composition for a $LiMn_2O_4$ cathode.

FIG. 28 provides a plot of experimentally changes in entropy (ΔS) for lithium insertion as a function of composition for a $LiMn_2O_4$ cathode.

Figure 29:
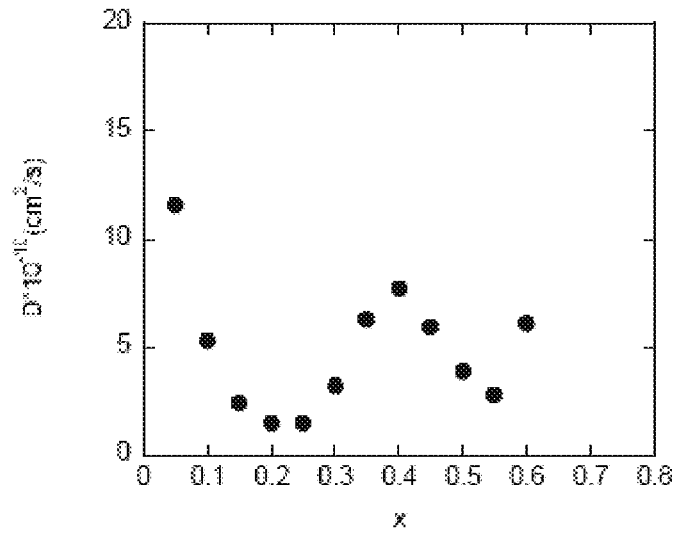
FIG. 29 provides a plot of diffusion coefficient ($D \times 10^{-10}$ $cm^2 s^{-1}$) as a function of composition of for a $LiMn_2O_4$ cathode.

FIG. 29 provides a plot of diffusion coefficient (D×10$^{-10}$ cm$^2$s$^{-1}$) as a function of composition of for a $LiMn_2O_4$ cathode.

Figure 30:
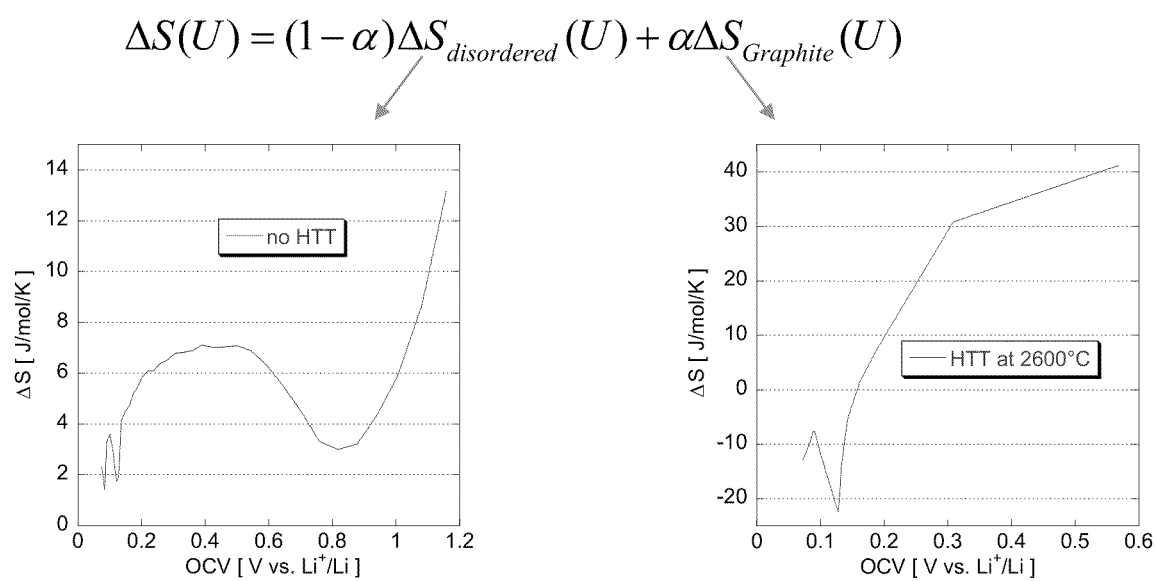
FIG. 30 provides plots of changes in entropy ($\Delta S$) as a function of open circuit voltage for disordered carbon (left plot) and ordered, graphitic carbon (right plot).

FIG. 30 provides plots of changes in entropy (ΔS) as a function of open circuit voltage for disordered carbon (left plot) and ordered, graphitic carbon (right plot). The sample used to generate the plots in FIG. 30 correspond to coke samples that have not been exposed to high temperatures (left side) and coke samples that have been exposed to high temperatures (right side). Coke samples typically containing a mixture of graphitic and disordered carbon materials. As shown by a comparison of the left and right plots in FIG. 30, plots of changes in entropy (ΔS) as a function of open circuit voltage are useful for characterizing the physical properties of electrode materials, for example for characterizing the degree of graphitization. For example, the plots of changes in entropy (ΔS) as a function of open circuit voltage (or composition) may be fit to the equation shown in FIG. 30 to quantitatively determine the extent of graphitization in a coke sample:

$$\Delta S(U) = (1-\alpha)\Delta S_{disordered}(U) + \alpha \Delta S_{graphite}(U)$$

The equation above (and in FIG. 30) corresponds to a linear combination of entropy curves as a function of OCV for disordered and graphitic carbon. In this analysis the parameter α, as shown in the equation in FIG. 30, corresponds to the extent of graphitization in the sample.

Figure 31:
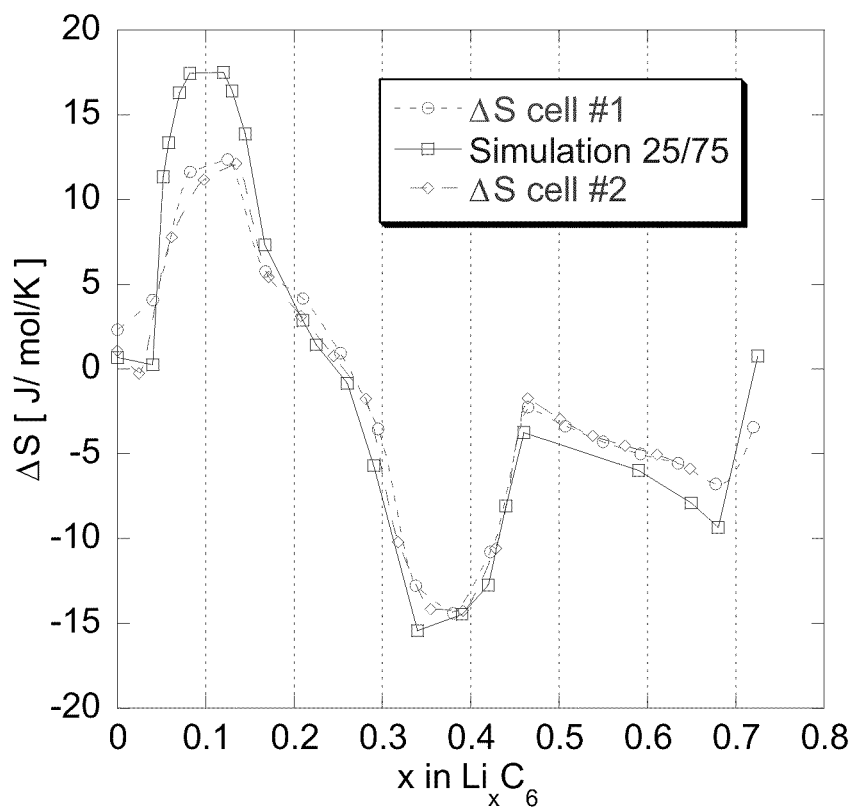
FIG. 31 provides a plot of changes in entropy ($\Delta S$) as a function of open circuit voltage for an electrochemical cell having an electrode made with 25% of coke not exposed to high temperatures and 75% of coke exposed to high temperatures. Also shown in FIG. 31 are the results of simulations.

FIG. 31 provides a plot of changes in entropy (ΔS) as a function of open circuit voltage for an electrochemical cell having an electrode made with 25% of coke not exposed to high temperatures and 75% of coke exposed to high temperatures. Also shown in FIG. 31 are the results of simulations. Entropy plots corresponding to a HTT 1700 degree Celsius coke sample and a HTT 1700 degree Celsius coke sample were fit to the equation above (and shown in FIG. 30) to yields values of α of 21% and 53%, respectively. Based on diffraction data (i.e., the 002 peak position) the extent of graphite in the HTT 1700 degree Celsius coke sample and the HTT 1700 degree Celsius coke sample were determined to be 30% and 77%, respectively.

As shown by FIGS. 30 and 31, a coke heat treated at 1700 C, which can be described as a mixture of a well ordered graphite-like phase and a disordered carbon phase, can be accurately characterized by generating and analyzing a plot of changes in entropy (ΔS) as a function of open circuit voltage. The (ΔS) as a function of open circuit voltage experimental data obtained with this 1700 C sample was simulated as a combination of (i) ΔS(OCV) of graphite (heat treated 2600 C) and (ii) the ΔS(OCV) of a purely disordered carbon (non heat treated coke). This allowed us to accurately determine the degree of graphitization of the carbonaceous material, which is an important characteristic for lithium storage applications.

As shown in this example, the present measuring systems provides a means of determining changes in entropy (ΔS) and enthalphy (ΔS) for reactions involving electrodes of electrochemical cells. Importantly, measured values of ΔS and/or ΔH may be plotted versus electrochemical cell composition or open circuit voltage to provide a means of quantitative characterization of the composition and/or physical state of the electrode material(s). This aspect of the present invention has significant application providing testing and/or quality control information of electrochemical cell materials (e.g. electrode materials), for example after discharge, cycling and/or exposure to overvoltages.

EXAMPLE 3

Thermodynamics of Electrode Materials for Lithium-Ion Batteries

Introduction

As a high energy density storage and conversion system, lithium-ion batteries require the negative electrode material (or the anode) and the positive electrode material (or the cathode) to store and release large amounts of lithium ions during charge and discharge cycles. The lithium exchange between anode and cathode occurs owing to ion transport within the electrolyte. Such an electrode reaction involves changes in the lithium ion composition in each electrode, which in turn induces changes in the electrode material characteristics and properties including the crystal and electronic structure, hence the chemical potential of lithium ions. As a long cycle life is also an important battery requirement, structural changes within each electrode should be as benign as possible to allow for a high lithium ion storage capability and fast electrode kinetics. In fact, from the electrode material point of view, cycle life strongly depends on the initial characteristics of the active material, such as high crystallinity and low level of impurities. Cycle life also relates to the thermodynamics parameters such as the lithium stoichiometry, which relates to the state of charge (SOC) or discharge (SOD), the electrode potential and the kinetics parameters including the charge and discharge current rate (or C-rate) and charge and discharge voltage limits, temperature and pressure.

The total energy stored in and released by a cell during charge and discharge is controlled by the thermodynamics of the active electrodes processes. Basically, electrode reactions at the anode (AN) and cathode (CA) consist of lithium ion and electron exchange with the electrolyte and an external circuit, respectively. Electrode reactions during discharge can schematically be simplified as:

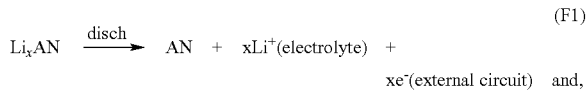
(F1)

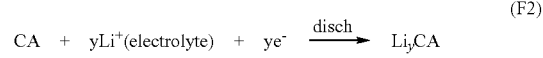
(F2)

Electrode reactions (F1) and (F2) can be investigated using half cells or full cells. In a half-cell usually metallic lithium is used as the counter electrode vs. the working (AN) or (CA) electrode. It also serves as the reference electrode. In a full cell both (AN) and (CA) are used as the working electrodes. In this case, the electrons produced at the cathode are those consumed at the anode, which means x=y, in Eq. (F1) and (F2). This is true provided no side reaction is taking place at either one or both electrodes. Accordingly the full lithium ion cell discharge reaction is given by

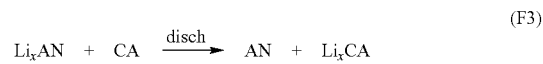
(F3)

At each state of the cell reaction progress, lithium ion and electrons fluxes can be reversed and thermodynamics equilibrium can be reached. Such an equilibrium is defined among others by an open-circuit voltage (OCV), hereafter noted $E_0(x)$. $E_0(x)$ grows from differences in the lithium chemical potential (ionic and electronic) between the anode and the cathode. In fact the cell OCV is a function of composition 'x', pressure 'P' and temperature 'T': $E_0(x, P, T)$. In most cases the pressure is the normal or close enough one. Therefore only composition and temperature may be considered as key parameters.

The free energy of the full cell reaction (F3), ΔG(x,T), relates to $E_0(x,T)$, according to equation F4:

$$\Delta G(x,T) = -nF_E 0(x,T) \quad (F4)$$

where n is the charge number carried by the exchanged ion (here n=1 for $Li_+$) and F is the Faraday constant. Therefore direct measurement of E0(x,T) enables the free energy ΔG(x, T) to be determined and vise-versa.

Moreover the free energy relates to the heat of reactions ΔH and to entropy ΔS following the equation:

$$\Delta G(x,T) = \Delta H(x,T) - T\Delta S(x,T) \quad (F5)$$

The temperature dependence of the heat and the entropy functions are small and can be neglected within a small temperature range. Equation (F5) reduces to:

$$\Delta G_0(x,T) = \Delta H(x) - T\Delta S(x) \quad (F5')$$

Combining Eqs. (F4) and (F5') yields:

$$\Delta S(x) = F\left(\frac{\partial E_0(x,T)}{\partial T}\bigg|_x\right) \quad (F6)$$

$$\Delta H(x) = F\left(-E_0(x,T) + T\frac{\partial E_0(x,T)}{\partial T}\bigg|_x\right) \quad (F7)$$

where the symbol $$\frac{\partial E_0(x,T)}{\partial T}\bigg|_x$$

means the temperature slope of $E_0(x,T)$ should be measured at constant composition x. To this end it is important to avoid side reactions do not take place during the $E_0(x,T)$ measurement that affects composition. Self-discharge is one of the obvious side reactions and can be minimized if $E_0(x,T)$ is measured at temperatures below ambient, when possible. Also the electrochemical cell used for the experimental measurement should be isolated from any electrical current or chemical leaks and the OCV measurement system should have a large internal resistance. Combining Eqns. (F6) and (F7) enables the change in the entropy and enthalpy of the cell reaction to be determined. The total change in entropy and in enthalpy between two electrode compositions $x_1$ and $x_2$, $\overline{\Delta S}|_{x_1}^{x_2}$ and $\overline{\Delta H}|_{x_1}^{x_2}$, respectively can be obtained from ΔS(x) and ΔH(x) curves integration:

$$\overline{\Delta S}|_{x_1}^{x_2} = F\left(\int_{x_1}^{x_2} \frac{\partial E_0(x,T)}{\partial T}\bigg|_x dx\right) \quad (F8)$$

$$\overline{\Delta H}|_{x_1}^{x_2} = F\int_{x_1}^{x_2}\left(-E_0(x,T) + T\frac{\partial E_0(x,T)}{\partial T}\bigg|_x dx\right) \quad (F9)$$

Normalizing the electrode composition to the full compositional range $\Delta x_{max}$ of reversible electrode processes ($y=x/\Delta x_{max}$, $0<y<1$) gives the total changes in entropy and enthalpy on a full cell operation range:

$$\overline{\Delta S}|_0^1 = F\left(\int_0^1 \frac{\partial E_0(y,T)}{\partial T}\bigg|_y dy\right) \quad (F8')$$

$$\overline{\Delta H}|_0^1 = F\int_0^1\left(-E_0(y,T) + T\frac{\partial E_0(y,T)}{\partial T}\bigg|_y dy\right) \quad (F9')$$

The amount of heat a cell is susceptible to release is an important data for predicting their thermal behavior and assessing their safety. In fact undesirable phenomena within the cell including thermal runaway and catching fire are trigged by the heat generated owing to one or both electrode(s) reactions. To tackle this sensitive issue, extensive studies have been devoted to the thermal behavior of various lithium ion cells aimed at understanding the basic processes involved in the heat generation and to some extend controlling their kinetics. Thermodynamics studies on full cells have also been carried out to determine the entropy and/or the enthalpy component of free energy. Computer modeling and simulation have been extensively used and proved very helpful in understanding and predicting the thermal behavior of lithium ion cells. Other theoretical studies based on first principles methods are being increasingly applied in the lithium ion batteries field, in particular for computing thermodynamic functions associated with lithiation and delithiation processes. Specific thermodynamics studies on anodes, cathodes and electrolytes for lithium ion batteries have been the focus of recent studies to assign contributions of each of the active materials to the cell thermal behavior. It has been recognized that composition induced phase transformations occurring in electrode materials bear a thermodynamics signature, particularly in the OCV profile curve. Cation ordering and cation mixing are among typical phenomena in lithium transition metal oxides based cathodes materials affecting their thermodynamics.

The recent emergence of nanostructure materials as promising alternative materials for anode and cathode application has also generated interest in the thermodynamics aspects these materials. It has been theorized the particle size may be considered as an independent parameter in the thermodynamics as are composition and temperature. In fact, when the particle size falls to the nanometer scale, many of the electrode material characteristics and properties become increasingly governed by the surface to the bulk atomic ratio and by the spatial extent of interphase domains and grain boundaries.

Although the temperature dependence of OCV $$\frac{\partial E_0(x,T)}{\partial T}\bigg|_x$$

(occasionally referred to as the entropy term) was measured on electrode materials and reported in the literature, there was no attempt to correlate the results with structure defects in the starting material and to find the origin and the scale of the 'entropy term' changes with the electrode composition, cycle and thermal history.

The study we carried out for the last five years on the thermodynamics of anode and cathode materials was driven by the need of filling the gap in the fundamental understanding of electrode processes behind changes in the entropy and the enthalpy state functions in the course of lithium intercalation and de-intercalation. We also theorized that thermodynamics studies can be used as a new tool in electrode materials characterization complementary to conventional physical-chemical techniques such as those based on matter-wave scattering including diffraction (electron, neutron and x-ray) and physical spectrometry (XAS, NMR, FT-IR, Raman, EPR, XPS, EELS, etc.). Most of theses techniques require heavy and expensive equipment and can be destructive. This is in contrast to the method we introduce here. We show that thermodynamics data can be acquired quite conveniently using an electrochemical cell and a non destructive measurement technique. The new method applies to half cells together with full cells with focus on electrode reaction thermodynamics of a specific material for anode or cathode application or on a full system consisting of two working electrodes. This example will treat only on the entropy function because it reveals fine details on the lithiation/delithiation processes, in particular on the phase transitions that take place in the electrode material. The enthalpy function is complementary to the entropy one and relates to the heat generation within the cell, an important parameter in the cell's cycle life and thermal behavior. This materials covered in this study are carbonaceous anode materials heat treated at different temperatures and transition metal based cathode materials such as $LiCoO_2$, $LiMn_2O_4$. Other cathode materials such as $Li(MnCoNi)_{1/3}O_2$ and $LiFePO_4$ materials were also investigated in our group, but will not be discussed here, however.

Experimental

A. The ETMS

Our early laboratory set up for the $E_0(x,T)$ measurements was mostly manual and required real time control of the cell temperature and the electrode composition. We then set up an automatic laboratory system that we called the "ETMS" (electrochemical thermodynamics measurement system), of which a schematic diagram is displayed in FIG. 1.

The ETMS comprises the following functional components:

i. A battery cycling system which applies changes in the electrode composition 'x' under either a galvanostatic mode (constant current) or a potentiostatic mode (voltage steps). As a constant or a variable current i(t) passes across the cell, the corresponding change in the electrode composition Δx is obtained by the Faraday Law equation:

$$\Delta x = \frac{1}{mQ_{th}} \int_0^t i(t)dt. \quad (F10)$$

In Eqn. F10, m is the total mass (usually in g) of the active material in the electrode and $Q_{th}$ is the specific (mass) capacity (usually in mAh/g) of the electrode active material. The latter is given by:

$$Q_{th} = nF/3.6M \quad (F10')$$

In Eqn. (10') n is the number of electron per electrode mole, F is the Faraday constant (in C), M is the molar mass of the anode or the cathode material in Eqns. F1 and F2 (in g) and 3.6 is a unit conversion constant Accordingly, in Eqn. F10, i(t) should be expressed in mA and time t in hours.

In fact, in most electrode materials Qth is achieved experimentally such as by very low charge and discharge rate, within a voltage window where full reversible electrode processes take place with minimal side relations such as electrolyte decomposition and irreversible electrode transformations:

ii. A temperature controlled cell holder: Peltier plaques are used to set the temperature in the cell holder. The temperature is varied stepwise with ΔT of about 5° C. increments between ambient and 0° C. Cooling the cells from the ambient temperatures was preferred to heating them in order to minimize the self-discharge phenomenon, which is thermally activated and may affect the electrode composition.

iii. A high accuracy OCV measurement system having a high internal resistance to avoid discharging the cell in the course of OCV vs. T measurement. Because the electrode equilibration at set temperature may require a long period of rest time in practice it is convenient to set an upper limit to the absolute value of the OCV' time-dependence $$\left( \left| \frac{\partial E_0(x,T)}{\partial T} \right|_{x,T} \right)$$

below about 0.1 to 1 mV/hr for ending the OCV measurement and trigging the next step. An OCV drift may be observed during measurement due to the electronic circuit fluctuations or to a small self-discharge. Such a drift is easily erased by the program.

iv. A computer controlled power system, which sets the cell temperature by adjusting the amount of electric power in the Peltier plaques.

v. A computer system which runs the program that monitors the battery cycler and the electric power in the Peltier plaques. It also acquires and processes the data and converts them to thermodynamics functions and graphic presentation according to Eqns. F6 and F7.

Figure 32:
FIG. 32 shows a photograph of the ETMS-1000 system developed for automatic thermodynamics data acquisition.

Recently Viaspace, Inc. (Pasadena, Calif.) has developed and commercialized a fully integrated ETMS (called BA-1000) shown in FIG. 32. External cell holders with temperature control were built-up for both coin cells and cylindrical cells, including the 18650 size. All thermodynamics data presented here were performed on our in-house built ETMS except for the last section on the effect of electrode cycling where the BA-1000 was used.

B. Electrochemical Cells: Construction and Formation Cycles

In our study we used 2016 coin-cells for running thermodynamics tests because of their convenience and easy preparation in an argon glove box. At least two cells were ran for each electrode material. Our half-cells use metallic lithium as the counter and the reference electrode, a microporous polymer separator wet with the electrolyte and a working electrode.

A typical working electrode comprises a mixture of the following components:

i. An active electrode material such as a carbonaceous material for anode studies or a lithium transition metal oxide ($LiCoO_2$, $LiMn_2O_4$) for cathode materials studies;

ii. A conductive additive usually consisting of acetylene black, natural or synthetic graphite or carbon nanofibers; and iii. A polymer binder such as polyvinylidene fluoride (PVDF).

The electrode mixture is thoughtfully stirred in an organic solvent then the slurry is spread on a polytetraethylene fluoride (Teflon) plate. The so obtained uniformly thick film of about 100 μm is dried in air then in vacuum for several hours. Discs of ~17 mm on diameter are cut from the film, were further dried in vacuum at 80° C., overnight and introduced into the dry box for final cells assembly.

The electrolyte composition is $1M\text{-}LiPF_6$ solution in an equal volume mixture of ethylene carbonate (EC) and dimethyl carbonate (DMC) for anode materials studies and $1M\text{-}LiClO_4$ solution in propylene carbonate (PC) for the cathode ones. Coin cells are then assembled in dry argon atmosphere and transferred into the cell holder of ETMS for immediate electrochemical and thermal investigations. The cells are first cycled under C/10 charge and discharge rate for a few cycles until a stable capacity is reached. The cells are then either fully charged (delithiated) to 1.5 V for carbon anodes or fully discharge (lithiated) to 3V for cathodes studies. At 1.5V the lithium content in the carbon anode is considered close to zero (Li0C6) and at 3V the lithium content in the cathode is considered close to unity ($Li_1CoO_2$, $Li_1Mn_2O_4$). This sets the initial state of discharge of the cells.

C. Thermodynamics Data Acquisition

The cells are first either discharged (anode) or charged (cathode) typically under C/100 to C/20 rate for a period of time long enough to achieve a fixed increment in the lithium composition (usually in the order of Δx=0.05). The cell is then rested until acceptable constant OCV is reached at the ambient temperatures. The temperature is then decreased steps wise (ΔT of about 5° C./step) until a new stable OCV is reached. When the data acquisition at the lowest set temperature is achieved, the cell is then brought to the ambient temperatures and a new composition increment Δx is applied. This protocol is repeated until a target lowest (anode) or highest (cathode) voltage is reached, then the current is reversed to incrementally vary the electrode composition the opposite way.

This protocol allows the thermodynamics data to be acquired during a full charge/discharge cycle and see whether a hysteresis appeared.

Results

A. Carbonaceous Anode Materials

We carried out a systematic study on the effects of the heat treatment temperature (HTT) of a carbon material precursor on the thermodynamics of lithiation and delithiation. Carbonaceous samples were provided courtesy of Superior Graphite, Co. using the same petroleum pre-coke precursor HTT below 500° C. The pre-coke was further heated to different temperatures between 700 and 2600° C.

Figure 5:
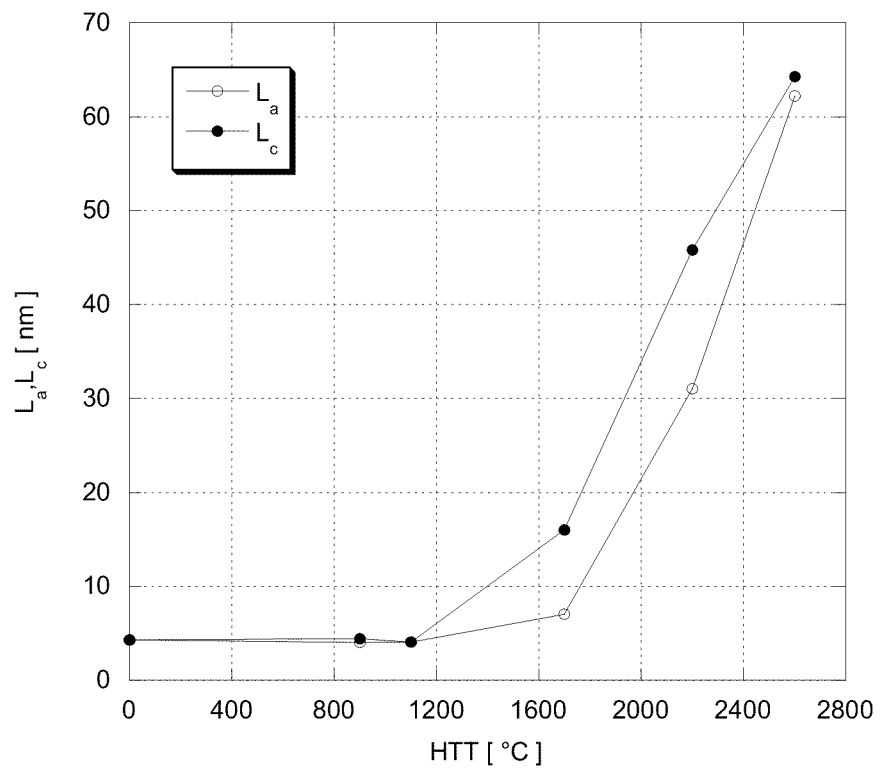
FIG. 5. Crystal coherence lengths as a function of heat treatment temperature based on Raman spectroscopy, $L_a$, and $L_c$ from XRD patterns.
Figure 33:
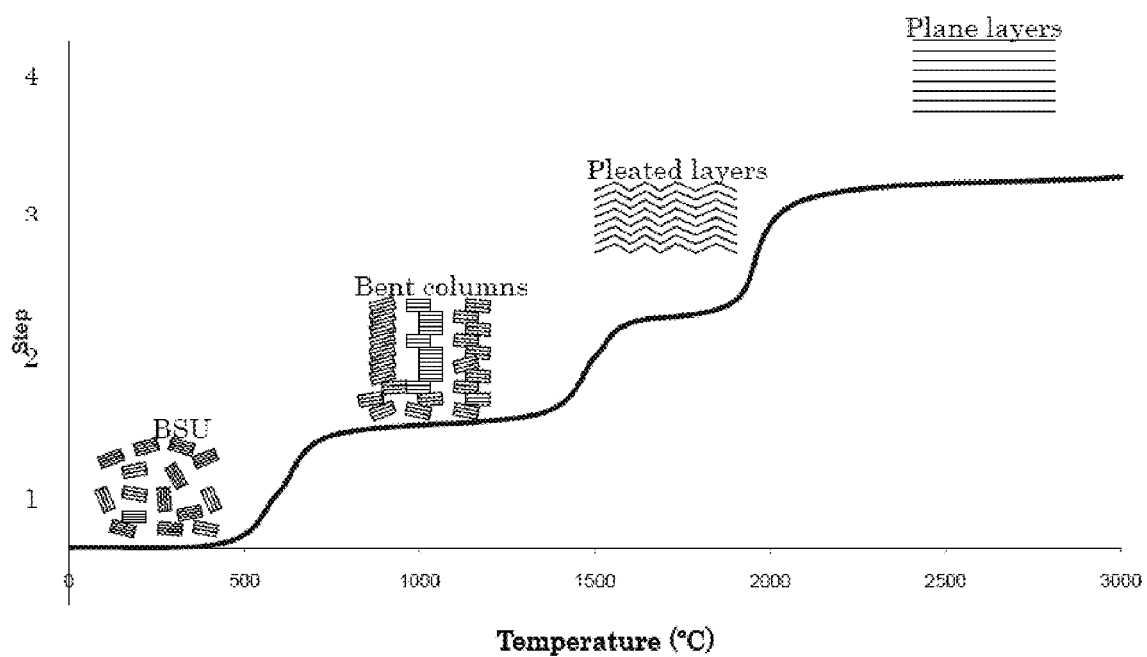
FIG. 33 provides a plot showing structural evolution of a graphitic carbon as a function of temperature. BSU refers to basic structural units.

FIG. 3 shows the X-ray diffraction patterns of cokes heated treated either below 500° C. (no HTT) or HTT between 900° C. and 2600° C. A sketch of the evolution of the carbonaceous structure upon heat treatment is shown in FIG. 33. Using the Scherrer equation, the crystal size along the c-axis ($L_c$) and the a-axis ($L_a$) was determined. $L_c$ and $L_a$ are good indicators of the degree of graphitization G (3D ordering) of the carbonaceous material. The $L_c$ and $L_a$ curves profiles depicted in FIG. 5 are typical of graphitizing (soft) carbons and are in good agreement with the literature. Table-F1 summarizes the characteristic of the coke materials as derived from X-ray diffraction analysis. Cokes HTT≦1700° C. have two diffraction peaks in the 002 area: a sharp peak corresponding to a graphitic phase and a broader peak corresponding to highly disordered carbons. The Table gives their respective degree of graphitization G together with $L_c$ values.

Raman scattering is also a powerful tool for characterizing the rate of carbonization and graphitization process in soft carbons. Typically two Raman active modes are observed in carbonaceous materials. The first one is the G-mode at about 1590 cm$^{-1}$ that relates to vibrational modes within well ordered poly-aromatic carbon hexagons in the graphene layer. The second active mode is the D-mode at about 1360 cm$^{-1}$ and is usually associated with lattice modes of carbons present at the layers edges or in smaller poly-aromatic domains. In disordered carbons, the D-mode has stronger intensity $I_D$ relative to the G-mode ($I_G$). In fact the $I_G/I_D$ intensity ratio is used as a metrics for the degree of graphitization, in similar way than $L_c$ and $L_a$ obtained from x-ray diffraction analysis.

FIG. 4 shows the evolutions of the Raman spectra with the HTT. The results are in good agreement with the literature that the D-mode intensity decreases and the G-mode intensity increases with the HTT.

As shown in the next section, we found the thermodynamics of the lithiation reaction of carbonaceous anodes materials strongly depends on their degree of graphitization.

a. Pre-coke (HTT<500 C)

Lithium intercalation into carbonaceous materials is usually schematized as:

$$6C + xLi^+ + xe^- \leftrightarrow Li_xC_6, \quad 0 \leq x \leq 1 \tag{F11}$$

Figure 34:
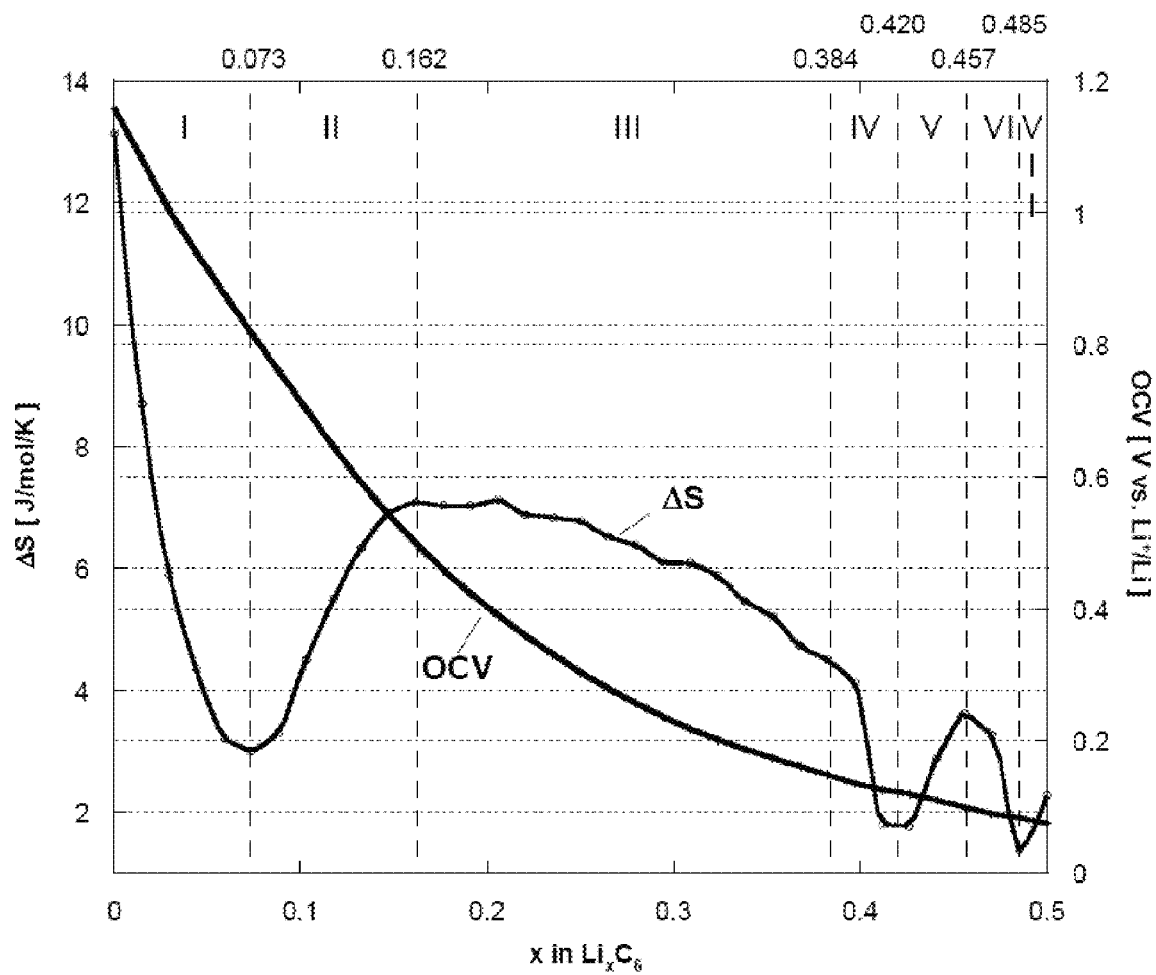
FIG. 34 provides a plot showing entropy of lithium intercalation into coke with no HTT and corresponding OCV during charge.

FIG. 34 shows the $E_0(x)$ and the $\Delta S(x)$ curves of the pre-coke heat treated below 500° C. While the OCV curve monotonously decreased with x, a result typical of disordered carbons, the $\Delta S(x)$ shows more pronounced changes in the slope value and sign indicative of different steps in the lithiation mechanism. The $\Delta S(x)$ curve in FIG. 34 can be divided into seven different composition Areas:

Area-I: (0<x<0.073) where a sharp decrease in entropy is observed until a minimum is reached at x~0.073;

Area-II: (0.073<x<0.162) where $\Delta S(x)$ increases;

Area-III: (0.162<x<0.384) where the entropy decreased almost linearly until x=0.384;

Area-IV: (0.384<x<0.420) where the $\Delta S(x)$ slope becomes more negative and then makes a minimum at x~0.420;

Area-V: (0.420<x<0.457) where $\Delta S(x)$ changes in sign and goes through a maximum at x=0.457;

Area-VI: (0.457<x<0.485) where $\Delta S(x)$ makes another minimum at x~0.48; and finally, Area-VII: (0.485<x<0.50) where $\Delta S$ increases again.

Variations in the entropy value and slope at relatively well defined compositions are the signature of dramatic changes in the energetics of lithiation. In fact lithium ions progressively populate carbon sites and domains upon their energy; more energetically favored sites are first populated followed by less energetic ones. This site segregation induces phase transitions such from insulator to semi-conductor and from semi-conductor to metallic. Lithiation may also induce crystallographic reorganization within specific carbon domains. In such a case a sharp decrease in entropy in Area-I may be associated with lithium cathodic deposition on carbon sites present at the surfaces of disordered domains. Most likely lithium atoms arrange on the surface to form a short range order, which induces a sharp decrease in entropy. Area-II appears as a smooth transition Area-between Areas-I and Area-III. In the later the entropy decreases uniformly in a composition range Δx of about 0.25, which accounts for half of the total lithium uptake in the electrode. Where Area-I relates to carbon atoms present on the grains surface, Area-III should be associated with lithium intercalation into the bulk of disordered carbons domains. The uniform slope suggests a solid solution behavior in which disordered domains are progressively populated with lithium. As these domains become saturated with lithium, a sharp decrease in entropy is observed as we enter Area-IV. The later should be associated with lithium intercalation is smaller and better crystallized domains close to graphite. Additional lithiation leads to Areas-VI and VII which may relate to staging phenomena in the graphitic domains. Stage number in graphite intercalation compounds refers to the number of graphene layers between adjacent intercalate layers. For instance stage II lithium compound has a stacking sequence of LiGGLiGG. Accordingly Areas-II and IV should be associated with transition areas during the lithiation of different carbonaceous domains. The coexistence of crystallographically disordered and ordered carbon domains in the pre-coke is evidenced by X-ray diffraction and Raman scattering measurements. In the pre-coke with HTT<500° C. a sharp 002 peak of graphite is superposed to a broader 002 peak of disordered carbon in the XRD pattern of FIG. 3 and a relatively strong G-mode is observed in the corresponding Raman spectra in FIG. 4.

Despite our proposed mechanism of entropy changes in the pre-coke based anode needs to be supported by further independent characterizations of the corresponding $Li_xC_6$ materials, it is clear that the entropy curve shows well defined steps in the electrode process, a feature absent in the OCV curve. X-ray diffraction and Raman studies do not give direct evidence of multi-domains presence in the pre-coke. However, mathematical simulations of the XRD and Raman results in the light of the entropy ones may lead to a similar conclusion that is the pre-coke material consists of multi carbon domains structure, including highly active surface states.

Noteworthy is the $\Delta S(x)$ results allow for a direct titration of the relative amounts of different carbon domains owing to the energetics of interaction with lithium. In fact the high resolution achieved in the lithium composition where transitions occur can hardly be matched by X-ray diffraction, Raman or any single physical spectrometry technique.

b. Cokes HTT 900° C. to 1700° C.

As shown in FIG. 7 a similar "seven domains" feature described in the previous section is observed in cokes HTT at 900° C. and 1100° C. with, however, slight differences is in the composition thresholds of successive transitions. This result correlates well with the X-ray and Raman results which showed no significant changes in the diffraction patterns or Raman spectra in the 900-1100° C. temperature range.

Figure 35:
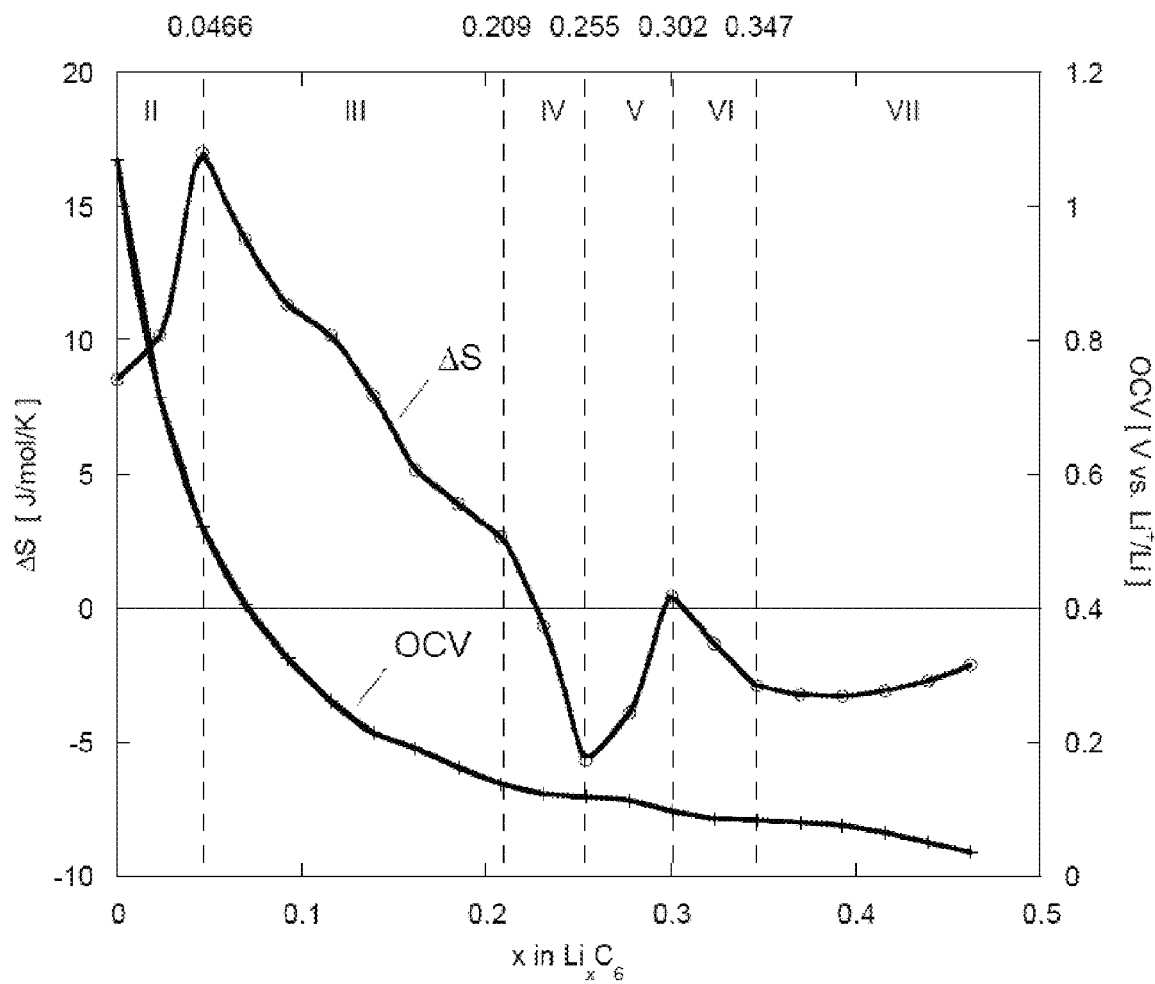
FIG. 35 provides a plot showing entropy of lithiation and OCV of a coke HTT 1700° C. during discharge.

In contrast with the coke HTT 900° C. and 1100° C., sizable change in the entropy profile is observed in the coke HTT at 1700° C. as depicted in FIG. 35. Here again the OCV curve shows a monotonous decay similar to the one observed in cokes HTT at lower temperatures. However, the entropy curve features well defined maxima and minima and, surprisingly increased in the early stage of lithiation unlike in the previous cokes where it sharply decreased. This suggests domain I associated with surface states has disappeared. Such a disappearance correlates with a decrease in the total lithium uptake, which translates to a lower discharge capacity ($\Delta x_{max}$~0.55 at HTT=1100° C. vs. $\Delta x_{max}$~0.45 at HTT=1700° C.). Also at 1700° C., $L_a$ and $L_c$ feature a sharp increase as result of enhanced crystal ordering of the carbon structure as sketched in FIG. 33. Also, smoother entropy in Area-V is indicative of larger graphitic domains in the coke HTT 1700° C.

c. Cokes HTT 2200° C. and 2600° C.

Figure 36:
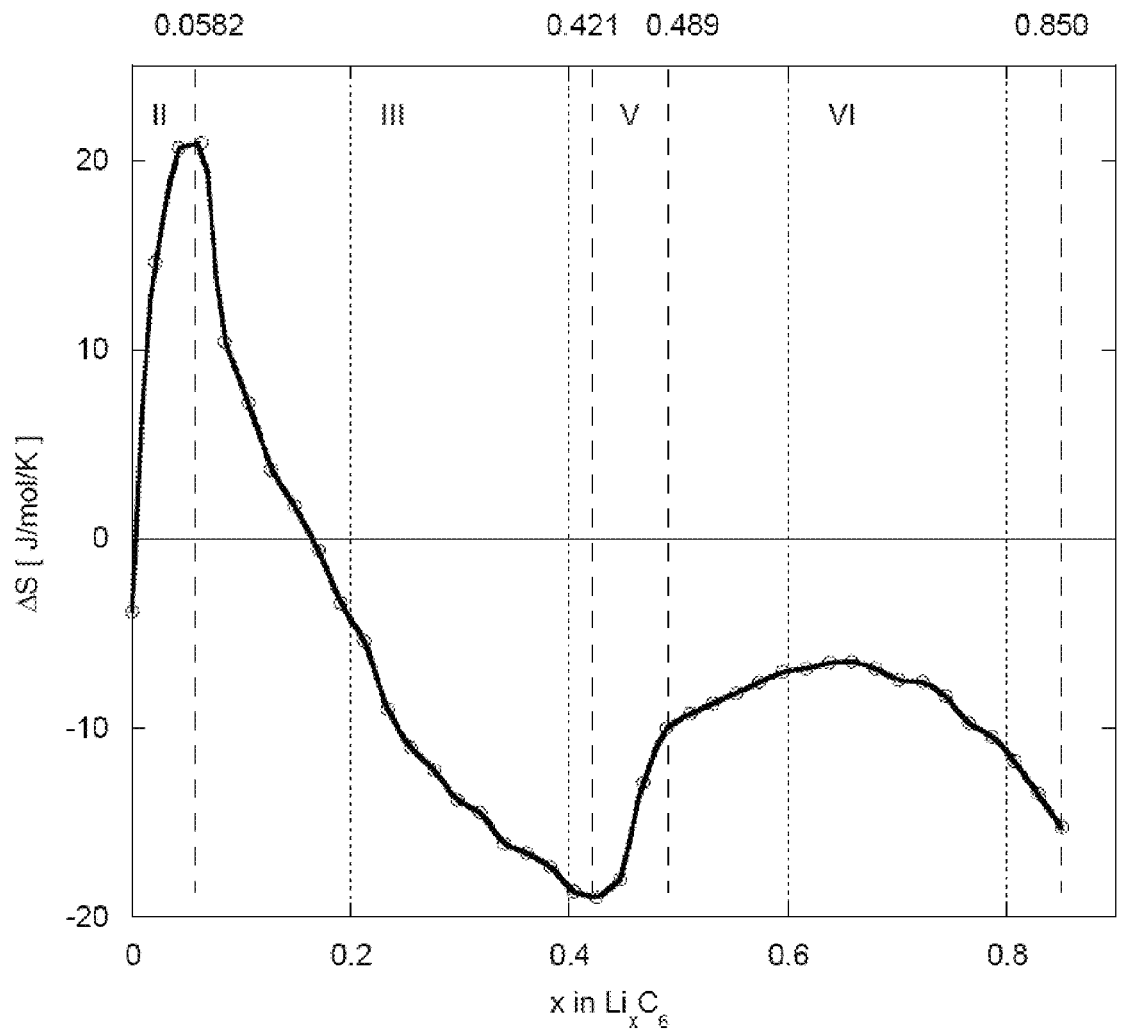
FIG. 36 provides a plot showing entropy of lithiation during discharge of a coke HTT 2200° C.

The entropy curve of the coke HTT 2200° C. is shown in FIG. 36. It resembles that of FIG. 35 of the coke HTT 1700° C. as Area-II appeared with sharp increase in entropy up to x=0.0582. Areas III and IV are less distinguishable (here noted Area III only) and extend to x=0.421 to cover $\Delta x$=0.3628 range. Transition Area-V covers $\Delta x$=0.489−0.421=0.068, then Area-VI with a smooth dome shape covers $\Delta x$=0.361 up to $\Delta x$=0.850. It is interesting to note the extend of Areas III and VI are in the same order of magnitude of $\Delta x$~0.36, which supports the staging model that is Area III is where stage II forms from pure graphite and Area VI is where stage II converts to stage I.

A sharp transition in Area-IV is indicative of stage II to stage I phase transition as will be showed in the next section. It is interesting to note the lithium composition covered in Areas-III and V is in the same order of magnitude ($\Delta x$~0.2), which supports the staging nature of the phase transition. In fact an equal amount of lithium is needed to make stage II from pure graphite and stage I from stage II. However, due to the persistence of non-graphitic domains in the coke HTT 2200° C., the amount of lithium involved in the stage transitions is lower than in purely graphitic material as will be discussed in the next sections ($\Delta x$~0.2 vs. 0.5. respectively).

A dramatic change in the entropy profile is observed in the coke HTT 2600° C. compared to the previous cokes materials. In addition to Area-I, Area-II vanished at the expense of Area-III (see FIG. 37), the slope of entropy in Areas-IV and V is smoother. The lithium intercalation capacity increased to $\Delta x_{max}$~0.72. The slope of the entropy curve in Area-III is smoother indicating a better well defined transition in the solid solution domain. This may be the signature of stage formation in the graphitic domains.

d. Natural Graphite

Figure 37:
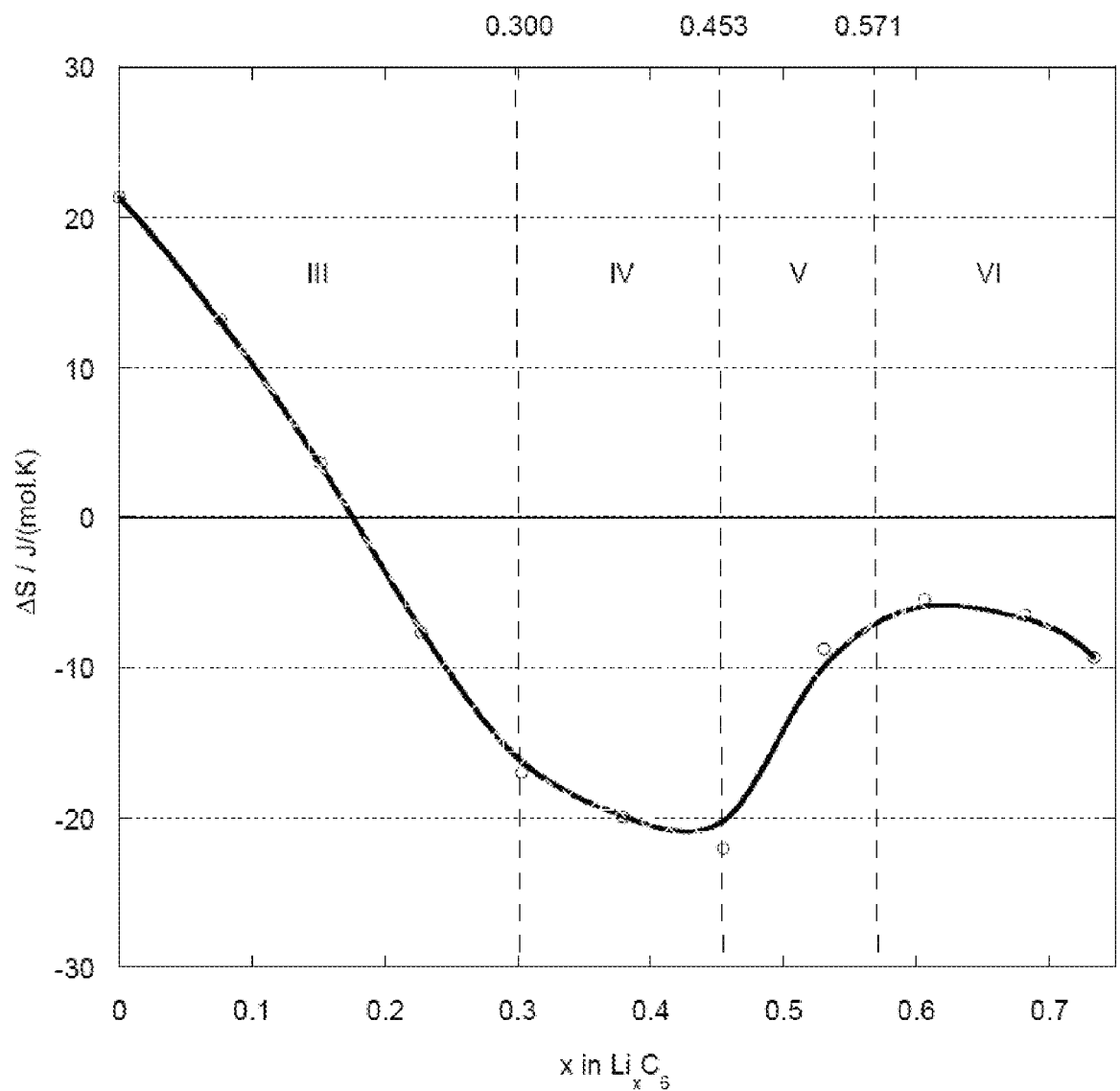
FIG. 37 provides a plot showing entropy of lithiation during discharge for the coke material HTT 2200° C.

The OCV curve in FIG. 37 of natural graphite shows six well separated composition domains corresponding to the step-by-step ordering of the lithium ions into the graphite structure. The sharp decrease in OCV and entropy at the early stages of the lithiation process in Area I corresponds to the solid solution behavior. Specifically it corresponds to the formation of so called dilute stage I intercalation compound, in which lithium ions randomly occupy the Van der Waals space between the graphene layers (i.e. the gas lattice model). Dilute stage I occurs in a narrow composition range of $\Delta x$~0.0495.

With increased in-plane lithium concentration the alkali cations tend to condense to form the so-called liquid phase up to x=0.125 of Area II. This is followed by a solid solution behavior in the 0.125<x<0.25 composition range, that translates to 3D ordering as higher intercalation stages VIII, IV and III form (Area III). Noteworthy is a discrepancy in the upper composition thresholds at which staging take place between the OCV (x=0.19) and the entropy (x=0.25) curves. This highlights differences in sensitivity between the entropy and the free energy functions, the later being constant between two stages whereas the former can vary due to configurational entropy of the lithium within the interstitial sites.

A slightly sloping OCV and entropy curves are found in Area V usually associated to transition between liquid (disordered) stage II to solid (ordered) Stage II. According to the entropy curve this area covers a composition range $Li_{0.25}C_6$ (or $LiC_{24}$) to $Li_{0.5}C_6$ (or $LiC_{12}$). Liquid Stage II has so far been associated to $Li_{0.33}C_6$ ($LiC_{18}$) not to $Li_{0.25}C_6$. Both OCV and entropy curves don't show any anomaly at x=0.33, which question the $LiC_{18}$ composition for liquid Stage II. A sloping OCV and entropy curves suggests the Stage II conversion follows a solid solution behavior rather than a two-phase one.

Figure 38A:
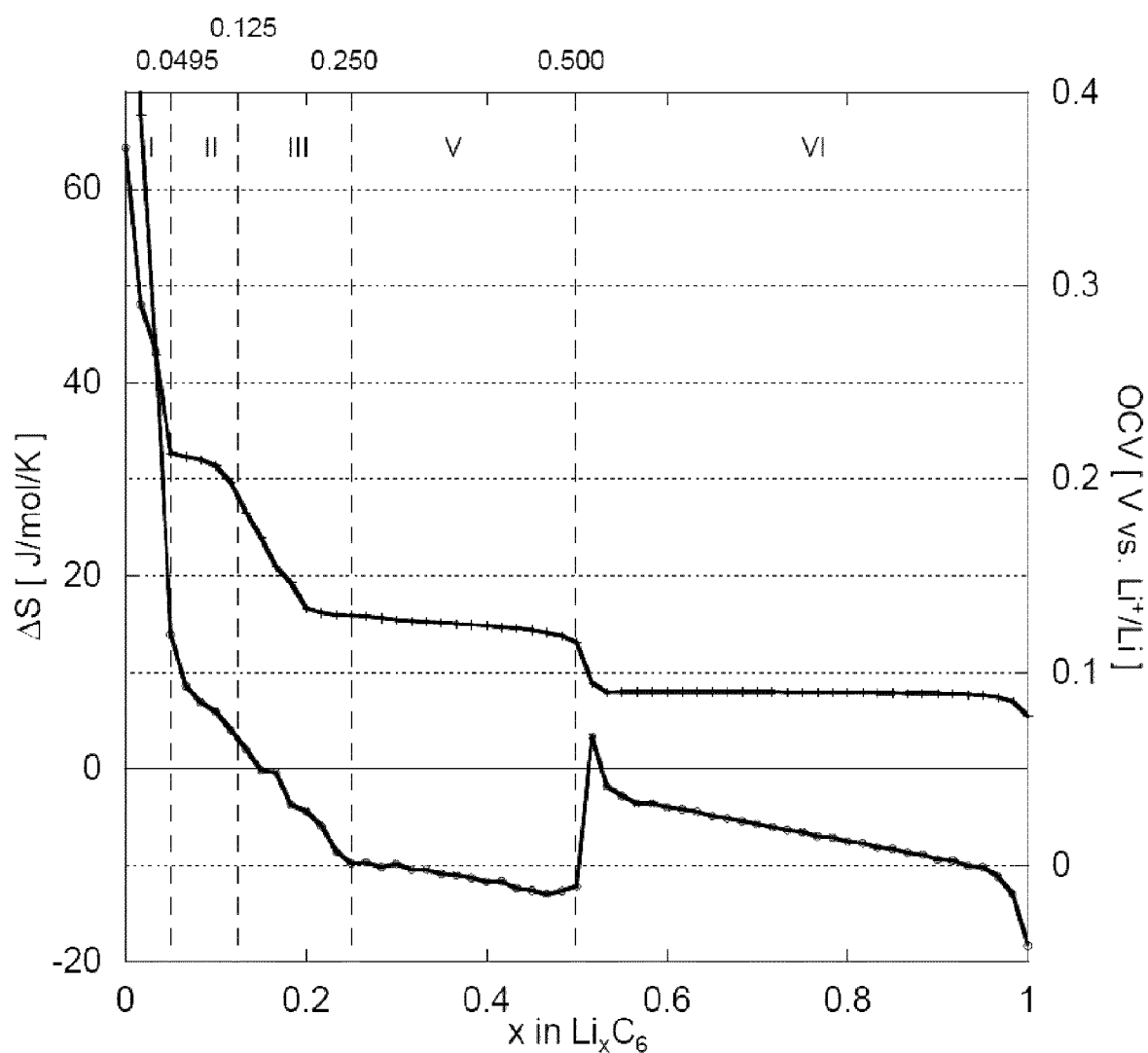
FIG. 38a provides a plot showing entropy and OCV of lithiation during discharge of a natural graphite.
Figure 38B:
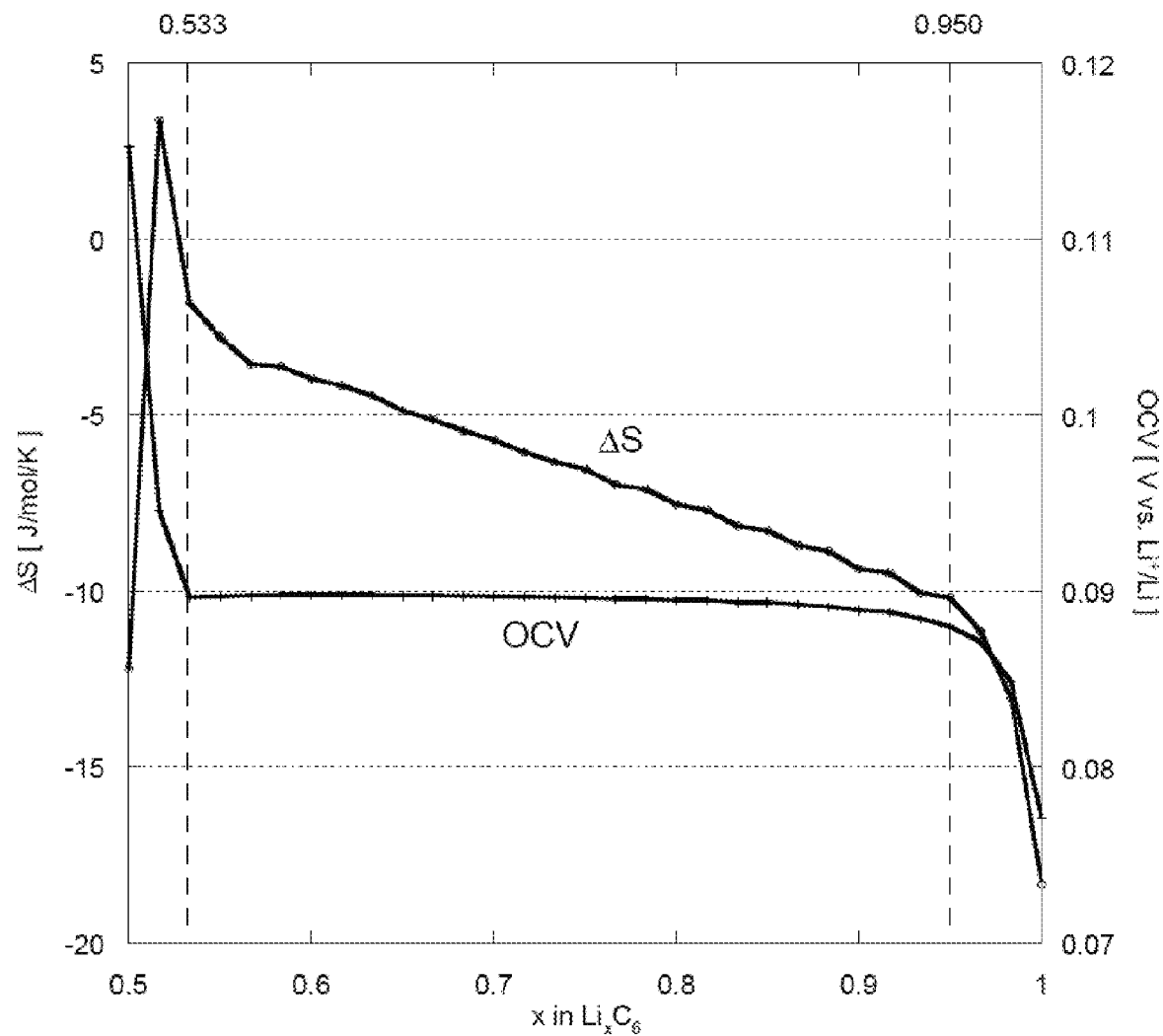
FIG. 38b provides a plot showing partial entropy and OCV curves of lithiation of natural graphite, 0.5<x<1.

A sharp increase in entropy occurs at x~0.5 (FIG. 38a and magnified FIG. 38b), which correlates very well with the change in the voltage profile as the stage II to stage I phase transition takes place. A very interesting difference, however, is a sloping entropy curve in the 0.55<x<0.88 composition range, whereas the OCV curve is much flatter. Constant OCV is usually associated to a two-phase system behavior (here $Li_{0.5}C_6$ and $Li_1C_6$, stage II and Stage I, respectively). However, the beginning and the end of the stage transition (0.5<x<0.55 and 0.88<x<1, respectively) show rather a single phase behavior with slopping OCV. Accordingly the two-phase model applies only in the 0.55<x<0.88 composition range, not in the full 0.5<x<1 range as commonly accepted in the literature. In a recent coupled experimental and theoretical study we found that intermediary phases form in the 0.5<x<1 composition range. These new phases are thermodynamically more favored compared to a mixture of pure stage II and stage I compounds.

d. Entropy and Degree of Graphitization

Since the entropy function describes much better the thermodynamics behavior of a carbonaceous material than does the free energy function (or the OCV) and distinguishes very well materials according to their rate of crystallization (or graphitization degree G in the case of soft carbons), it is tempting to inversely use the entropy function as a tool to determine G. In fact G is usually calculated from x-ray diffraction (XRD) using an empiric equation:

$$G=(3.461-d_{002})/(3.461-3.352) \tag{F12}$$

where $d_{002}$ is the interlayer spacing (in Å) of the carbonaceous material. The values 3.461 Å and 3.352 Å being the ones of $d_{002}$ in fully disordered (G=0) and highly graphitized carbons (G=1), respectively.

Our thermodynamics approach for determining G is based in the assumption that a carbonaceous material having an average degree of graphitization G consists of a mixture of interconnected domains of highly graphitized carbon in the relative amount of G and disordered carbons in the amount of 1−G. When used as an electrode material for lithium intercalation, at any composition 'x' in $Li_xC_6$, lithium will be distributed between ordered and disordered domains. This distribution is not homogeneous, however, due to differences in intercalation sites energy in both types of carbon domains. As electron conductivity is high in carbonaceous materials, the $Li_xC_6$ electrode should be equipotential at any composition x at equilibrium. Therefore, at $E_0(x)$ the total entropy variation $\Delta S_T(E_0)$ is the sum of partial entropies coming from the graphitic domains $\Delta S_G(E_0)$ and from disordered domains $\Delta S_D(E_0)$, weighted by their molar fraction G and 1−G respectively:

$$\Delta S_T(E_0) = G\Delta S_G(E_0) + (1-G)\Delta S_D(E_0) \tag{F13}$$

Figure 39A:
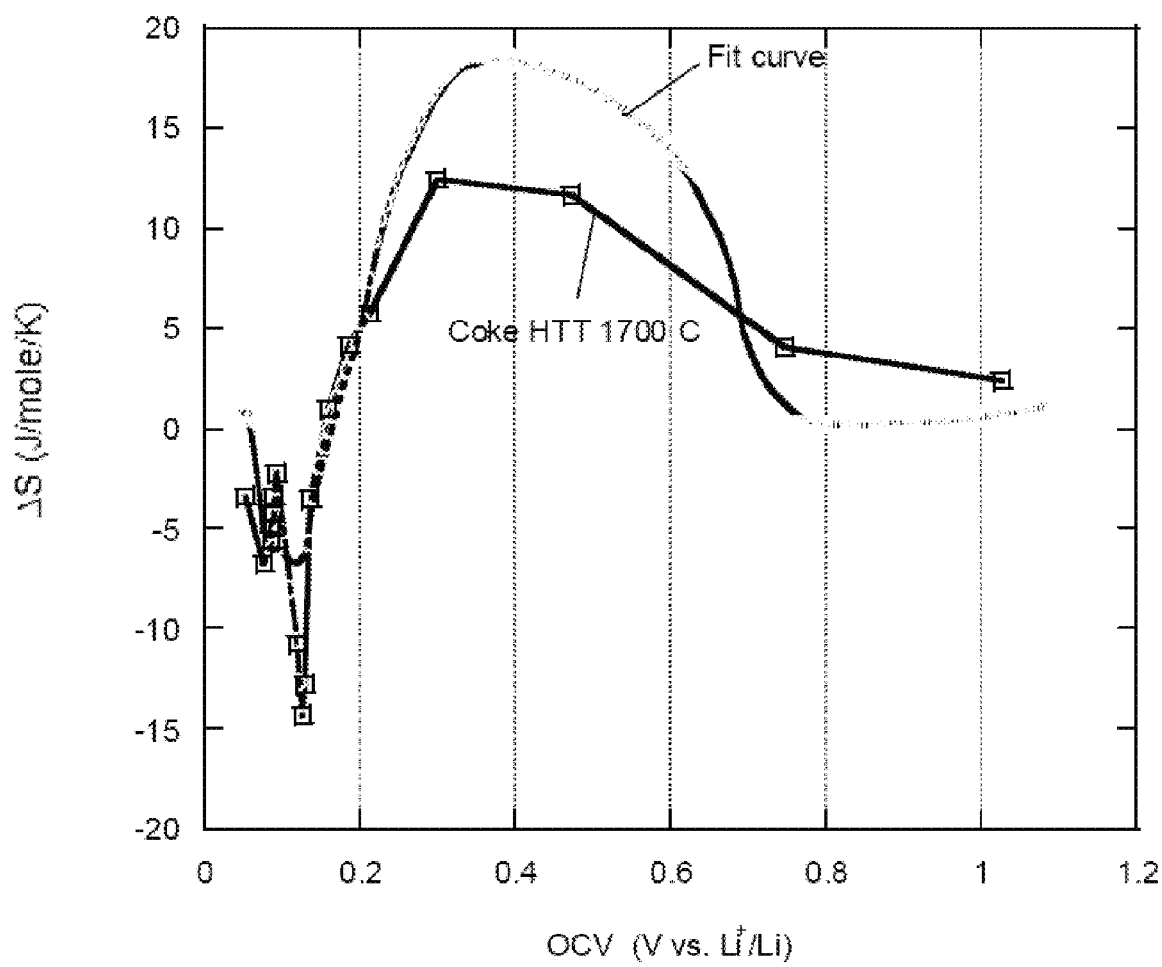
FIG. 39a provides a plot of entropy vs. OCV of coke sample HTT 1700° C. together with a fitting curve.
Figure 39B:
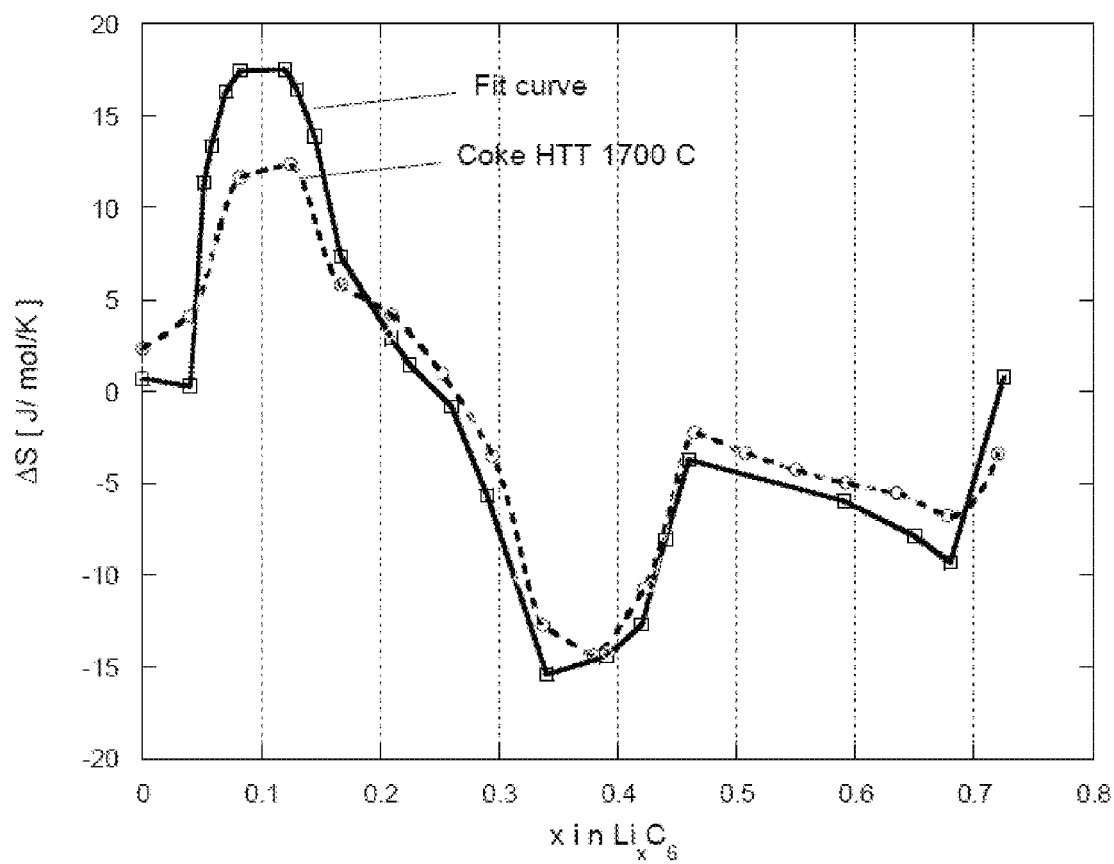
FIG. 39b provides a plot of entropy vs. composition of coke HTT 1700° C. and a fitting curve corresponding to G=0.32 in Equation F13.

To check validity of Eqn. F12, we applied it to the coke HTT 1700° C. FIG. 30 shows the $\Delta S_G(E_0)$ and $\Delta S_D(E_0)$, of the coke HTT below 500° C. and graphite HTT 2600° C., respectively on the left and right plots. FIG. 39a shows the $\Delta S_T(E_0)$ of the coke HTT 1700° C. together with best fit using Eqn. F13. The latter was achieved with G=0.32, which is in very good agreement with that obtained by XRD expressed by Eqn. F11, taking G=0.94 and G=0.15 in the cokes HTT 2600° C. and HTT below 500° C., respectively.

In conclusion, the entropy function can be used to determine the degree of graphitization of a carbonaceous material as does XRD and Raman spectrometry. More generally Eqn. F13 applies to any anode and cathode materials consisting of a mixture of 'i' components, provided the $\Delta S_i(E_0)$ function for each component 'i' is known.

A generalized equation can be expressed as:

$$\Delta S_T(E_0) = \sum_i x_i \Delta S_i(E_0), \tag{F14}$$

where $\Delta S_T(E_0)$ is the OCV dependence of the entropy function experimentally achieved in the multi-component electrode, $x_i$ is the molar fraction of component 'i' in the mixture and $\Delta S_i(E_0)$ is the OCV dependence of the entropy of component 'i'.

B. Cathode Materials

1. $LiCoO_2$ $LiCoO_2$ is the standard cathode material in lithium ion batteries since their commercialization in the early 90's. Its crystal structure can be described as regular stacking of $CoO_2$ slabs in which the $Co^{3+}$ cations are sandwiched between two close-packed oxygen layers in $CoO_6$ octchedra. Lithium ions are also sandwiched between two $CoO_2$ slabs and occupy octahedral sites. The $CoO_2$ slabs are stacked along the c-axis in the ABC sequence to form the $O_3$ structure. This arrangement yields a rhombohedral symmetry of the $LiCoO_2$ crystal ($R_{3m}$ as the space group). Where the $Co^{3+}$ cations are covalently bonded to the oxygen atoms, the $Li^+$ form weaker ionic bonds with oxygen. Such a difference in binding energy allows for fast 2D diffusion of the lithium ions, whereas the $Co^{3+}$ remain basically immobile. As lithium intercalate into and de-intercalate from the $CoO_2$ structure, the later change in their average partial charge to compensate for lithium cation gains and losses. The charge compensation mechanism can be schematized as follows:

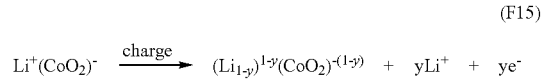

(F15)

In a lithium cell, Eqn. F15 describes the charge mechanism of the positive electrode (commonly called the cathode although in fact Eqn. F15 describes an anodic process) during which lithium is de-intercalated from $LiCoO_2$. Basically up to y=1 lithium can be de-intercalated from $LiCoO_2$ to form $CoO_2$. However, exceeding y~0.5 has proved to adversely affects the 2D structure of the CoO2 slabs, hence deteriorating the battery cycle life.

The phase diagram of the $Li_xCoO_2$ (x=1−y in Eqn. F15) system has been studied by in-situ XRD. Those experimental results were supported by theoretical calculations as well. In fact as lithium is extracted from $LiCoO_2$, hexagonal phases form as single- or two-phase system. At x~0.5 a monoclinic phase of distorted $LiO_6$ octahedra forms and may be the precursor of less stable hexagonal phases as the lithium composition decreases. Among proposed trigonal phases for x<0.5 are the H1-3 and the O1 phases of stage 2 and dilute stage 1 like structures, respectively.

Figure 40:
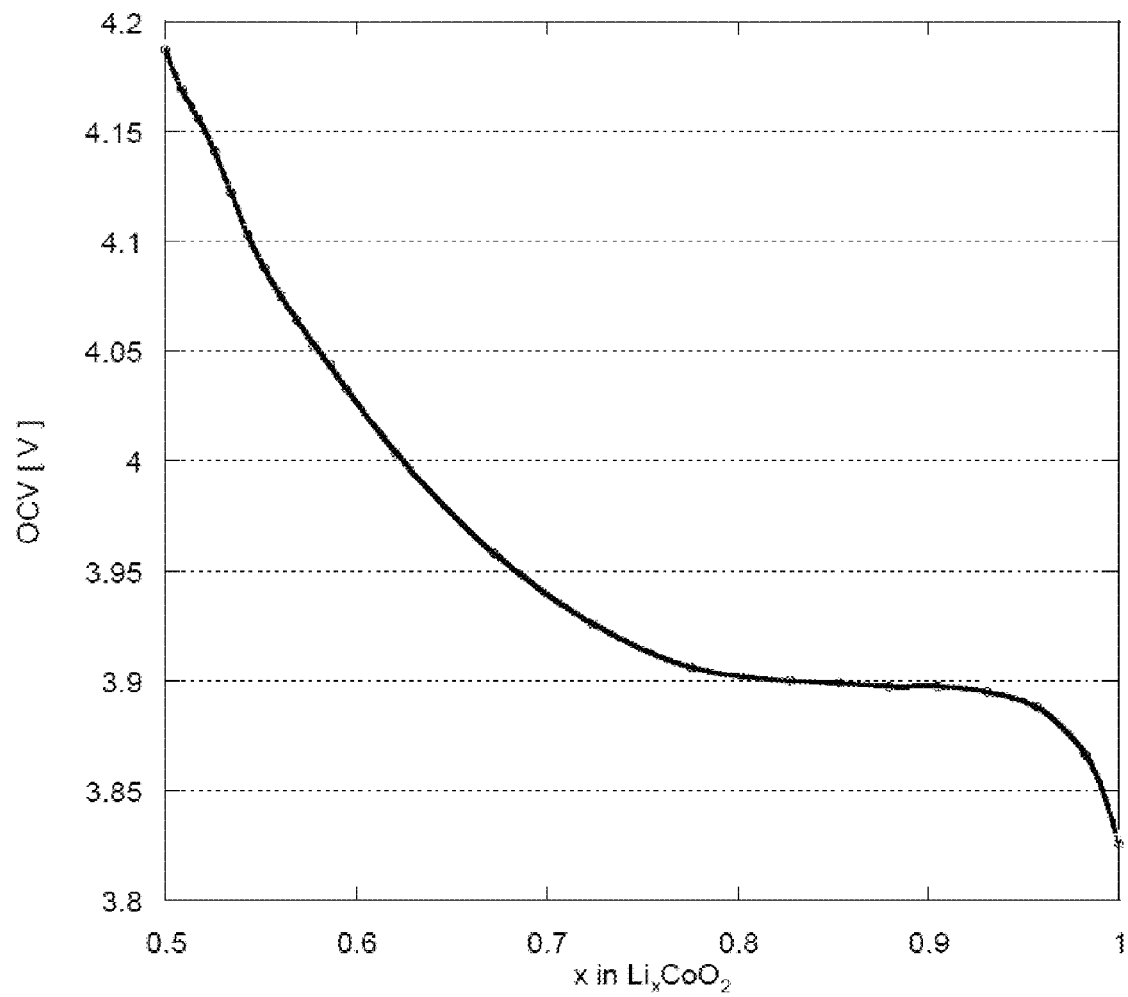
FIG. 40 provides a plot showing OCV as a function of lithium concentration in $Li_yCoO_2$.
Figure 41:
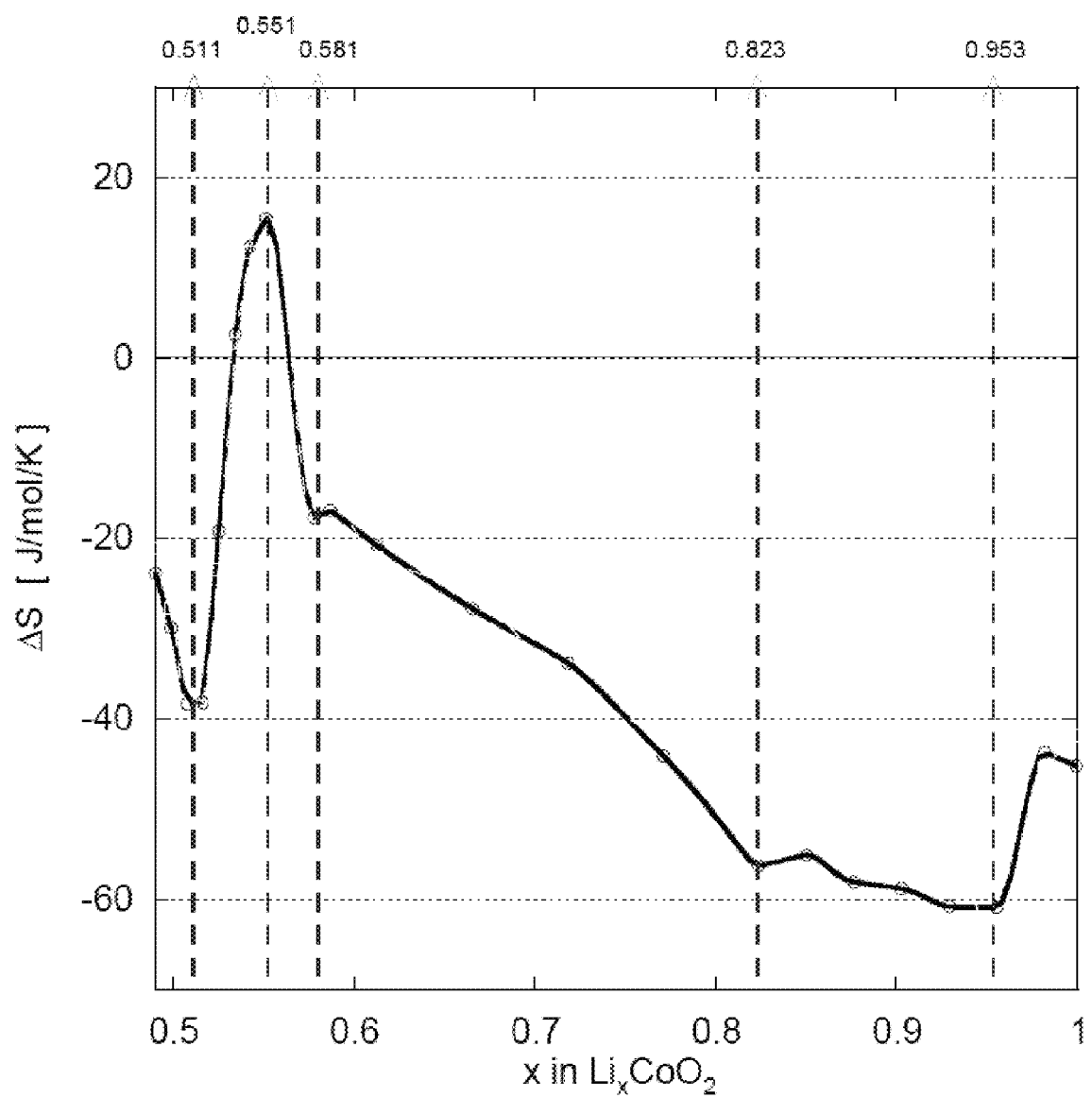
FIG. 41 provides a plot showing entropy of lithium intercalation into $Li_xCoO2$.

Our thermodynamics study on the $Li_xCoO_2$ system was limited to the 0.5<x<1 composition range. Electrochemical measurements were performed in a Li/$LiClO_4$ 1M PC/$Li_x$-$CoO_2$ coin shape half-cell. FIG. 40 is the OCV(x) trace during discharge. The OCV curve decreases monotonously at the beginning (0.5<x<0.75), makes a semi-plateau at 0.75<x<0.95 then declines again at the end of discharge (0.95<x<1). This profile suggests a solid-solution behavior where the OCV declines and a two-phase behavior where it makes a semi-plateau. The non obvious information in the OCV curve is any signature of the hexagonal to the monoclinic phase transition at x~0.5. This lack of clear evidence from the OCV curve indicates the phase transition involves a very small change in the free energy. This feature strongly contrasts with that achieved owing to the entropy study as evidenced in FIG. 41. In fact the $\Delta S(x)$ curve shows dramatic features, in which six areas can be distinguished as follows:

Area-I: (0.49<x<0.511): $\Delta S(x)$ sharply decreases and makes a minimum.

Area-II (0.511<x<0.551): $\Delta S(x)$ sharply increases and makes a maximum.

Area-III (0.551<x<0.581): $\Delta S(x)$ decreases sharply again

Area-IV (0.581<x<0.823): $\Delta S(x)$ decreases uniformly

Area V (0.823<x<0.953) where it makes a sloping plateau and finally

Area-VI (0.95<x<1) where $\Delta S(x)$ sharply increases and makes a short semi plateau.

Sharp decreases and increases in the $\Delta S(x)$ function occur at phase transitions boundaries as discussed in the previous section on carbonaceous anode materials. Accordingly, a decrease in Area-I and in Area-III should be associated with the H1-3 to the monoclinic and to the monoclinic to a hexagonal phase transitions, respectively. The later hexagonal phase covers Area IV with a typical solid-solution behavior. A second hexagonal phase forms at x=0.823. Therefore, the almost flat entropy in the 0.823<x<0.953 composition range should be associated with a two-phase system (first and second hexagonal phases). An increase in entropy above x=0.953 should sign a transition between the second hexagonal phase and a new Li-rich phase such as spinel $Li_2Co_2O_4$.

In conclusion, the entropy study allows phase transition boundary in the $Li_xCoO_2$ system to be defined with a much higher accuracy than by in-situ techniques such as XRD and x-ray absorption spectrometry. The reason may lay on the fact that most in-situ methods are applied under a dynamic lithiation regime although at slow rates, which may not allow for the system equilibration. Our entropy measurements are performed at quasi-equilibrium therefore they describe better the phase transitions. Despite being taken at equilibrium, OCV measurements are less sensitive to phase transitions than the entropy ones. This is particularly true for the monoclinic phase transition, which in addition to a large change in entropy vs. OCV have better defined transition boundaries. It is our argument that crystal imperfection or chemical impurity present in the starting $LiCoO_2$ material will affect both the OCV and the entropy curves, more significantly for the later thus allowing to distinguish between materials for their long term electrochemical performances such as cycle life and thermal aging.

2. $LiMn_2O_4$ $LiMn_2O_4$ with cubic symmetry (spinel structure) is another very important cathode material that has been widely studied as an alternative to more expensive and less environmentally benign $LiCoO_2$ material. Among important attractive features of $LiMn_2O_4$ are higher discharge voltage and faster charge and discharge kinetics. However, due to inherent chemical and crystal structure instability involving Mn dissolution especially at high temperatures and the Jahn-Teller distortion, $LiMn_2O_4$ has not enjoyed the same commercial success as $LiCoO_2$ despite a lower cost. Therefore, tremendous research and R&D efforts have been directed toward enhanced cycle life and thermal stability in particular through cation substitution (including Li+), anion substitution and surface coating. Very encouraging results have been achieved, which may curve the evolution of using LiMn2O4 in the near future in commercial batteries.

The redox process in the $Li_xMn_2O_4$ system is quite well understood as it involves mostly the $Mn^{(IV)}/Mn^{III}$ couple smaller change in the oxygen oxidation state unlike in the $Li_xCoO_2$ system. Accordingly, the lithium de-intercalation mechanism during charge can be schematized as follows:

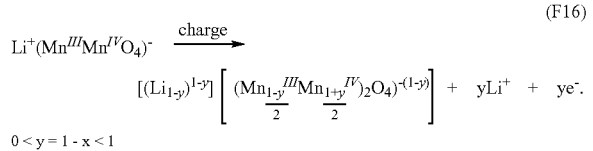

(F16)

$0 < y = 1 - x < 1$

At low constant rate the discharge profile of a $Li/Li_xMn_2O_4$ cell in the $0<x<1$ composition range typically shows two voltage plateaus at around 4V of approximately the same length of $\Delta x = 0.5$. These were associated with an order-disorder transition in the spinel phase that occurs at about $x=0.5$.

Figure 42:
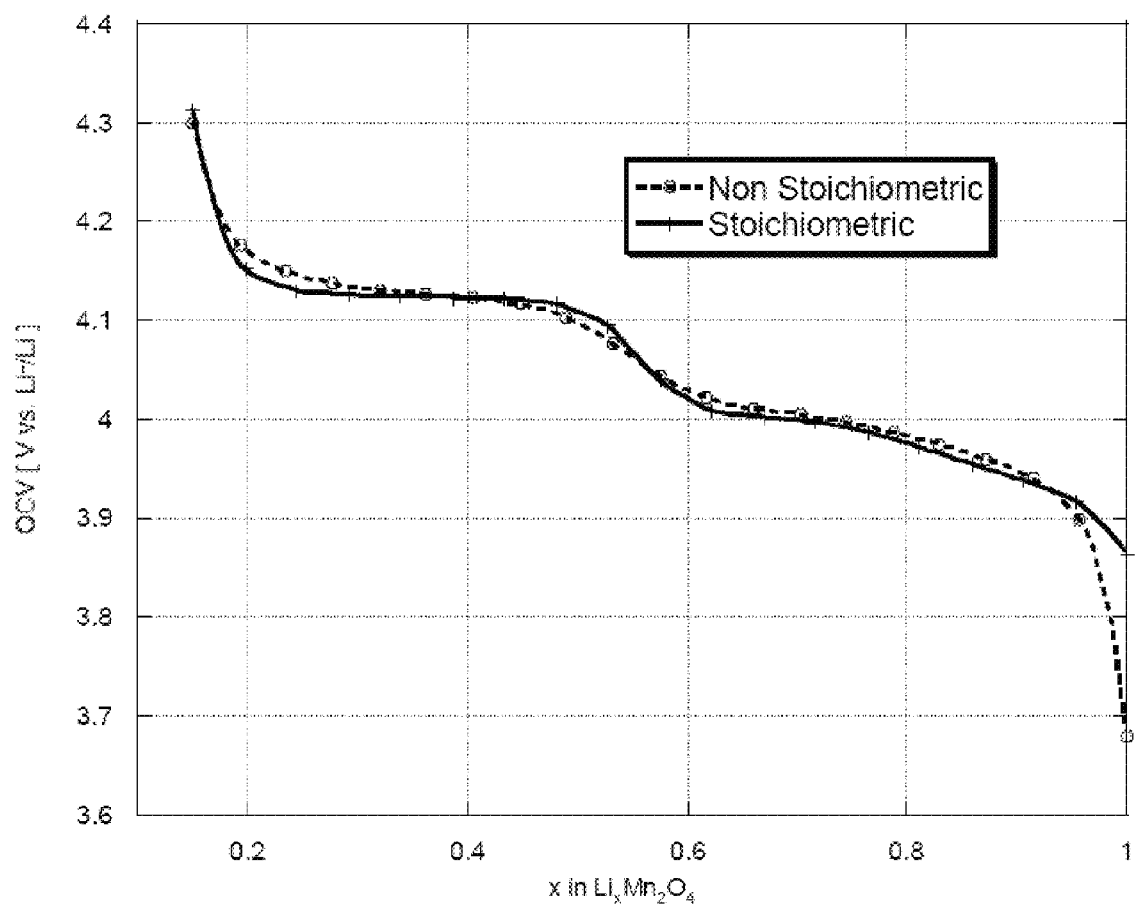
FIG. 42 provides a plot showing OCV as a function of lithium concentration in $Li_xMn_2O_4$ shown for stoichiometric and non-stoichiometric materials.

In our thermodynamics study we used two manganese spinel materials; a close to stoichiometric compound $(Li_{1.0}Mn_2O_4)$ and a lithium-rich compound $(Li_{1.08}Mn_{1.92}O_4)$. FIG. 42 shows their respective OCV profiles with typical two 4V plateaus; the one at 4.13V roughly covering $0.20<x<0.55$ and the other averaged at 3.98V covering $0.55<x<1$. A close analysis of the OCV profile shows slight differences between the two spinel materials. The stoichiometric material has flatter high voltage plateau whereas the non-stoichiometric one shows a steeper OCV decrease at the end of lithiation ($x\sim1$).

Figure 43:
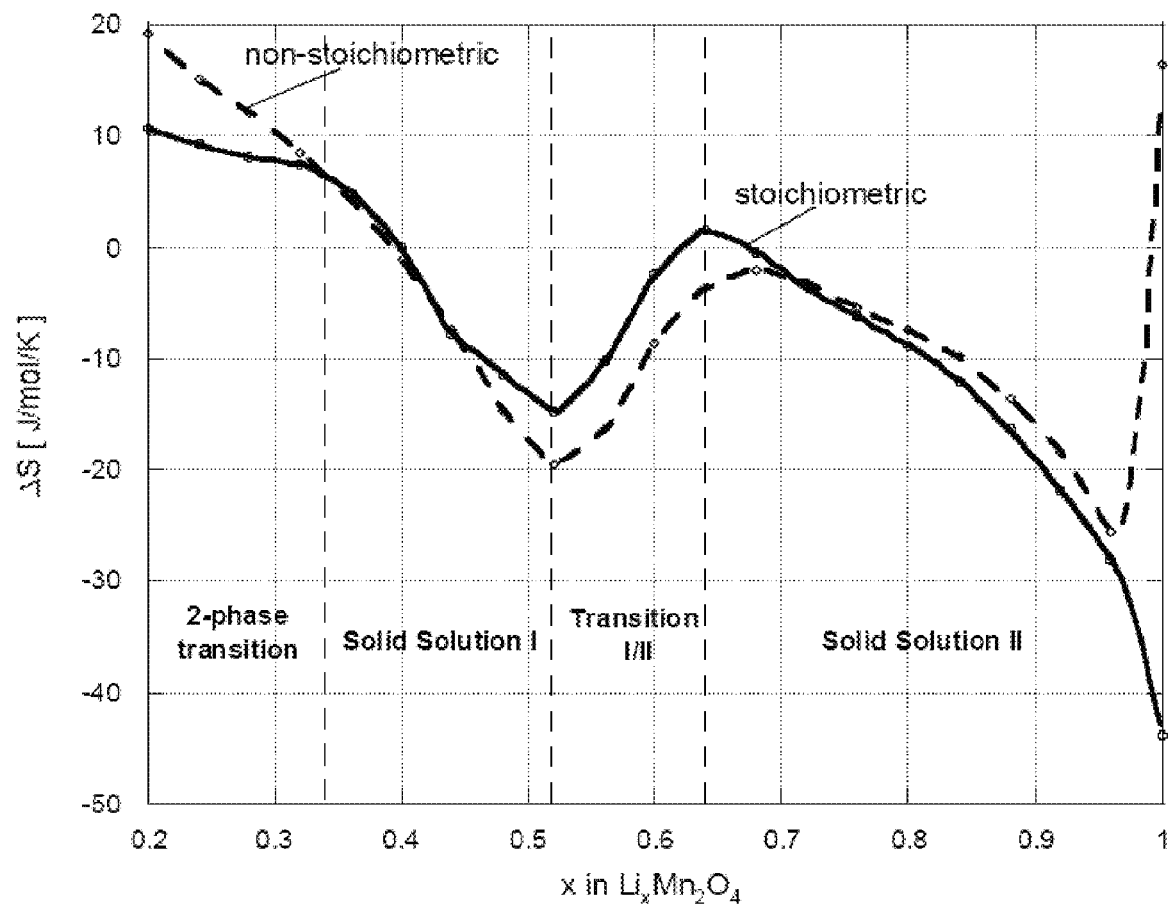
FIG. 43 provides a plot showing entropy as a function of lithium concentration in $Li_xMn_2O_4$ shown for a stoichiometric and a non-stoichiometric material.

The corresponding entropy curves are depicted in FIG. 43. In the non-stoichiometric material four composition areas can be distinguished: Area-I ($0.2<x<0.518$) where the entropy curve declines monotonously suggesting a solid-solution behavior, Area-II ($0.518<x<0.678$) where the entropy increases in a transition zone between two solid solutions, Area-III ($0.678<x<0.963$) where $\Delta S(x)$ decreases in a second solid solution system, and Area-IV ($0.963<x<1$) where the $\Delta S(x)$ makes a steep increase in a new transition zone probably as the onset the tetragonal phase formation.

The stoichiometric material, however, shows a different thermodynamics path: Area-I ($0.2<x<0.339$) where $\Delta S(x)$ varies a little a signature of two-phase system behavior, Area-II ($0.339<x<0.518$) where the entropy shows a negative slope indicative a solid solution behavior, Area-III ($0.518<x<0.641$) where $\Delta S(x)$ increases in a transition zone, and Area-IV ($0.641<x<1$) were the entropy decreases as we enter a second solid solution. Unlike for the non-stoichiometric material, there is no onset of the cubic to tetragonal phase transition at $x<1$ in the stoichiometric one. Differences in the thermodynamics behavior of the two spinel materials shows the lithium excess in the non-stoichiometric material accounts for an earlier cubic to tetragonal phase transition compared to the stoichiometric one. In fact, in the latter we found the OCV makes a steep drop at $x=1$ to 2.9V where the tetragonal phase starts to form. The delay in the tetragonal phase formation may play an important role in the cycle life as the tetragonal phase is known to less cycleable.

3. Effect of Cycling on Thermodynamics

4 Ah lithium ion cells with graphitic carbon anode and $LiNi_{1/3}Co_{1/3}Mn_{1/3}O_2$ cathode were prepared courtesy of ENAX, Co. (Yonezawa Labs., Japan). Cells were cycled 100% DOC-100% DOD for 3 formation cycles and others for 500 cycles, respectively denoted fresh and cycled cells. The capacity loss after 500 cycles is about 10.5%. Fully discharged cells were then opened in a dry atmosphere. Electrodes were retrieved, washed and dried in ambient temperatures. New lithium half-cells were made from the anode and cathode for thermodynamics study as described in the previous sections, except the BA-1000 system (FIG. 1) was used.

Figure 44:
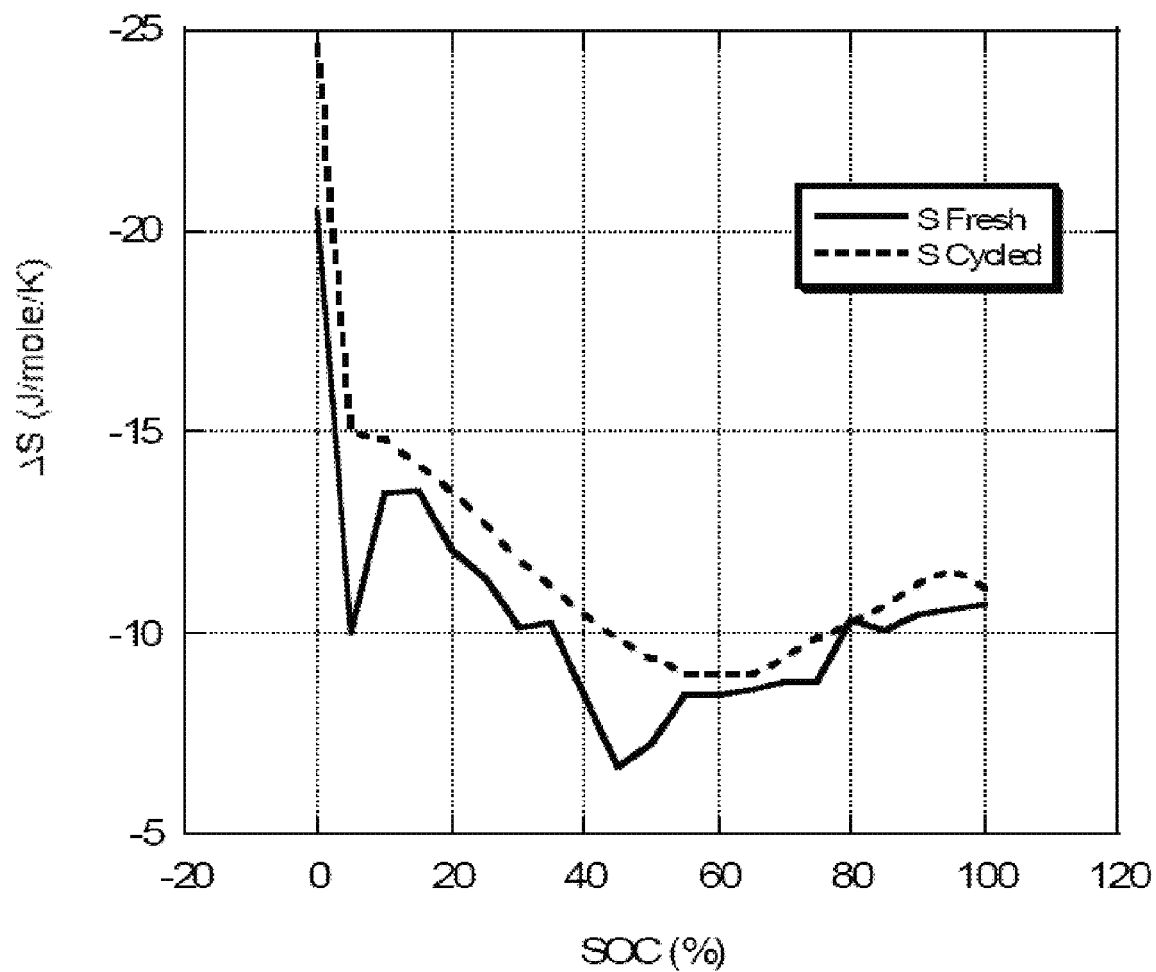
FIG. 44 provides a plot showing the entropy profile of fresh and cycled $LiNi_{1/3}CO_{1/3}Mn_{1/3}O_2$ cathodes.
Figure 45:
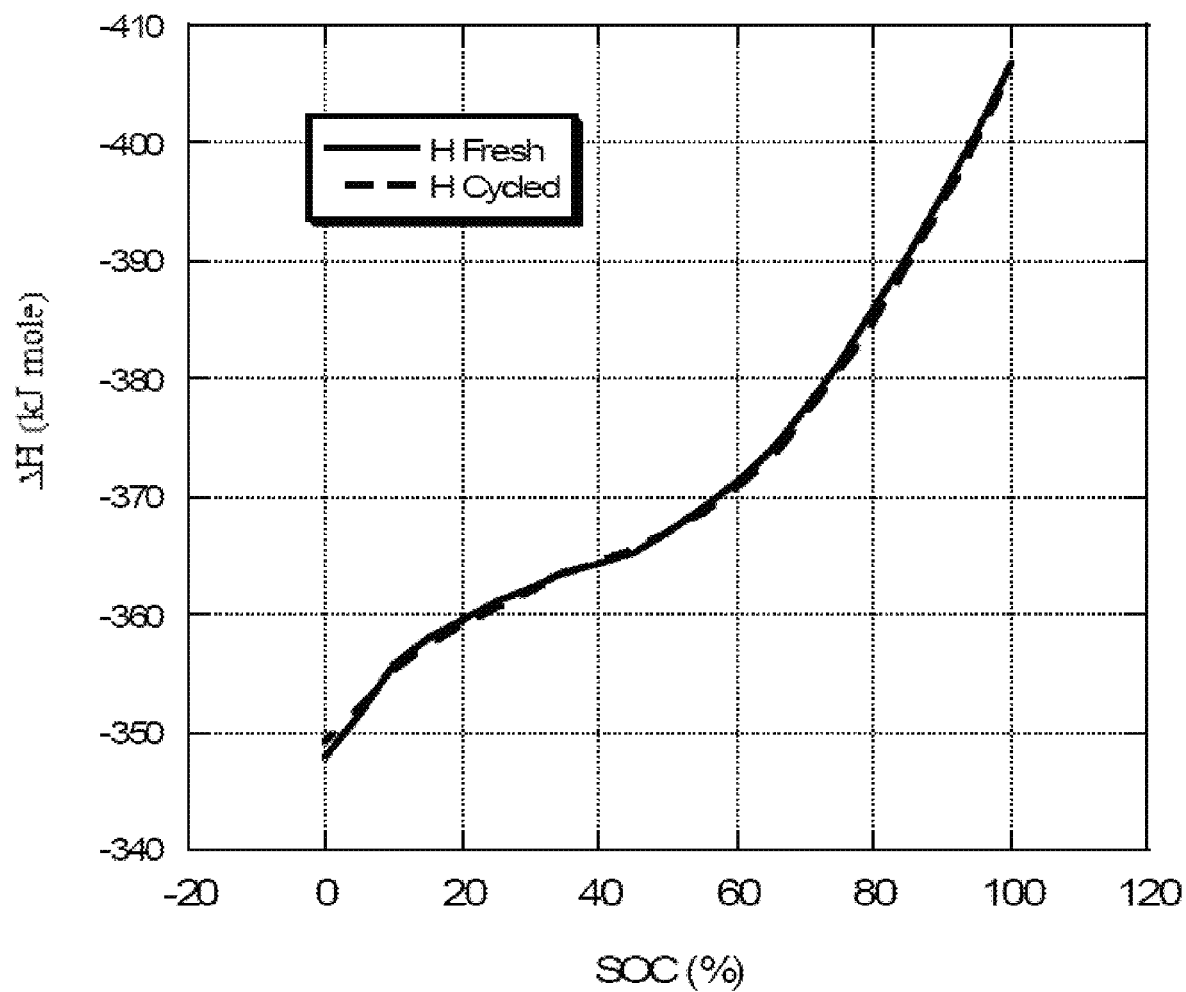
FIG. 45 provides a plot showing the enthalpy profile of fresh and cycled $LiNi_{1/3}CO_{1/3}Mn_{1/3}O_2$ cathodes.

The entropy and enthalpy vs. SOC curves of the half cells using fresh and cycled $LiNi_{1/3}C_{1/3}Mn_{1/3}O_2$ cathodes are displayed in FIGS. 44 and 45, respectively. Where the entropy profile of the fresh cell features dramatic changes in slope, the one of the cycled cell shows much smoother slopes except at the early stage of charging where both curves have steep negative slopes. As discussed previously, changes in the entropy slope occur at phase transitions boundaries. Phase transitions in $LiNi_{1/3}Co_{1/3}Mn_{1/3}O_2$, which origin is beyond the scope of this example, still need to be clarified, have been dramatically affected by the cycling. Our recent transmission electron microscopy study on the $LiNi_{1/3}Co_{1/3}Mn_{1/3}O_2$ cathode before and after thermal aging showed dramatic changes in the crystal structure, which we attributed to transition metal (TM) cation rearrangement and to Li-TM cation mixing. If fact the $\sqrt{3}\times\sqrt{3}$ TM superlattice which occurs in fresh $LiNi_{1/3}Co_{1/3}Mn_{1/3}O_2$ of rhombohedral is thermodynamically instable and converts to more disordered (mixed TM) structure and/or to cubic spinel upon thermal aging. It is our argument that prolonged cycling may lead to similar crystal structure phenomena, which then bear a thermodynamics signature. It is interesting, however, to see that the enthalpy curve of FIG. 45 doesn't show any significant difference between fresh and cycled cathodes. This suggests that the thermo-chemistry behind lithium intercalation and de-intercalation is not much sensitive to the cation ordering within the TM layer or to 10.5% decrease in cycle capacity.

This clearly illustrates the higher sensitivity of the entropy function to the local TM ordering in $LiNi_{1/3}Co_{1/3}Mn_{1/3}O_2$, unlike the enthalpy and free energy functions.

Conclusion

A new method for electrode materials characterization based on thermodynamics measurements has been developed and applied to anode and cathode materials for lithium ion batteries. An automatic system (ETMS) has been set up (FIG. 1) and allow for a full control of the cell state of charge and discharge and temperature and full data collection and conversion to thermodynamics state functions.

The main features of this new thermodynamics characterization methodology, in particular the entropy measurement (or entropymetry) can be summarized here:

High sensitivity to phase transitions taking place in electrode material;

High sensitivity to departure from stoichiometry and presence of defects and impurities in the electrode material;

High resolution in composition boundaries of phase transitions: the method can be used as a titration technique for each phase present;

High energy and voltage resolution of phase transitions;

High sensitivity to local disorder and degree of crystallization;

The method is non destructive;

It allows the heat of electrode reaction to be accurately determined, therefore can be used as calorimetry;

Applies to half-cells and to full-cells;

Applies to multi-components electrode material and distinguishes among them;

Versatility: the method should apply to any battery chemistry, including rechargeable alkaline and lead acid batteries.

Our thermodynamics results were obtained in lithium half-cell configuration.

Therefore only processes involved in one working electrode were characterized. In a full cell configuration, the OCV results from difference in $OCV^+$ of the positive and $OCV^-$ of the negative electrode:

$$OCV = OCV^+ - OCV^-$$

The temperature dependence follows, and so does the cell entropy:

$$\Delta S(\text{cell}) = \Delta S(\text{positive}) - \Delta S(\text{negative})$$

Therefore any change in the entropy function of the positive and the negative electrode should translate in that of the full cell. Same principle applies to the heat of cell reaction. Due to high sensitivity of the entropy and enthalpy functions to pre-existing or induced structural disorders, it is expected that the functions will bear the signature of any disorder source such as cycle number, over-charge and over-discharge and exposure to high and possibly low temperatures.

TABLE F1

Crystallite size in the c direction based on the 002 peak broadening, $L_c$ and graphitization degree, G.

| Sample | Full width at half maximum FWHM (2θ) | d-spacing (Å) | 002 peak angle (2θ) | G (%) | $L_c$ (Å) |
|---|---|---|---|---|---|
| Coke no HTT | 1.97 | 3.461 | 25.72 | 0 | 43 |
|  | 0.37 | 3.372 | 26.41 | 82 | 277 |
| Coke HTT 900° C. | 1.93 | 3.461 | 25.72 | 0 | 44 |
|  | 0.35 | 3.372 | 26.41 | 82 | 297 |

TABLE F1-continued

Crystallite size in the c direction based on the 002 peak broadening, $L_c$ and graphitization degree, G.

| Sample | Full width at half maximum FWHM (2θ) | d-spacing (Å) | 002 peak angle (2θ) | G (%) | $L_c$ (Å) |
|---|---|---|---|---|---|
| Coke HTT 1100° C. | 2.05 | 3.461 | 25.72 | 0 | 41 |
|  | 0.33 | 3.372 | 26.41 | 82 | 320 |
| Coke HTT 1700° C. | 0.58 | 3.428 | 25.97 | 30 | 160 |
|  | 0.23 | 3.359 | 26.51 | 94 | 523 |
| Coke HTT 2200° C. | 0.25 | 3.377 | 26.37 | 77 | 458 |
| Coke HTT 2600° C. | 0.20 | 3.361 | 26.50 | 92 | 643 |

EXAMPLE 4

Using Electrochemical Thermodynamic Measurements to Detect Effects of Battery Aging This example describes how the Gibbs free energy, entropy, and enthalpy of an electrochemical cell can be calculated from the temperature dependence of the open circuit voltage (OCV). Examining these thermodynamic properties as a function of the cell's state of charge can show the effects of aging, electrode composition, and manufacturing process changes. Because this is a completely non-destructive test method, the same cells can be measured periodically over time to detect changes in the electrode structure caused by different environmental or operating conditions. Although illustrated using lithium ion cells, the method is applicable to any electrochemical cell chemistry.

First, we look at how to calculate the thermodynamic properties from the temperature dependence of the open circuit voltage. By definition, the Gibbs energy, $\Delta G = -nFU$, where n is the ionic charge, F is the Faraday constant, and U is the open circuit voltage (U), is equal to $\Delta H - T\Delta S$. By measuring the temperature dependence of U at a fixed charge state, the entropy can be calculated from the slope and the enthalpy calculated from the absolute zero temperature intercept: $\Delta S = F \partial U / \partial T$; $\Delta H = -FU + TF \partial U / \partial T$ or $\Delta H = -FU$ when extrapolated to T=0.

Figure 46:
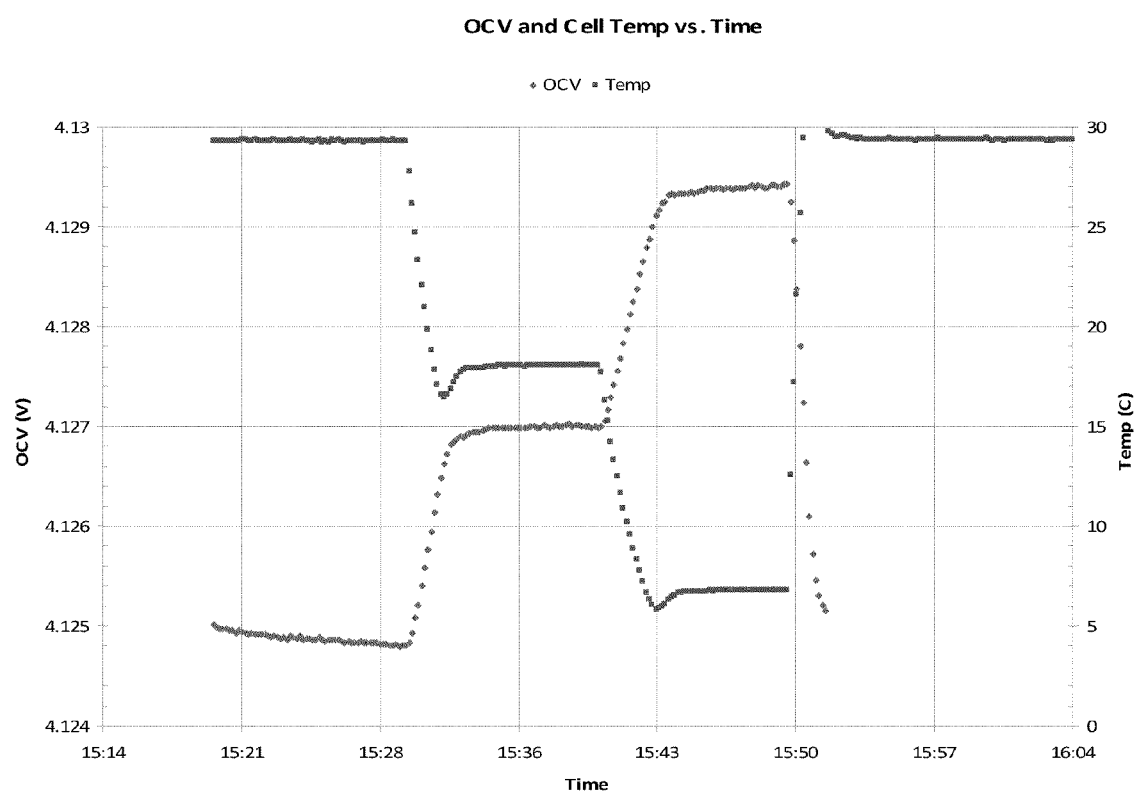
FIG. 46 shows an example OCV measurement with temperature for a Li ion cell.

FIG. 46 shows an example of the open circuit voltage measurement with temperature. The temperature of a Li ion cell was set to 29° C. and the OCV was measured after a stabilization time of about 10 minutes. Then, the temperature was reduced to 18° C. and the OCV was measured again after stabilizing. The temperature was reduced again to 7° C. and the OCV was measured. Finally, the temperature was set back to the original temperature of 29° C. and the cell voltage was allowed to stabilize for 10 minutes. Note that during the measurement time there was some overall drift in the OCV. This was caused by the equilibration of the distribution of the ions in the cell electrodes after being charge prior to this set of measurements. This drift is subtracted from each of the OCV measurements to compensate for its effect on the temperature dependence.

Figure 47:
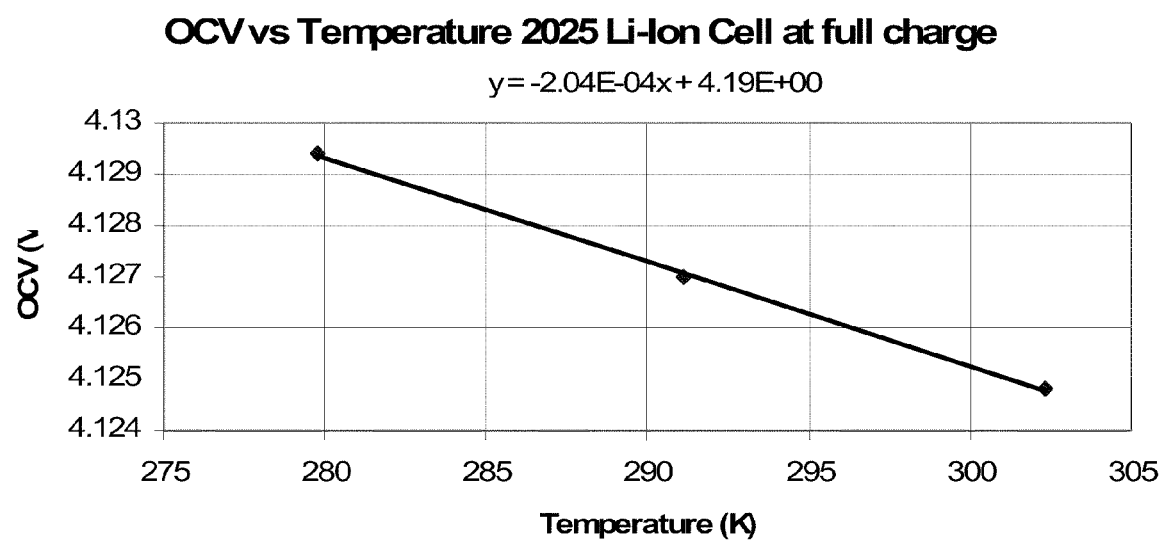
FIG. 47 shows compensated OCV measurements plotted as a function of the absolute temperature.

FIG. 47 shows the compensated OCV measurements plotted as a function of the absolute temperature. The OCV is a linear function of the temperature. If there were not a linear dependence it would indicate that the entropy was changing within the measurement temperature range, most likely because of a phase transition in the cell electrodes. The slope and zero temperature intercept of the OCV is calculated on the graph. Notice that the OCV changes are only a few tenths of a millivolt per degree. So accurate voltage readings are very important.

Most of the full-cell data presented in this example were taken with a VIASPACE BA-1000 Battery Analyzer. It is easily configured for a complete automatic measuring cycle over a full range of charge states on up to four cells.

Figure 48:
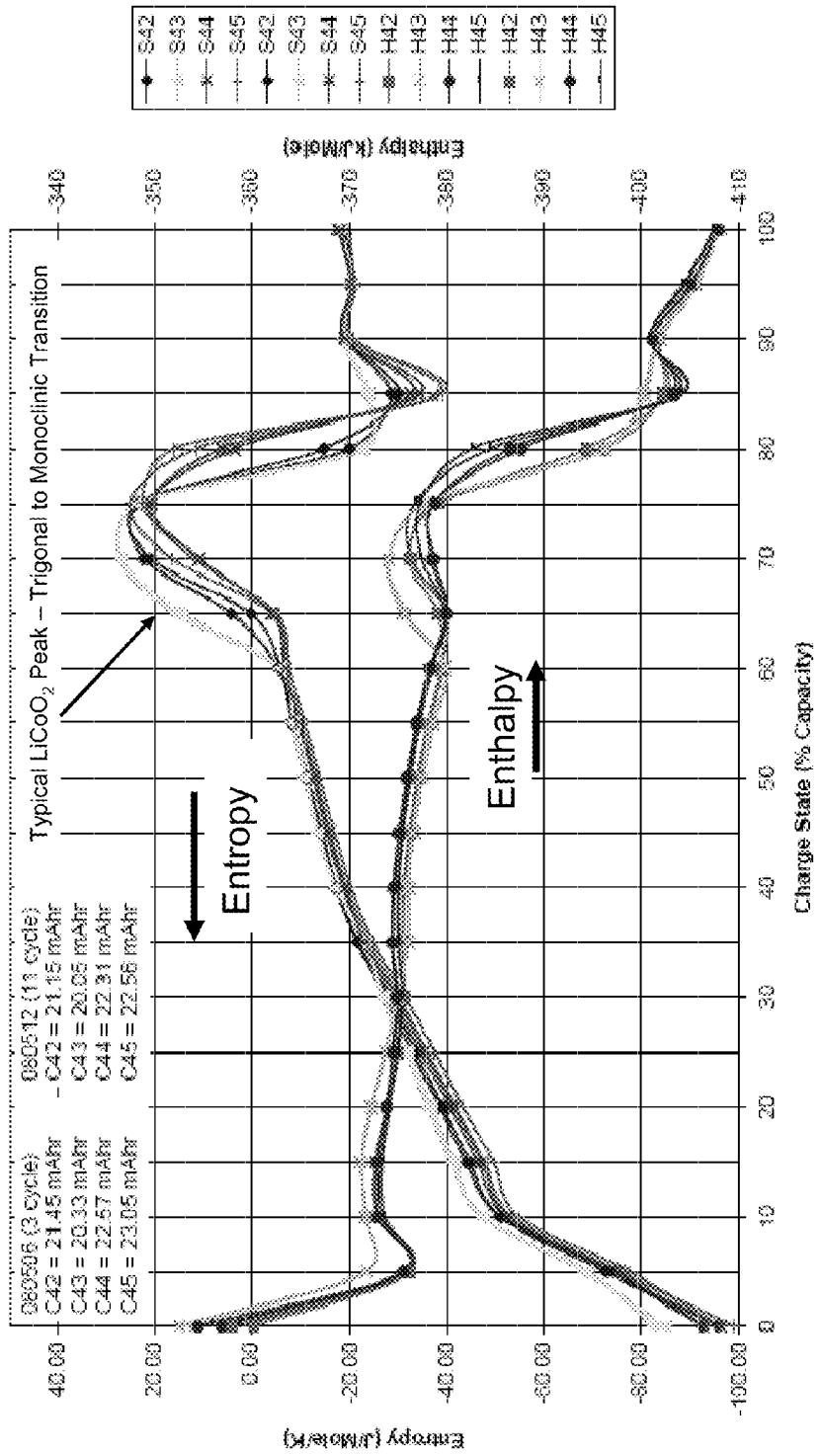
FIG. 48 shows the repeatability of the measurements for the same four $LiCoO_2$ coin cells a few cycles apart.

FIG. 48 shows the repeatability of the BA-1000 measuring the same four $LiCoO_2$ coin cells a few cycles apart. The BA-1000 cycled the cells between 3.2V to 4.2V at 30° C. The charge and discharge currents were 9.0 mA (~C/2) with constant voltage conditions at each end of the cycle until the current was below 1.0 mA. The capacity measured during these cycles was used as the basis for the Charge State Measurement.

On the legend, the letter in the label is S for entropy and H for enthalpy. Note that they are both changes per mole of lithium. The number refers to the serial number of the coin cell. The measured capacity for each of the measurements is shown in the upper left of the figure. Each measurement is shown repeated twice. Note that the repeatability of each measurement is much better than the variation between individual cells. The rapid change in entropy between 60% and 90% state of charge is characteristic of a phase transition from monoclinic to trigonal structure in the $LiCoO_2$ electrodes.

The larger differences between the two measurements in the region of the phase transition are to be expected because the progression of the phase transition is very sensitive to small differences in the conditions; much the same as other phase transitions such as freezing ice.

Figure 49:
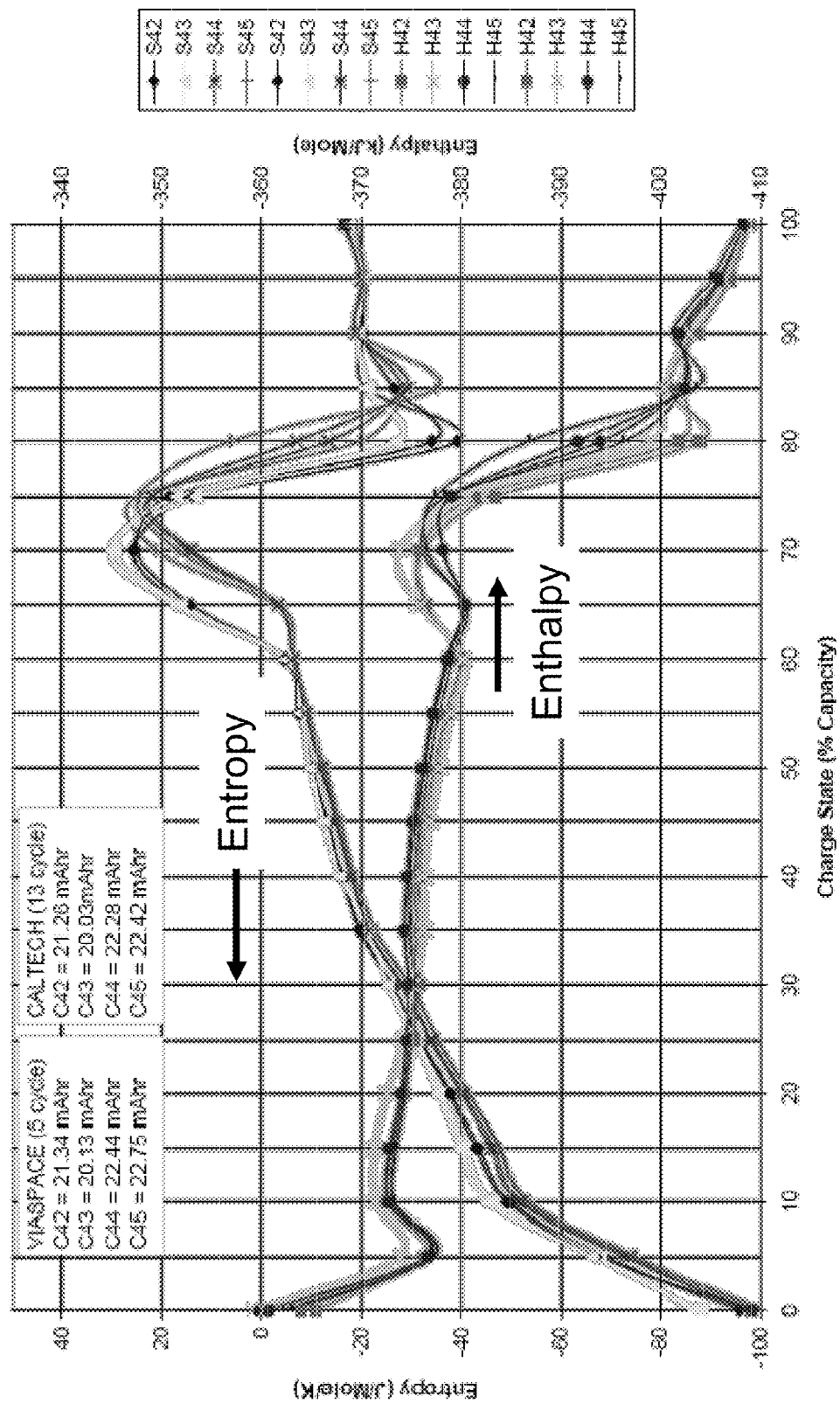
FIG. 49 shows the reproducibility of the entropy and enthalpy measurements made at two different laboratories and on two different instruments.

FIG. 49 shows the reproducibility of the entropy and enthalpy measurements made at Caltech and at VIASPACE on different instruments. Curves with the same color are the same characteristic of the same cell measured on the two different instruments. Note that the variation from one instrument to the next is similar to the variation from one measurement to the next on the same instrument and much less than the variation among cells. Again, the greatest variation occurs in the region of the $LiCoO_2$ phase transition between 60% and 90% state of charge.

Now that the reproducibility of the measurement technique has been established, the changes in entropy and enthalpy that occur in commercial 2025 size coin cells as they are cycled at high temperatures are examined.

Figure 50:
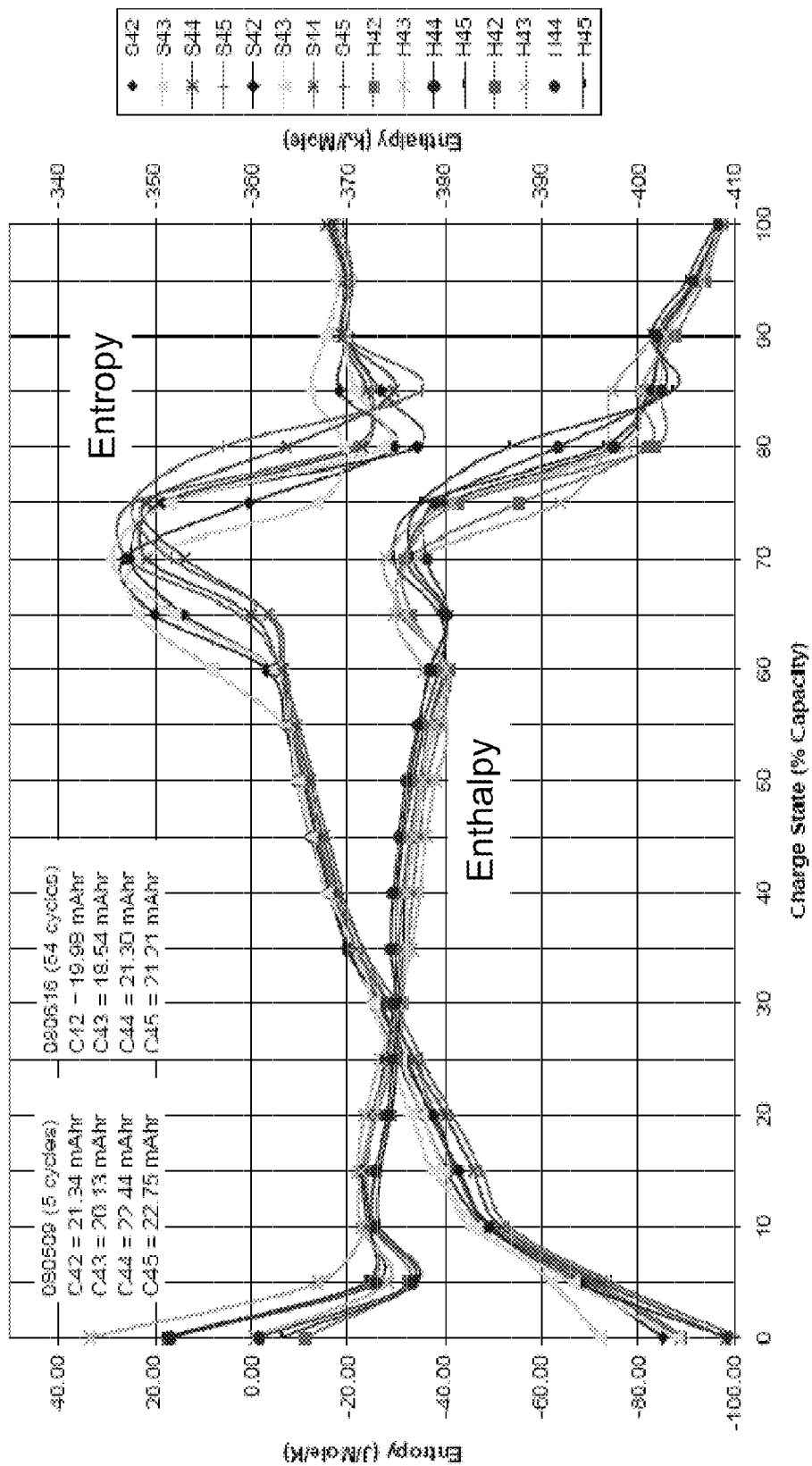
FIGS. 50, 51 and 52 compare the entropy and enthalpy curves for four 2025 coin cells after repeated cycling.

FIG. 50 compares the entropy and enthalpy curves for the four 2025 coin cells after repeated cycling. The cells were cycled 14 times at 30 C and then 40 more times at 58° C. At 58° C. the rate of aging should be about 8 times higher than at room temperature. The cells were cycled between 3.2 V and 4.2V. The constant current value was 9.0 mA and the constant voltage portion at each end was held until the current dropped below 1.0 mA. The $LiCoO_2$ phase transition is clearly shifting to a few percent lower state of charge after the cycling. The size of this shift is consistent for all cells and well outside the measurement repeatability.

Below 10% state of charge a consistent and significant increase in the entropy is observed. This indicates an increase in the disorder in an electrode crystal structure. The change is especially strong in cell 43. A related change can be seen in the enthalpy curve as well.

It is interesting to note that the cell 43 with the greatest capacity loss, 8%, shows the largest changes in the entropy curve while cell 44 with the least capacity loss, 5%, shows the smallest change.

Figure 51:
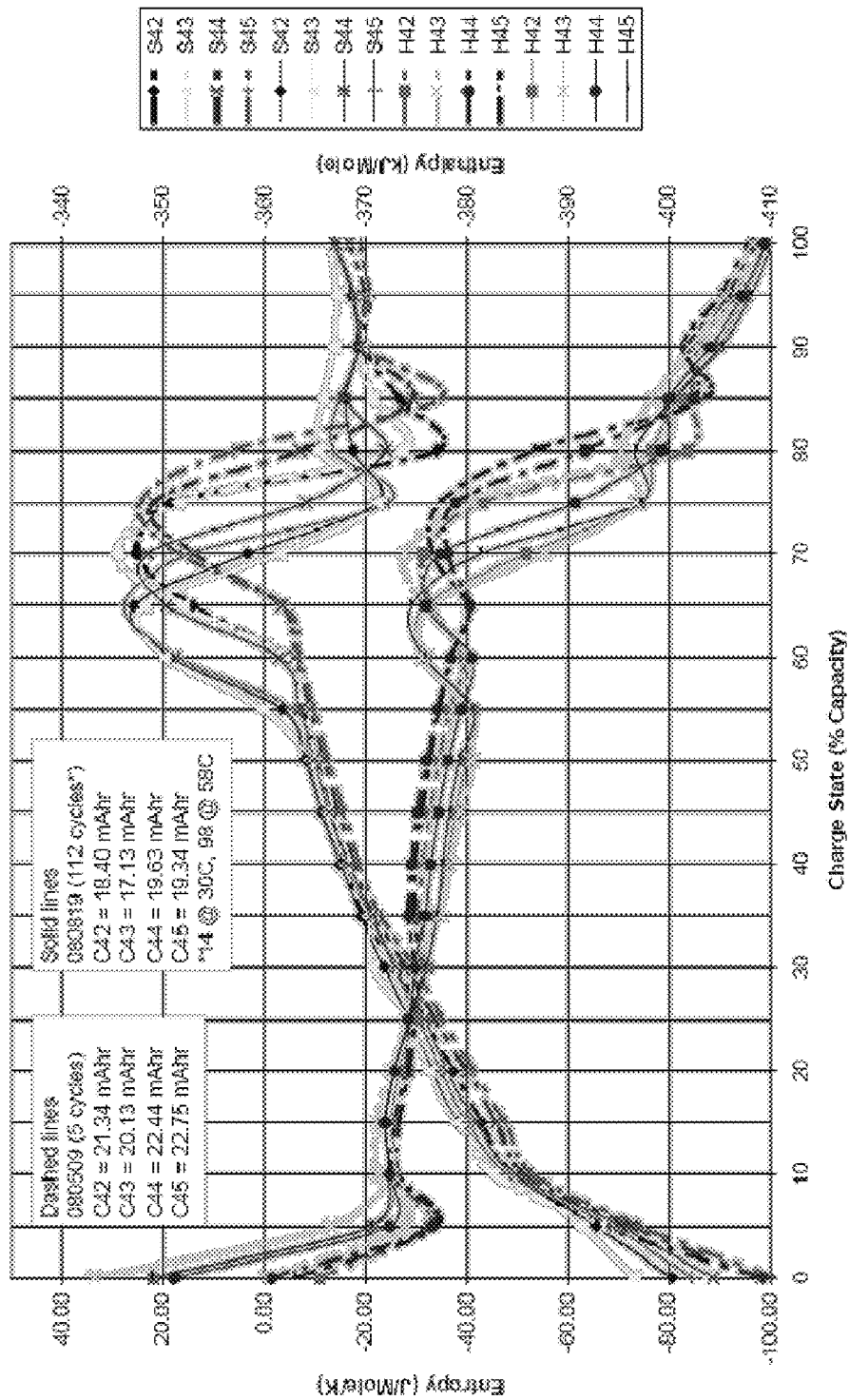

FIG. 51 compares the curves after aging for another 58 cycles at 58° C. to the fresh cells. The curves measured after 5 cycles have been dashed to distinguish them from the 112 cycle curves. The trend of the $LiCoO_2$ entropy peak moving to lower state of charge (SOC) with aging continues to be observed. Cells 42, 43, and 44, have all moved to about 6% lower SOC; however, cell 45 has moved to an almost 9% lower state of charge. This must be due to more that just the capacity loss since all of the cells lost about 13% to 15% of capacity. Three of the four cells, 42, 43, and 45 all seem to be "stabilizing" with the entropy peak at an SOC about 65% of capacity. At the lower charge states the curves have changed little between 54 cycles and 112 cycles.

Figure 52:
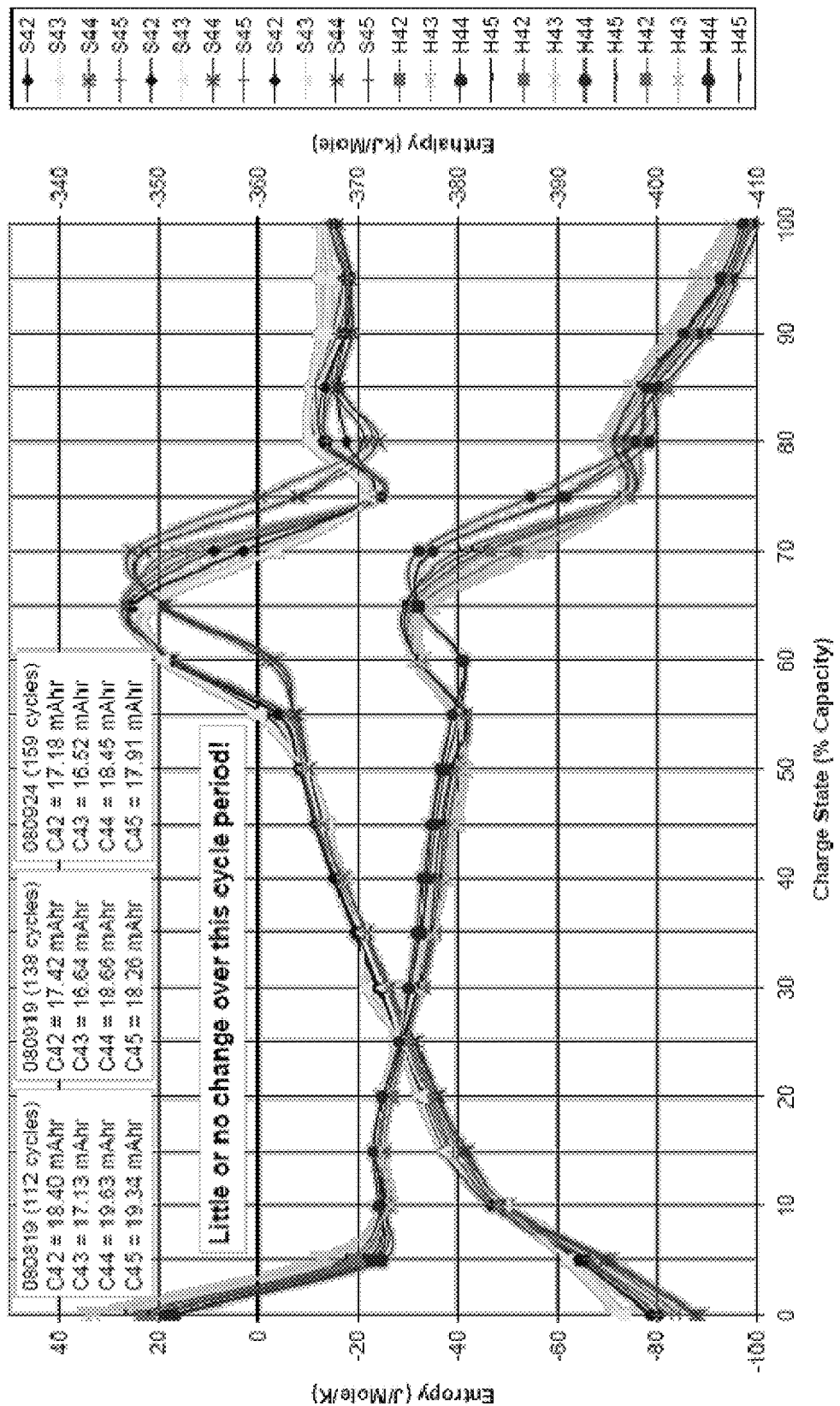

FIG. 52 compares the curves after further aging and shows that very little change occurs between 112 and 159 cycles at 58° C. This is quite surprising considering that there is still considerable capacity loss on the order of 5%. Additional data of cycling up to 240 times show additional little change.

Figure 53:
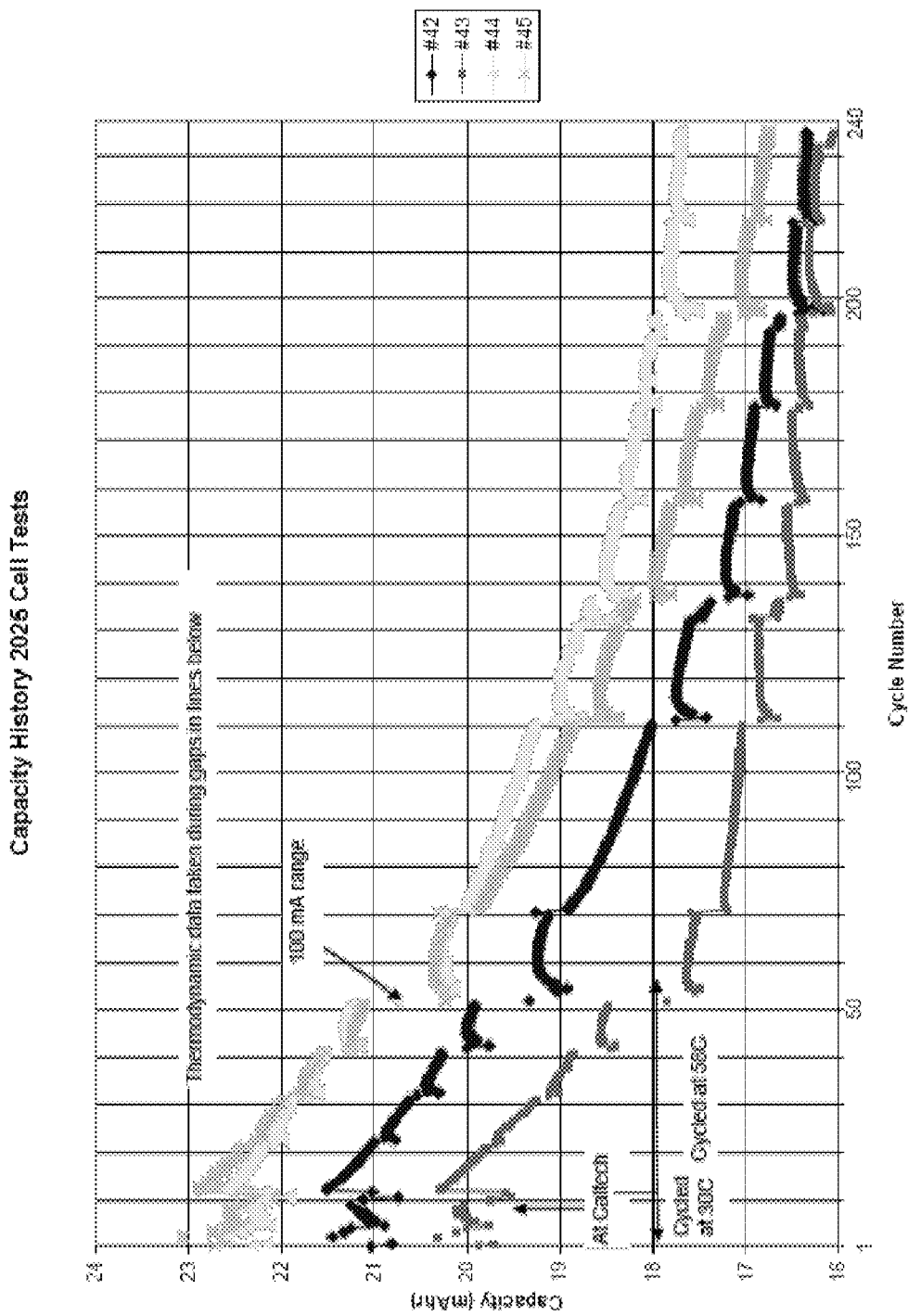
FIG. 53 shows the decrease in capacity during the cycling tests.

For reference, FIG. 53 shows the decrease in capacity during the cycling tests. Gaps in the curves are when electrochemical thermodynamic data were taken. Data during cycle 53 were taken with an instrument with a 100 mA current capability (rather than the standard 10 mA). There was a two month idle period between cycles 53 and 54 while the cells were left in a fully charged open circuit condition. Capacity losses after 158 cycles were 21% for cell 42, 19% for cell 43, 19% for cell 44 and 23% for cell 45. The capacity loss rate with cycling reduces with increasing number of cycles. If a factor of 8 increase in aging rate is assumed, then these cells have the equivalent of almost 2000 cycles at room temperature.

Figure 54:
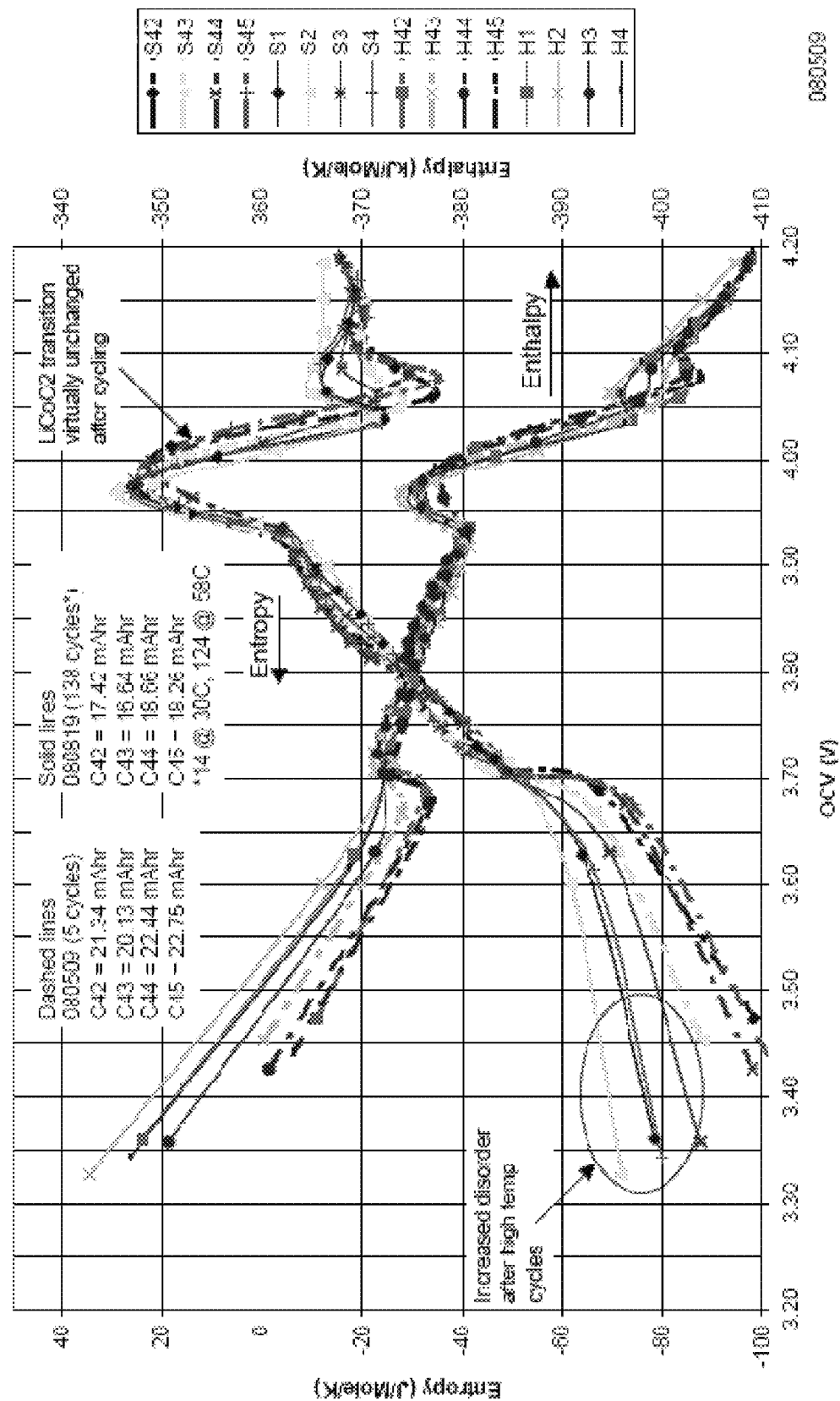
FIG. 54 shows entropy and enthalpy plotted as a function of OCV.

FIG. 54 shows entropy and enthalpy plotted as a function of OCV. The entropy changes associated with the $LiCoO_2$ phase transitions occur at consistent OCV rather than state of charge. The same phase configuration gives rise to the same cell potential regardless of the charge state expressed as a function of capacity. Near zero charge state the entropy per Li ion is increased compared to the fresh cells; indicative of higher disorder in the electrodes. Also, the OCV associated with the discharged state has decreased. The zero charge state was determined by discharging the cells to 3.2V and holding the cells at the voltage until the current dropped to less than 1 mA. Then the cells were left for 1.5 hours before measuring the entropy and enthalpy. The fresh cells "relax" more while resting than the aged cells.

Figure 55:
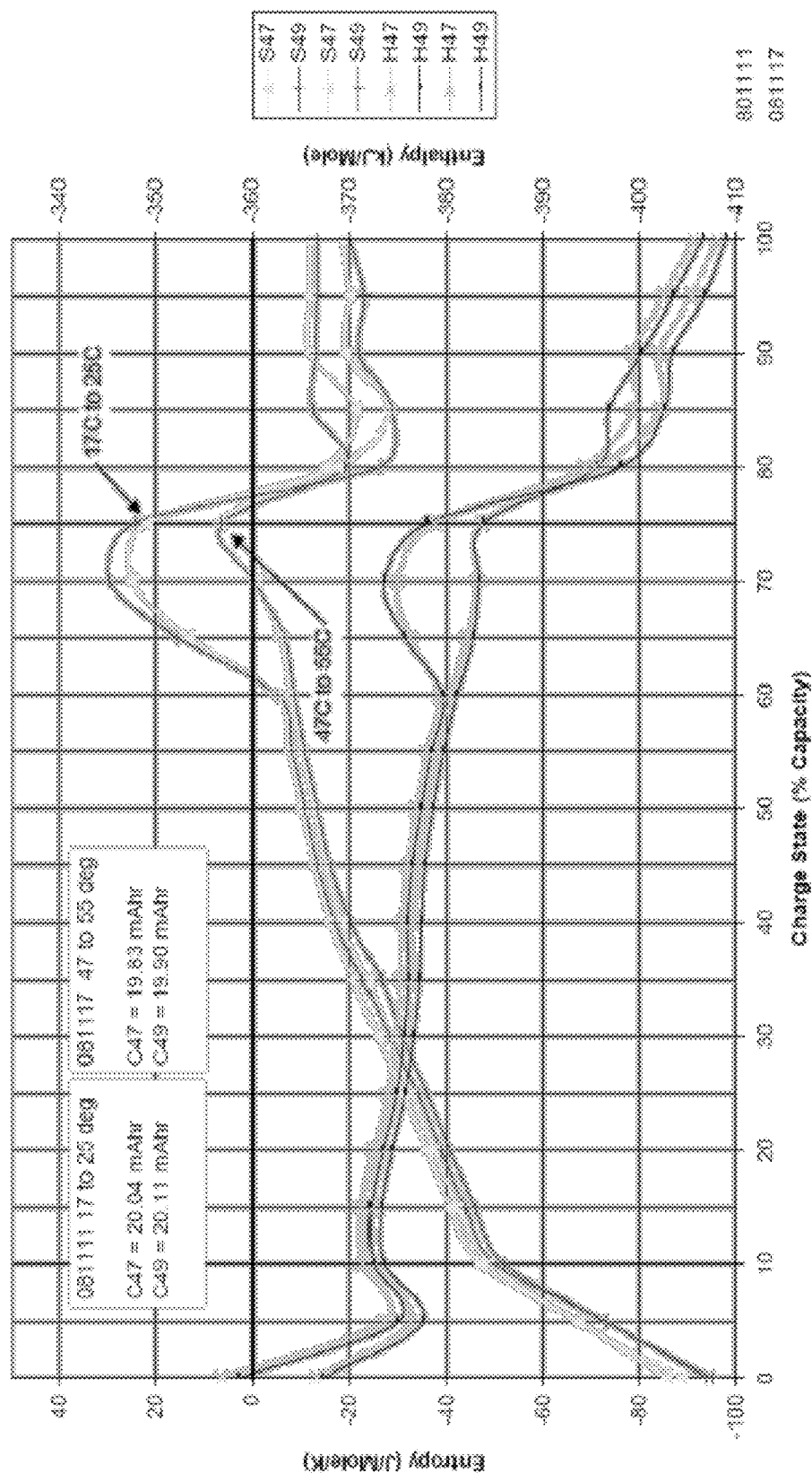
FIG. 55 shows thermodynamic measurements taken over the temperature ranges of 17° C. to 25° C. and 47° C. to 55° C.

The thermodynamic measurements taken over the temperature range from 17° C. to 25° C., shown in FIG. 55, show the strong entropy peak around 70% state of charge that is indicative of the trigonal to monoclinic phase transition in the $LiCoO_2$ cathode. Measurements were repeated over the temperature range 47° C. to 55° C., also shown in FIG. 55. The higher temperature entropy change is significantly reduced and shifted to a higher charge state.

Figure 56:
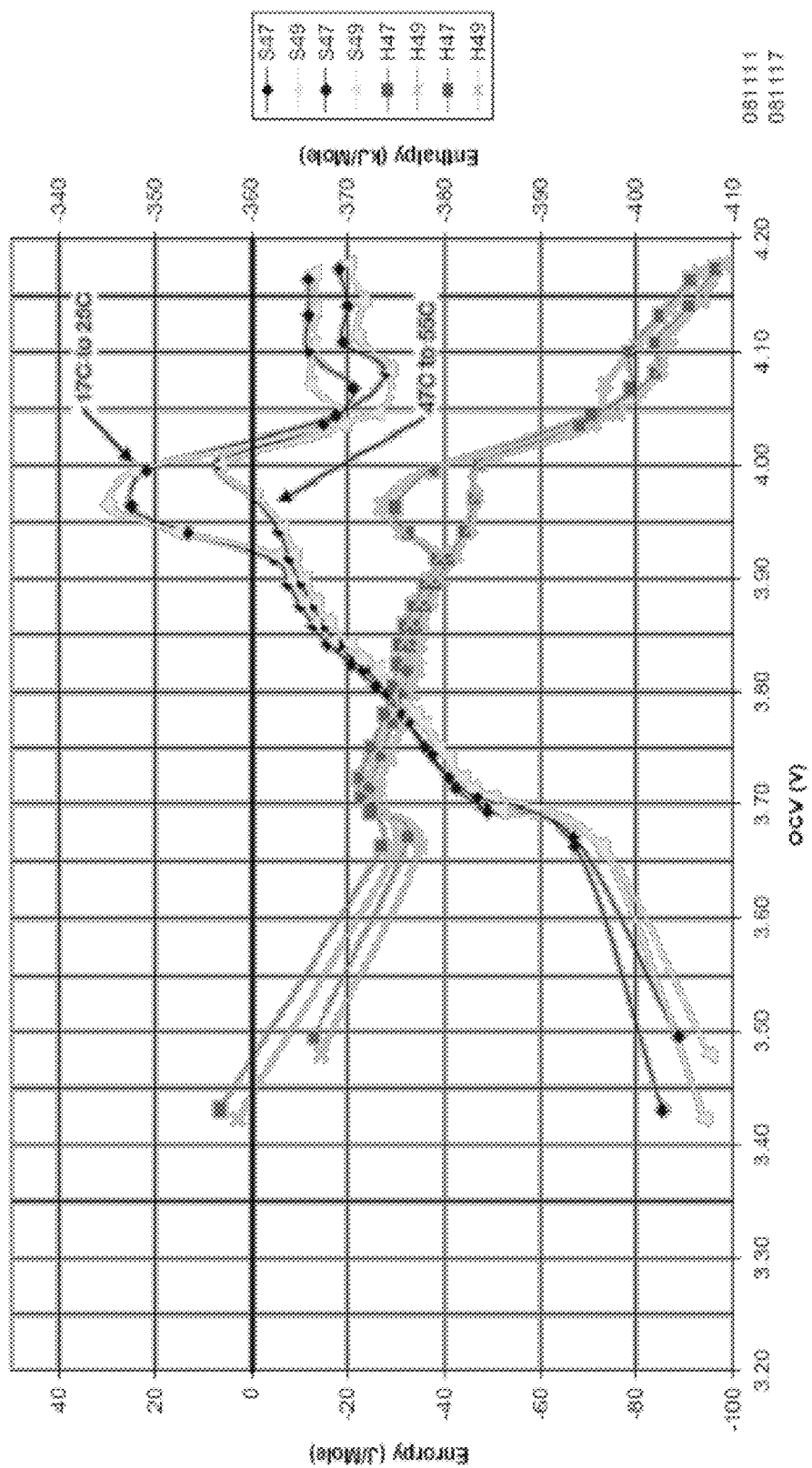
FIG. 56 shows the data from FIG. 55 plotted versus the Open Circuit Voltage of the cells.

FIG. 56 shows the same data from the previous slide plotted versus the Open Circuit Voltage of the cells. Unlike with the aging data where the same OCV resulted from the same crystal structure, here there is clearly a different crystal structure with different entropy giving the same OCV.

An example of how the cell chemistry can be determined using the entropy and enthalpy measurements is now provided.

Figure 57:
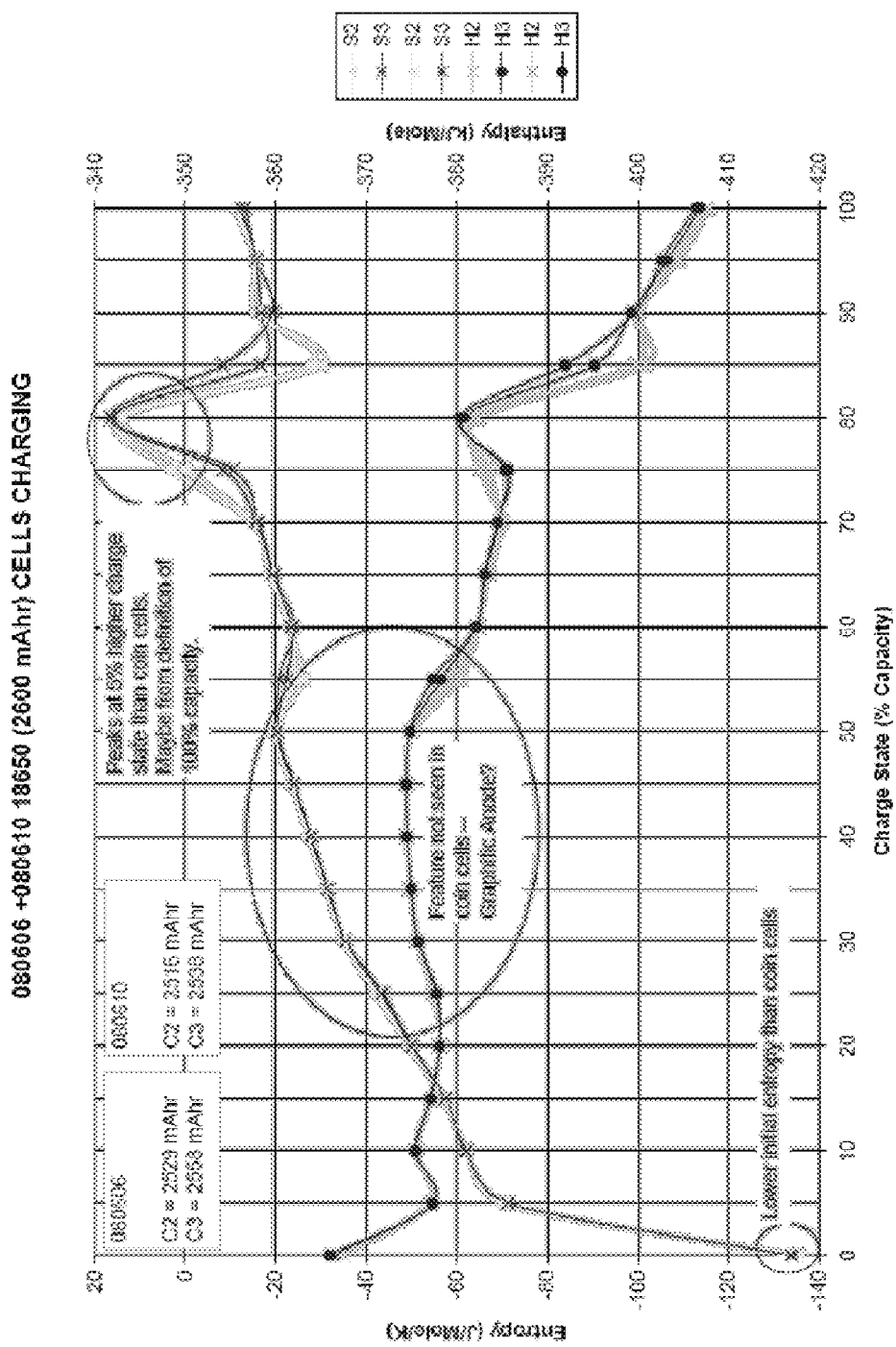
FIG. 57 shows data taken on two 18650 cylindrical cells with 2600 mAhr specified capacity.

FIG. 57 shows data taken on two 18650 cylindrical cells with 2600 mAhr specified capacity. The actual measured capacity for each cell is shown in the upper left. Two electrochemical thermodynamic measurements taken two cycles apart are superimposed on top of each other to show how very repeatable the curves are. These cells were cycled at 30 C between 3.0V and 4.2V with both charge and discharge currents at 900 mA.

Compared with the coin cells tested, the LiCoO$_2$ peak in the entropy curve occurs at about 5% higher state of charge. This could be from different conditions for the "100%" state of charge (SOC) in the two cases. Another significant difference is the broad "bump" in both the entropy and enthalpy curves between about 25% SOC and 55% SOC. This indicates that this 18650 electrode chemistry is not the same as in the coin cells. In addition, the entropy at zero state of charge is much lower than observed in the coin cells (−130 compared to −100). This could be due to cycling these cells down to 3.0 volts instead of 3.2 volts as was done with the coin cells.

Figure 58:
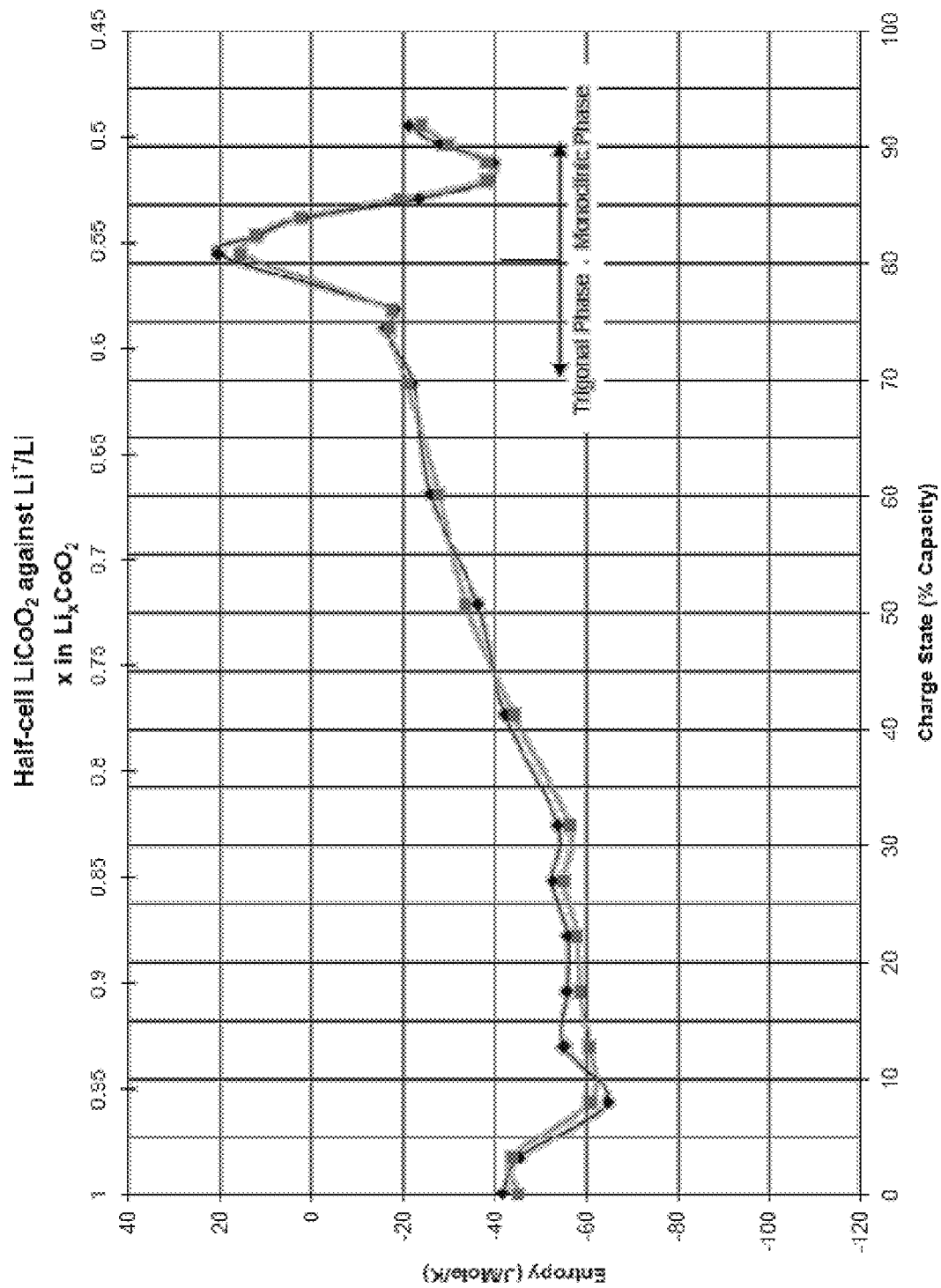
FIG. 58 shows half cell entropy data.

FIG. 58 shows half cell entropy data. Note the distinct peak from the LiCoO$_2$ phase transition between monoclinic and trigonal around 80% state of charge.

Figure 59:
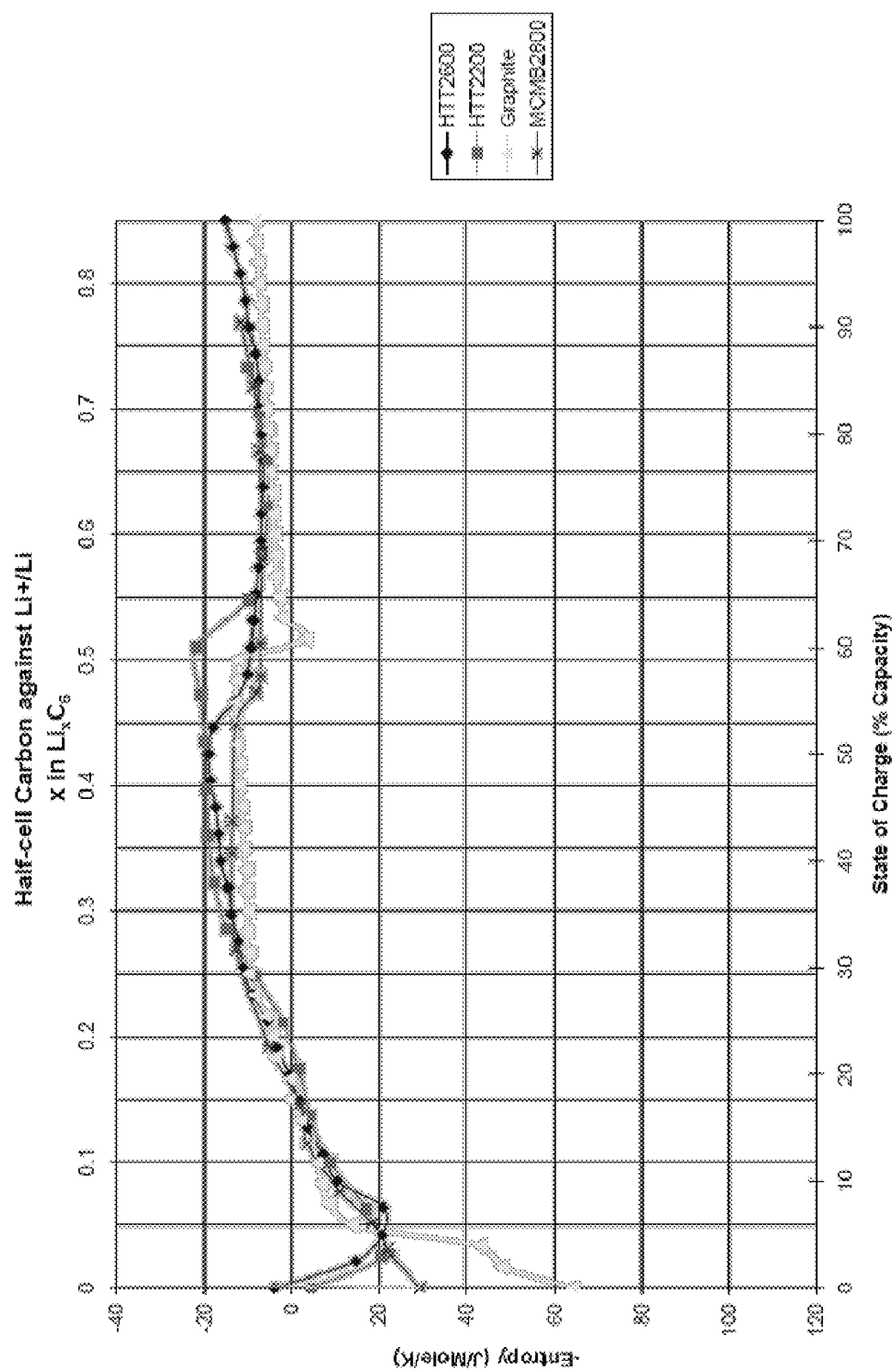
FIG. 59 shows half cell entropy data for several graphitic types of carbon electrodes.

FIG. 59 shows half cell entropy data for several graphitic types of carbon electrodes. The vertical axis is inverted because in the half cell the graphite is a positive electrode and in the full LiCoO$_2$/Graphite cell the graphite is the negative electrode. Note the step in entropy seen in each of the curves at about 50% SOC. This step is not seen in HHT carbon treated at temperatures below 1700° C. or MCMB treated below 1000° C.

Figure 60:
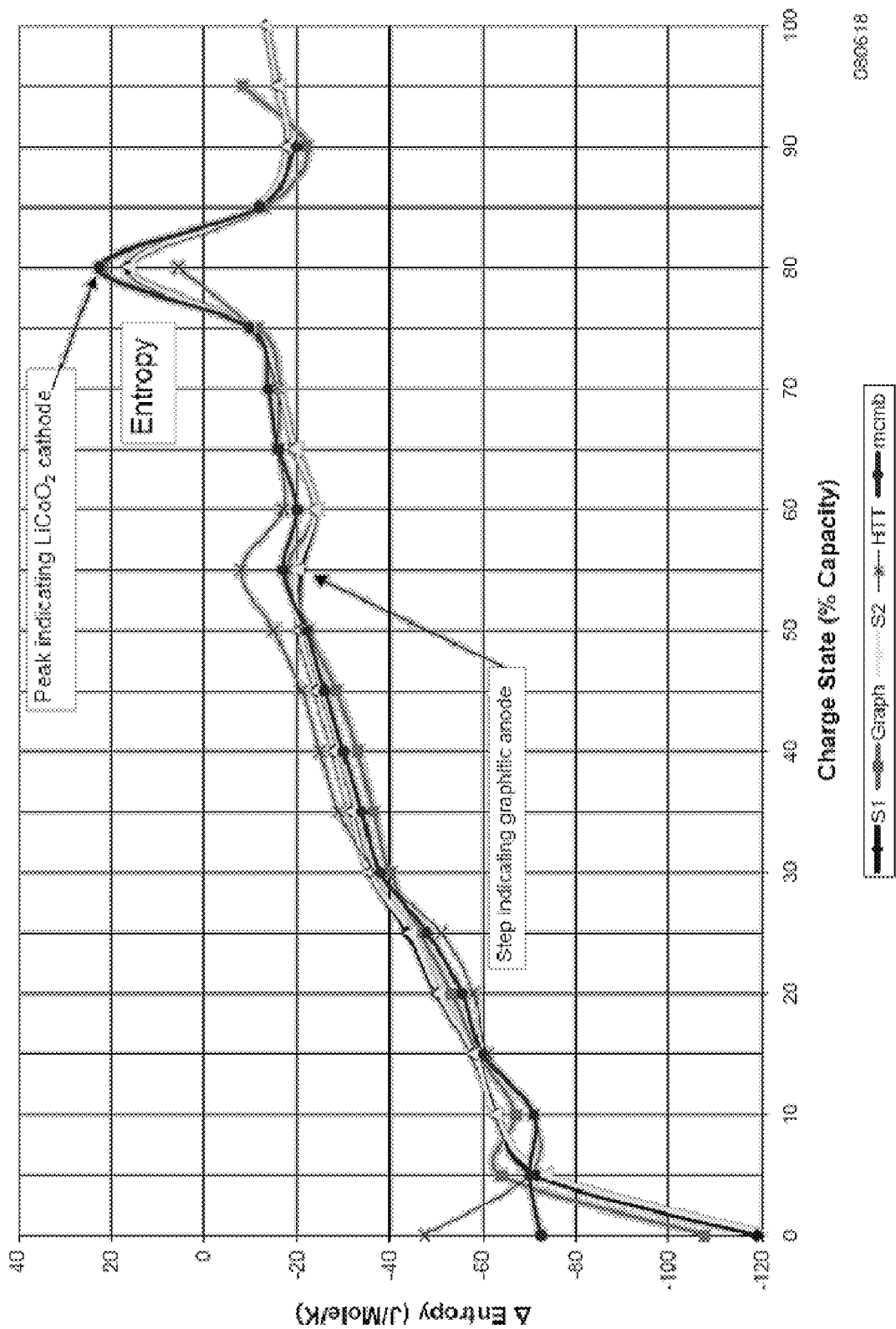
FIG. 60 shows half cell entropy data for several graphitic types of carbon added together and compared with the entropy curve for a 2600 mAhr 18650 cell.

If the half-cell entropy curves for LiCoO$_2$ and the various types of carbon are added together they can be compared to the entropy curve for the 2600 mAhr 18650 cell, as shown in FIG. 60. The graphite and the 2800C MCMB curves fit the step around 50% well, however only the graphite data is a good fit at the discharged state.

Figure 61:
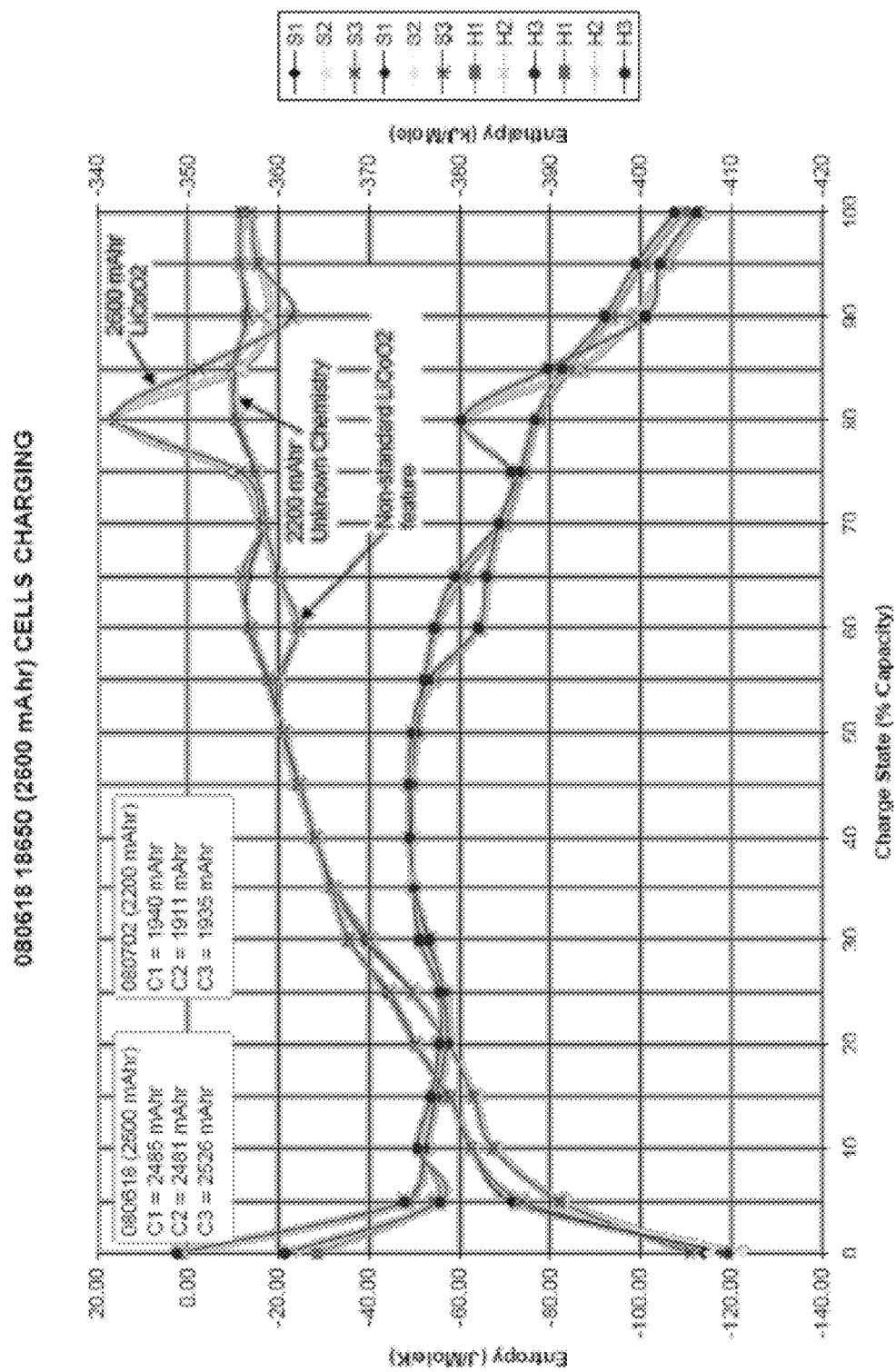
FIG. 61 compares the curves from 2600 mAhr and 2200 mAhr cells from the same manufacturer.

FIG. 61 compares the curves from 2600 mAhr and 2200 mAhr cells from the same manufacturer. Note that the characteristic LiCoO$_2$ entropy peak does not appear in the curves from the 2200 mAhr cells. The step in entropy characteristic of graphite does not show in this curve either. Thus, both the anode and cathode materials are different. The anode material is less graphitic than in the 2600 mAhr cell, and, as shown later, the unknown chemistry is not LiMn$_2$O$_4$.

Figure 62:
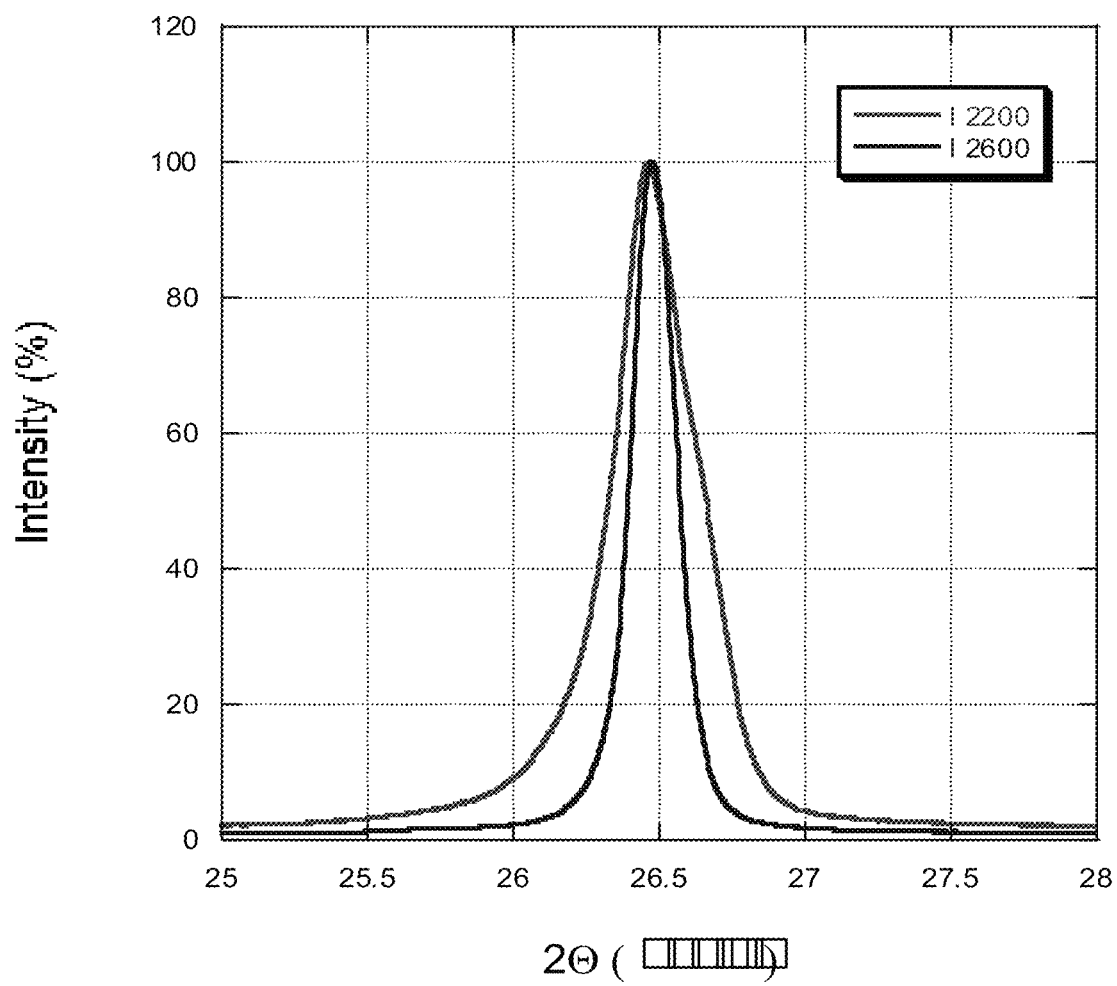
FIG. 62 shows XRD measurements indicate that the 2600 mAhr cell has an anode that is more graphitic than the anode in the 2200 mAhr cell.

Indeed, XRD measurements shown in FIG. 62 also indicate that the 2600 mAhr cell has an anode that is more graphitic than the anode in the 2200 mAhr cell. This measurement required destruction and disassembly of the cells for measurement. The crystallite size calculates to 37 nm for the 2600 mAhr cell and 52 nm for the 2200 mAhr cell.

FIG. 25A shows a plotted OCV vs. composition curve for LiMn$_2$O$_4$. Note the step of about 0.1V between x~0.5 and x~0.6 that is characteristic of LiMn$_2$O$_4$.

Figure 63:
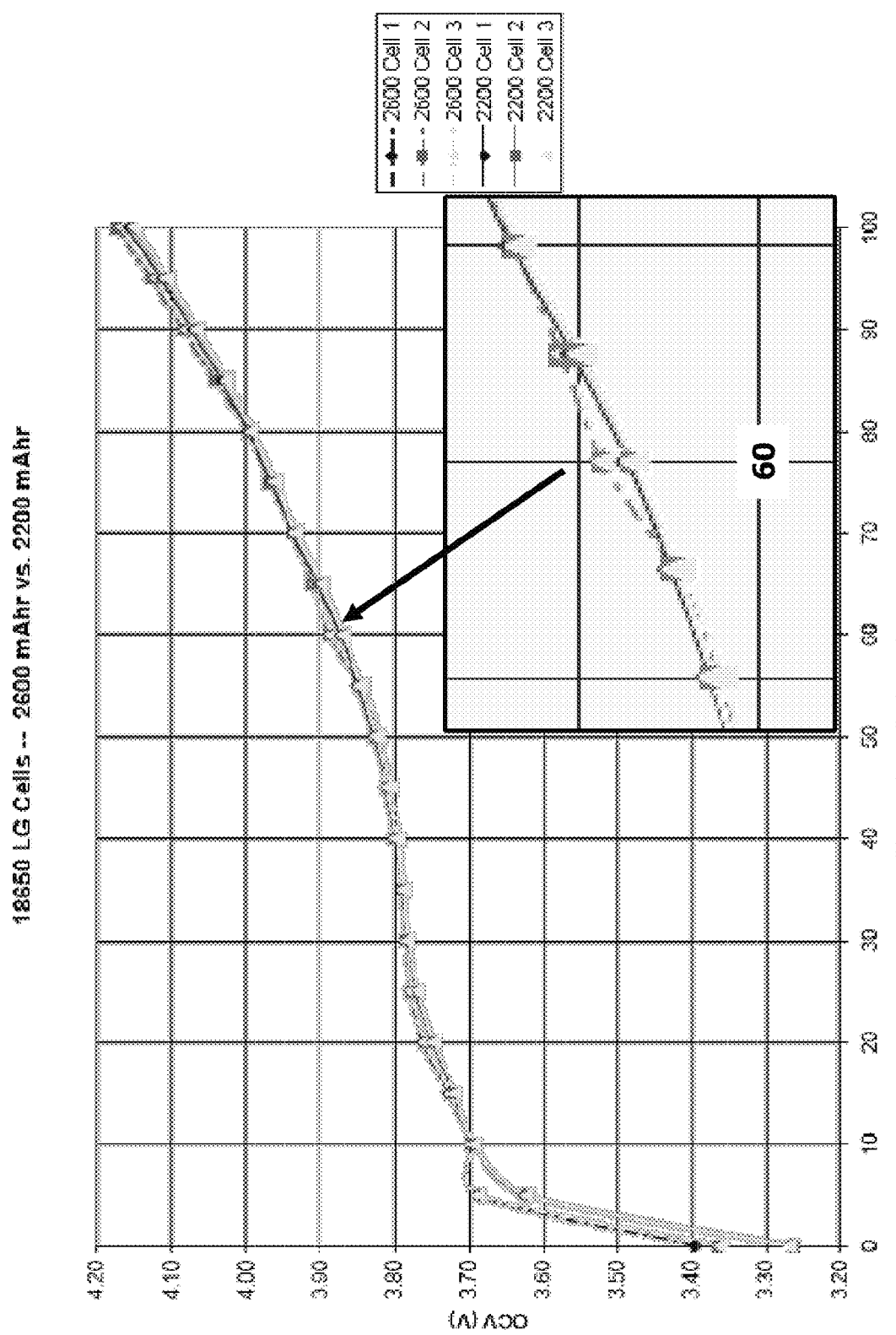
FIG. 63 shows OCV vs SOC curves for 2200 mAhr and 2600 mAhr 18650 cells.

The OCV vs. SOC curves for the 2200 mAhr and 2600 mAhr 18650 cell shown in FIG. 63 show no sign of an expected LiMn$_2$O$_4$ step. The 2600 mAhr is known to be LiCoO$_2$ so the comparison of OCV should show a relative step of about 0.1V if the cathode of the 2200 mAhr cells is LiMn$_2$O$_4$. There is a small bump in the 2600 mAhr curve at 60% SOC that is consistent with graphite in the anode.

In summary, this example shows that Electrochemical Thermodynamic Measurements are a powerful technique to help understand changes in cell electrodes. Advantageously, the technique is non-destructive and can be applied to any cell chemistry. The BA-1000 used for data acquisition in this example is a complete, fully automatic system for obtaining thermodynamic data.

Statements Regarding Incorporation by Reference and Variations

The following references relate generally to the composition and function of electrochemical cells and the thermodynamic analysis of electrochemical data and are incorporated by reference in their entireties herein: Handbook of Batteries, Edited by David Linden and Thomas B. Reddy, Third Edition, McGraw-Hill, 2002; and Battery Technology Handbook, Edited by H. A. Kiehne, Marcel Dekker, Inc., 2003.

All references throughout this application, for example patent documents including issued or granted patents or equivalents; patent application publications; unpublished patent applications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

Any appendix or appendices hereto are incorporated by reference as part of the specification and/or drawings.

Where the terms "comprise", "comprises", "comprised", or "comprising" are used herein, they are to be interpreted as specifying the presence of the stated features, integers, steps, or components referred to, but not to preclude the presence or addition of one or more other feature, integer, step, component, or group thereof. Separate embodiments of the invention are also intended to be encompassed wherein the terms "comprising" or "comprise(s)" or "comprised" are optionally replaced with the terms, analogous in grammar, e.g.; "consisting/consist(s)" or "consisting essentially of/consist(s) essentially of" to thereby describe further embodiments that are not necessarily coextensive.

The invention has been described with reference to various specific and preferred embodiments and techniques. However, it should be understood that many variations and modifications may be made while remaining within the spirit and scope of the invention. It will be apparent to one of ordinary skill in the art that compositions, methods, devices, device elements, materials, procedures and techniques other than those specifically described herein can be applied to the practice of the invention as broadly disclosed herein without resort to undue experimentation. All art-known functional equivalents of compositions, methods, devices, device elements, materials, procedures and techniques described herein are intended to be encompassed by this invention. Whenever a range is disclosed, all subranges and individual values are intended to be encompassed as if separately set forth. This invention is not to be limited by the embodiments disclosed, including any shown in the drawings or exemplified in the specification, which are given by way of example or illustration and not of limitation. The scope of the invention shall be limited only by the claims.

REFERENCES

Y. Reynier, R. Yazami and B. Fultz, *J. Electrochem. Soc.* 151, A422 (2004).

A. Mabuchi, K. Tokumitsu, H. Fujimoto, T. Kasuh, *J. Electrochem. Soc.* 142, 1041 (1995).

A. Oberlin and G. Terriere, *Carbon,* 13, 367 (1975).

J. Mering and J. Maire, *J. Chim. Phys. Fr.* 57, 803 (1960).

F. Tuinstra and J. L. Koenig *J. Chem. Phys.* 53, 1126 (1970).

N. Wada, P. J. Gaczi and S. A. Solin, *J. Non-Cryst. Solids* 35, 543 (1980).

R. Yazami and Y. Reynier, *J. Power Sources,* to be published (2005).

H. Kataoka, Y. Saito, O. Omae, J. Suzuki, K. Sekine, T. Kawamura and T. Takamurae, *Electrochem. and Solid-State Lett.,* 5, A10 (2002).

P. Papanek, M. Radosavljevic and J. E. Fischer, *Chem. Mater.* 8, 1519 (1996).

Y. Mori, T. Iriyama, T. Hashimoto, S. Yamazaki, F. Kawakami, H. Shiroki and T. Yamabe, *J. Power Sources* 56, 205 (1995).

M. Letellier, F. Chevallier, F. Béguin, E. Frackowiak, J-N. Rouzau, *J. Phys. and Chem. of Solids* 65, 245 (2004).

P. Papanek, W. A. Kamitakahara, P. Zhou and J. E. Fischer, *J. Phys. Condens. Matter* 13, 8287 (2001).

D. A. Stevens and J. R. Dahn, *J. Electrochem. Soc.* 148, A803 (2001).

G. Bathia, R. K. Aggarwal, N. Punjabi and O. P. Bahl, *J. Mater. Science* 32, 135 (1997).

K. Kumaresan, G. Sikha; R. E. White, JOURNAL OF THE ELECTROCHEMICAL SOCIETY 155 (2008) A164-A171.

W. Lu; I. Belharouak; J. Liu; K. Amine, JOURNAL OF POWER SOURCES 174 (2007): 673-677.

Okamoto, E; Nakamura, M; Akasaka, Y; Inoue, Y; Abe, Y; Chinzei, T; Saito, I; Isoyama, T; Mochizuki, S; Imachi, K; Mitamura, Y. Analysis of heat generation of lithium ion rechargeable batteries used in implantable battery systems for driving undulation pump ventricular assist device. ARTIFICIAL ORGANS 31 (7): 538-541, 2007.

Lu, W; Belharouak, I; Park, S H; Sun, Y K; Amine, K. Isothermal calorimetry investigation of $Li1+xMn2-yAlzO4$ spinel. ELECTROCHIMICA ACTA 52 (19): 5837-5842, 2007.

Lu, W; Belharouak, I; Vissers, D; Amine, K. In situ thermal study of $Li1+x[Ni1/3Co1/3Mn1/3](1-x)O-2$ using isothermal micro-calorimetric techniques. JOURNAL OF THE ELECTROCHEMICAL SOCIETY 153 (11): A2147-A2151, 2006.

Ohshima, T; Nakayama, M; Fukuda, K; Araki, T; Onda, K. Thermal behavior of small lithium-ion secondary battery during rapid charge and discharge cycles. ELECTRICAL ENGINEERING IN JAPAN 157 (3): 17-25, 2006.

Wang, M J; Navrotsky, A. $LiMO2$ (M=Mn, Fe, and Co): Energetics, polymorphism and phase transformation. JOURNAL OF SOLID STATE CHEMISTRY 178 (4): 1230-1240, 2005.

Rao, L; Newman, J. Heat-generation rate and general energy balance for insertion battery systems. JOURNAL OF THE ELECTROCHEMICAL SOCIETY 144 (8): 2697-2704, 1997.

Huang, Q; Yan, M M; Jiang, Z Y. Thermal study on single electrodes in lithium-ion battery. JOURNAL OF POWER SOURCES 156 (2): 541-546, 2006.

Takano, K; Saito, Y; Kanari, K; Nozaki, K; Kato, K; Negishi, A; Kato, T. Entropy change in lithium ion cells on charge and discharge. JOURNAL OF APPLIED ELECTROCHEMISTRY 32 (3): 251-258, 2002.

Funahashi, A; Kida, Y; Yanagida, K; Nohma, T; Yonezu, I. Thermal simulation of large-scale lithium secondary batteries using a graphite-coke hybrid carbon negative electrode and $lini0.7Co0.3O2$ positive electrode. JOURNAL OF POWER SOURCES 104 (2): 248-252, 2002.

Selman, J R; Al Hallaj, S; Uchida, I; Hirano, Y. Cooperative research on safety fundamentals of lithium batteries. JOURNAL OF POWER SOURCES 97-8: 726-732, 2001.

Al Hallaj, S; Prakash, J; Selman, J R, Characterization of commercial Li-ion batteries using electrochemical-calorimetric measurements. JOURNAL OF POWER SOURCES 87 (1-2), 186-194, 2000

Sandhu, S S; Fellner, J P. Thermodynamic equations for a model lithium-ion cell. ELECTROCHIMICA ACTA 45 (6): 969-976, 1999.

Hong, J S; Maleki, H; Al Hallaj, S; Redey, L; Selman, JR. Electrochemical-calorimetric studies of lithium-ion cells. JOURNAL OF THE ELECTROCHEMICAL SOCIETY 145 (5): 1489-1501, 1998.

Saito, Y; Kanari, K; Takano, K. Thermal studies of a lithium-ion battery. JOURNAL OF POWER SOURCES 68 (2): 451-454, 1997.

Doi, T; Fukudome, H; Okada, S; Yamaki, J I. Computer simulation of a porous positive electrode for lithium batteries. JOURNAL OF POWER SOURCES 174 (2): 779-783, 2007.

Thomas, K E; Newman, J. Thermal modeling of porous insertion electrodes. JOURNAL OF THE ELECTROCHEMICAL SOCIETY 150 (2): A176-A192, 2003.

Kalikmanov, V I; de Leeuw, S W. Role of elasticity forces in thermodynamics of intercalation compounds: Self-consistent mean-field theory and Monte Carlo simulations. JOURNAL OF CHEMICAL PHYSICS 116 (7): 3083-3089, 2002.

Kim, S W; Pyun, S I. Thermodynamic and kinetic approaches to lithium intercalation into a $Li1-delta\ Mn2O4$ electrode using Monte Carlo simulation. ELECTROCHIMICA ACTA 46 (7): 987-997, 2001.

Botte, G G; Subramanian, V R; White, R E. Mathematical modeling of secondary lithium batteries. ELECTROCHIMICA ACTA 45 (15-16): 2595-2609, 2000.

Kuko T and Hibino M., Theoretical dependence of the free energy and chemical potential upon composition in intercalation systems with repulsive interaction between guest ions, Electrochem. Acta 43(7):781-789, 1998

Shi, S; Ouyang, C; Lei, M; Tang, W. Effect of Mg-doping on the structural and electronic properties of $LiCoO2$: A first-principles investigation. JOURNAL OF POWER SOURCES 171 (2): 908-912, 2007.

Kuhn, A; Diaz-Carrasco, P; de Dompablo, MEAY; Garcia-Alvarado, F. On the synthesis of ramsdellite $LiTiMO4$ (M=Ti, V, Cr, Mn, Fe): An experimental and computational study of the spinel-ramsdellite transformation. EUROPEAN JOURNAL OF INORGANIC CHEMISTRY (21): 3375-3384, 2007.

Wang, L; Maxisch, T; Ceder, G. A first-principles approach to studying the thermal stability of oxide cathode materials. CHEMISTRY OF MATERIALS 19 (3): 543-552, 2007.

Zhou, F; Maxisch, T; Ceder, G. Configurational electronic entropy and the phase diagram of mixed-valence oxides: The case of lixfepo4. PHYSICAL REVIEW LETTERS 97 (15) 2006.

Wagemaker, M; Van Der Ven, A; Morgan, D; Ceder, G; Mulder, FM; Kearley, G J. Thermodynamics of spinel $LixTiO2$ from first principles. CHEMICAL PHYSICS 317 (2-3): 130-136, 2005.

Koudriachova, M V; Harrison, N M; de Leeuw, S W. First principles predictions for intercalation behaviour. SOLID STATE IONICS 175 (1-4): 829-834, 2004.

Chen, Z W; Xuan, C; Ying, Z; Yong, Y. First principle investigation of positive electrode material for lithium ion batteries. RARE METAL MATERIALS AND ENGINEERING 32 (9): 693-698, 2003.

Carlier, D; Van der Ven, A; Delmas, C; Ceder, G. 2003. First-principles investigation of phase stability in the O-2-$LiCoO2$ system. CHEMISTRY OF MATERIALS 15 (13): 2651-2660.

Shi, S Q; Wang, D S; Meng, S; Chen, L Q; Huang, X J. First-principles studies of cation-doped spine $LiMn2O4$ for lithium ion batteries. PHYSICAL REVIEW B 67 (11) 2003.

Ceder, G; Van der Ven, A. Phase diagrams of lithium transition metal oxides: investigations from first principles. ELECTROCHIMICA ACTA 45 (1-2): 131-150, 1999.

Benco, L; Barras, J L; Atanasov, M; Daul, C; Deiss, E. First principles calculation of electrode material for lithium intercalation batteries: TiS2 and LiTi2S4 cubic spinel structures. JOURNAL OF SOLID STATE CHEMISTRY 145 (2): 503-510, 1999.

Ceder, G; Kohan, A F; Aydinol, M K; Tepesch, P D; Van der Ven, A. Thermodynamics of oxides with substitutional disorder: A microscopic model and evaluation of important energy contributions. JOURNAL OF THE AMERICAN CERAMIC SOCIETY 81 (3): 517-525, 1998.

Deiss, E; Wokaun, A; Barras, J L; Daul, C; Dufek, P. Average voltage, energy density, and specific energy of lithium-ion batteries—Calculation based on first principles. JOURNAL OF THE ELECTROCHEMICAL SOCIETY 144 (11): 3877-3881, 1997.

Aydinol, M K; Kohan, A F; Ceder, G; Cho, K; Joannopoulos, J. Ab initio study of lithium intercalation in metal oxides and metal dichalcogenides. PHYSICAL REVIEW B 56 (3): 1354-1365, 1997.

Hallstedt, B; Kim, O. Thermodynamic assessment of the Al—Li system. INTERNATIONAL JOURNAL OF MATERIALS RESEARCH 98 (10): 961-969, 2007.

Paddon, C A; Jones, SEW; Bhatti, F L; Donohoe, T J; Compton, R G. Kinetics and thermodynamics of the Li/Li+ couple in tetrahydrofuran at low temperatures (195-295 K). JOURNAL OF PHYSICAL ORGANIC CHEMISTRY 20 (9): 677-684, 2007.

Reynier, Y F; Yazami, R; Fultz, B. Thermodynamics of lithium intercalation into graphites and disordered carbons. JOURNAL OF THE ELECTROCHEMICAL SOCIETY 151 (3): A422-A426, 2004.

Reynier, Y; Yazami, R; Fultz, B. The entropy and enthalpy of lithium intercalation into graphite. JOURNAL OF POWER SOURCES 119: 850-855, 2003.

Lee, H H; Wan, C C; Wang, Y Y. Identity and thermodynamics of lithium intercalated in graphite. JOURNAL OF POWER SOURCES 114 (2): 285-291, 2003.

Ol'shanskaya, LN; Astaf'eva, EN. Thermodynamics of lithium intercalates in carbonized fabric. RUSSIAN JOURNAL OF APPLIED CHEMISTRY 75 (5): 740-744, 2002.

Al Hallaj, S; Venkatachalapathy, R; Prakash, J; Selman, J R. Entropy changes due to structural transformation in the graphite anode and phase change of the LiCoO2 cathode. JOURNAL OF THE ELECTROCHEMICAL SOCIETY 147 (7): 2432-2436, 2000.

Gong, J B; Wu, H Q. Electrochemical intercalation of lithium species into disordered carbon prepared by the heat-treatment of poly (p-phenylene) at 650 degrees C. for anode in lithium-ion battery. ELECTROCHIMICA ACTA 45 (11): 1753-1762, 2000.

Yamaki, J; Egashira, M; Okada, S. Potential and thermodynamics of graphite anodes in Li-ion cells. JOURNAL OF THE ELECTROCHEMICAL SOCIETY 147 (2): 460-465, 2000.

Huggins, R A. Lithium alloy negative electrodes. JOURNAL OF POWER SOURCES 82: 13-19, 1999.

Attidekou, P S; Garcia-Alvarado, F; Connor, P A; Irvine, J T S. Thermodynamic aspects of the reaction of lithium with SnP2O7 based positive electrodes. JOURNAL OF THE ELECTROCHEMICAL SOCIETY 154 (3): A217-A220, 2007.

Takahashi, Y; Kijima, N; Dokko, K; Nishizawa, M; Uchida, I; Akimoto, J. Structure and electron density analysis of electrochemically and chemically delithiated LiCoO2 single crystals. JOURNAL OF SOLID STATE CHEMISTRY 180 (1): 313-321, 2007.

Lu, W Q; Yang, H; Prakash, J. Determination of the reversible and irreversible heats of LiNi(0.8)Co(0.2)O(2)/mesocarbon microbead Li-ion cell reactions using isothermal microcalorimetery. ELECTROCHIMICA ACTA 51 (7): 1322-1329, 2006.

Wang, M J; Navrotsky, A. Enthalpy of formation of LiNiO2, LiCoO2 and their solid solutions LiNi1–xCoxO2. SOLID STATE IONICS 166 (1-2): 167-173, 2004.

Vicente, C P; Lloris, J M; Tirado, J L. Understanding the voltage profile of Li insertion into LiNi0.5–yFeyMn1.5O4 in Li cells. ELECTROCHIMICA ACTA 49 (12): 1963-1967, 2004.

Kobayashi, H; Arachi, Y; Kageyama, H; Tatsumi, K. Structural determination of Li1–yNi0.5Mn0.5O2 (y=0.5) using a combination of Rietveld analysis and the maximum entropy method. JOURNAL OF MATERIALS CHEMISTRY 14 (1): 40-42, 2004.

Fujiwara, H; Ueda, Y; Awasthi, A; Krishnamurthy, N; Garg, S P. Determination of standard free energy of formation for niobium silicides by EMF measurements. JOURNAL OF THE ELECTROCHEMICAL SOCIETY 150 (8): J43-J48, 2003.

Thomas, K E; Newman, J. Heats of mixing and of entropy in porous insertion electrodes. JOURNAL OF POWER SOURCES 119: 844-849, 2003.

Yamaki, J; Egashira, M; Okada, S. Voltage prediction from Coulomb potential created by atoms of spinel LiMn2O4 cathode active material for Li ion cells. JOURNAL OF POWER SOURCES 97-8: 349-353, 2001.

Barbato, S; Gautier, J L. Hollandite cathodes for lithium ion batteries. 2. Thermodynamic and kinetics studies of lithium insertion into BaMmn7O16 (M=Mg, Mn, Fe, Ni). ELECTROCHIMICA ACTA 46 (18): 2767-2776, 2001.

Thomas, K E; Bogatu, C; Newman, J. Measurement of the entropy of reaction as a function of state of charge in doped and undoped lithium manganese oxide. JOURNAL OF THE ELECTROCHEMICAL SOCIETY 148 (6): A570-A575, 2001.

Idemoto, Y; Ogawa, S; Uemura, Y; Koura, N. Thermodynamic stability and cathode performance of Li1+xmn2–xo4 as a cathode active material for lithium secondary battery. JOURNAL OF THE CERAMIC SOCIETY OF JAPAN 108 (9): 848-853, 2000.

Idemoto, Y; Ogawa, S; Koura, N; Udagawa, K. Thermodynamic stability and cathode performance of limn2–xmgxo4 as cathode active material for the lithium secondary battery. ELECTROCHEMISTRY 68 (6): 469-473, 2000.

Kumagai, N; Koishikawa, Y; Komaba, S; Koshiba, N., Thermodynamics and kinetics of lithium intercalation into Nb2O5 electrodes for a 2 V rechargeable lithium battery. JOURNAL OF THE ELECTROCHEMICAL SOCIETY 146 (9): 3203-3210, 1999

Korovin, N V. Electrochemical intercalation into cathodic materials: Electrode potentials. RUSSIAN JOURNAL OF ELECTROCHEMISTRY 34 (7): 669-675, 1998.

Kumagai, N; Yu, $\Delta$S; Kumagai, N; Yashiro, H. Electrochemical intercalation of lithium into hexagonal tungsten trioxide. THERMOCHIMICA ACTA 299 (1-2): 19-25, 1997.

Guzman, G; Yebka, B; Livage, J; Julien, C. Lithium intercalation studies in hydrated molybdenum oxides. SOLID STATE IONICS 86-8: 407-413, Part 1. 1996.

Kumagai, N; Fujiwara, T; Tanno, K; Horiba, T. Thermodynamic And Kinetic-Studies of Electrochemical Lithium Insertion Into Quaternary Li—Mn—V—O Spinel As Positive Materials For Rechargeable Lithium Batteries. Journal of The Electrochemical Society 140 (11): 3194-3199, 1993.

Baddour, R; Pereiraramos, J P; Messina, R; Perichon, J. A Thermodynamic, Structural and Kinetic-Study of the Electrochemical Lithium Intercalation Into the Xerogel V2O5.1.6H2O In A Propylene Carbonate Solution. Journal of Electroanalytical Chemistry 314 (1-2): 81-101, 1991

Joo, J H; Bae, Y C. Molecular thermodynamics approach for phase behaviors of solid polymer electrolytes/salt system in lithium secondary battery on the nonrandom mixing effect: Applicability of the group-contribution method. POLYMER 47 (20): 7153-7159, 2006.

Joo, J H; Bae, Y C; Sun, Y K. Phase behaviors of solid polymer electrolytes/salt system in lithium secondary battery by group-contribution method: The pressure effect. POLYMER 47 (1): 211-217, 2006.

Limthongkul, P; Jang, Y I; Dudney, N J; Chiang, Y M. Electrochemically-driven solid-state amorphization in lithium-metal anodes. JOURNAL OF POWER SOURCES 119: 604-609, 2003.

Yamaki, J; Egashira, M; Okada, S. Thermodynamics and phase separation of lithium intercalation materials used in lithium ion cells. ELECTROCHEMISTRY 69 (9): 664-669, 2001.

Hong, J S; Selman, J R. Relationship between calorimetric and structural characteristics of lithium-ion cells-I. Thermal analysis and phase diagram. JOURNAL OF THE ELECTROCHEMICAL SOCIETY 147 (9): 3183-3189, 2000.

Vitins, G; West, K. Lithium intercalation into layered LiMnO2. JOURNAL OF THE ELECTROCHEMICAL SOCIETY 144 (8): 2587-2592, 1997.

Kumagai, N; Yu, A S; Yashiro, H. Thermodynamics and kinetics of electrochemical intercalation of lithium into Li0.50WO3.25 with a hexagonal tungsten bronze structure. SOLID STATE IONICS 98 (3-4): 159-166, 1997.

Barker, J; West, K; Saidi, Y; Pynenburg, R; Zachauchristiansen, B; Koksbang, R. Kinetics and Thermodynamics of the Lithium Insertion Reaction in Spinel Phase LixMn2O4. Journal of Power Sources 54 (2): 475-478, 1995.

Idemoto, Y; Sakaya, T; Koura, N., Dependence of properties, crystal structure and electrode characteristics on Li content for LixCo1/3Ni1/3Mn1/3O2+delta as a cathode active material for Li secondary battery. ELECTROCHEMISTRY 74 (9): 752-757, 2006.

Maier J., JOURNAL OF POWER SOURCES 174 (2007): 569-574.

Quintin, M; Devos, 0; Delville, M H; Campet, G. Study of the lithium insertion-deinsertion mechanism in nanocrystalline gamma-Fe2O3 electrodes by means of electrochemical impedance spectroscopy. ELECTROCHIMICA ACTA 51 (28): 6426-6434, 2006.

Garcia-Belmonte, G; Garcia-Canadas, J; Bisquert, J. Correlation between volume change and cell voltage variation with composition for lithium intercalated amorphous films. JOURNAL OF PHYSICAL CHEMISTRY B 110 (10): 4514-4518, 2006.

Xu, J J; Jain, G. Nanocrystalline ferric oxide cathode for rechargeable lithium batteries. ELECTROCHEMICAL AND SOLID STATE LETTERS 6 (9): A190-A193, 2003.

Schoonman, J. Nanoionics. SOLID STATE IONICS 157 (1-4): 319-326, 2003.

Hill I R, Sibbald A M, Donepudi V S, Adams W A, Donaldson G J, Microcalorimetric studies on lithium thionyl chloride cells—temperature effects between 25-degrees-C. and −40-degrees-C., Journal of Power Sources, 39 (1): 83-94, 1992.

Gautier J L, Meza E, Silva E, Lamas C, Silva C, Effect of the ZnNiyMn2−yO4 (0 <=y<=1) spinel composition on electrochemical lithium insertion, Journal of Solid State Electrochemistry, 1(2): 126-133, 1997.

Oberlin A, Carbonization and Graphitization, Carbon 22 (6): 521-541, 1984.

Rosalind E. Franklin, Crystallite Growth in Graphitizing and Non-Graphitizing Carbons, Proceedings of the Royal Society of London. Series A, Mathematical and Physical Sciences, Vol. 209, No. 1097 (Oct. 23, 1951), pp. 196-218.

Tuinstra F, Koenig J L, Raman Spectrum Of Graphite, Journal of Chemical Physics 53 :1126, 1970.

Nikiel L, W, Raman-Spectroscopic Characterization of Graphites—A Reevaluation Of Spectra/Structure Correlation, Carbon, 31(8): 1313-1317, 1993.

Billaud D, Henry F X, Lelaurain M, Willmann P Revisited structures of dense and dilute stage II lithium-graphite intercalation compounds. JOURNAL OF PHYSICS AND CHEMISTRY OF SOLIDS 57 (6-8): 775-781, 1996.

Filhol, J.-S., Combelles, C., Yazami, R., Doublet, M.-L., Phase diagrams for systems with low free energy variation: A coupled theory/experiments method applied to Li-graphite, JOURNAL OF PHYSICAL CHEMISTRY C, 112 (10): 3982-3988, 2008.

Amatucci G G, Tarascon J M, Klein L C, CoO2, the end member of the LixCoO2 solid solution, JOURNAL OF THE ELECTROCHEMICAL SOCIETY, 143(3): 1114-1123, 1996.

Gabrisch H, Yazami R, Fultz B, Hexagonal to cubic spinel transformation in lithiated cobalt oxide—TEM investigation, JOURNAL OF THE ELECTROCHEMICAL SOCIETY, 151 (6): A891-A897, 2004.

Chen Z H, Lu Z H, Dahn J R, Staging phase transitions in LixCoO2, JOURNAL OF THE ELECTROCHEMICAL SOCIETY, 149(12): A1604-A1609, 2002.

Van der Ven A, Aydinol M K, Ceder G, First-principles evidence for stage ordering in LixCoO2, JOURNAL OF THE ELECTROCHEMICAL SOCIETY, 145 (6): 2149-2155, 1998.

Ohzuku T, Ueda A, Solid-state redox reactions of LiCoO2 (R(3)over-bar-m) for 4 volt secondary lithium cells, JOURNAL OF THE ELECTROCHEMICAL SOCIETY, 141 (11): 2972-2977, 1994.

TARASCON J M, GUYOMARD D, Li metal-free rechargeable batteries based on Li1+xMn2O4 cathodes (0 less-than-or-equal-to x less-than-or-equal-to 1) and carbon anodes, JOURNAL OF THE ELECTROCHEMICAL SOCIETY, 138 (10): 2864-2868, 1991.

Aurbach D, Levi M D, Gamulski K, Markovsky B, Salitra G, Levi E, Heider U, Heider L, Oesten R, Capacity fading of LixMn2O4 spinel electrodes studied by XRD and electroanalytical techniques, JOURNAL OF POWER SOURCES, 81: 472-479, 1999.

Shin Y J, Manthiram A, Factors influencing the capacity fade of spinel lithium manganese oxides, JOURNAL OF THE ELECTROCHEMICAL SOCIETY 151 (2): A204-A208, 2004.

Wakihara M, Lithium manganese oxides with spinel structure and their cathode properties for lithium ion battery, ELECTROCHEMISTRY, 73 (5): 328-335, 2005.

Huang H, Vincent C A, Bruce P G, Correlating capacity loss of stoichiometric and nonstoichiometric lithium manganese oxide spinel electrodes with their structural integrity JOURNAL OF THE ELECTROCHEMICAL SOCIETY, 146 (10): 3649-3654, 1999.

Amatucci G, Du Pasquier A, Blyr A, Zheng T, Tarascon J M, The elevated temperature performance of the LiMn2O4/C system: failure and solutions ELECTROCHIMICA ACTA 45 (1-2): 255-271, 1999.

Amatucci G G, Blyr A, Sigala C, Alfonse P, Tarascon J M, Surface treatments of Li1+xMn2-xO4 spinels for improved elevated temperature performance SOLID STATE IONICS Volume: 104 Issue: 1-2 Pages: 13-25 Published: DEC 1997.

Shiraishi Y, Nakai I, Kimoto K, Matsui Y, EELS analysis of electrochemically deintercalated Li1−xMn2O4 and substituted spinels LiMn1.6M0.4O4 (M=Co, Cr, Ni), JOURNAL OF POWER SOURCES 97-8 : 461-464, 2001.

Graetz J, Hightower A, Ahn C C, Yazami R, Rez P, Fultz B, Electronic structure of chemically-delithiated LiCoO2 studied by electron energy-loss spectrometry JOURNAL OF PHYSICAL CHEMISTRY B Volume: 106 (6): 1286-1289, 2002.

Gabrisch, H.; Yi, T.; Yazami, R., Transmission electron microscope studies of LiNi1/3Mn1/3Co1/3/O2 before and after long-term aging at 70 degrees C., Electrochemical and Solid-State Letters Volume: 11(7): 119-24, 2008.

We claim:

1. A method of characterizing the state of health of an electrochemical cell comprising a host material, the method comprising the steps of:
    determining a change in Gibbs Free Energy ($\Delta G$), a change in Entropy($\Delta S$), a change in Enthalpy ($\Delta H$) or any combination thereof of the electrochemical cell for a plurality of selected electrochemical cell compositions;
    determining states of charge of the electrochemical cell for each of the plurality of selected electrochemical cell compositions;
    identifying the states of charge and $\Delta G$, $\Delta S$, $\Delta H$ or any combination thereof corresponding to an event or condition of the electrochemical cell; and
    comparing the $\Delta G$, $\Delta S$, $\Delta H$ or any combination thereof corresponding to the event or condition of the electrochemical cell to reference $\Delta G$, $\Delta S$, $\Delta H$ or any combination thereof corresponding to the event or condition of a reference electrochemical cell; wherein the event or condition is selected from the group consisting of: a 0% charge state of the electrochemical cell, a 100% charge state of the electrochemical cell, a partial charge state of the electrochemical cell and a phase transition taking place within the electrochemical cell;
    wherein the step of determining $\Delta G$, $\Delta S$, $\Delta H$ or any combination thereof of the electrochemical cell for the plurality of selected electrochemical cell compositions comprises the steps of:
        controlling the composition of the electrochemical cell to establish said plurality of selected electrochemical cell compositions;
        controlling the temperature of the electrochemical cell to establish a plurality of selected electrochemical cell temperatures for each of the selected electrochemical cell compositions;
        measuring open circuit voltages of the electrochemical cell as a function of time for the selected electrochemical cell compositions and temperatures; and
        identifying open circuit voltages for thermochemically stabilized conditions of the electrochemical cell for the selected electrochemical cell compositions and temperatures.

2. The method of claim 1, wherein the selected electrochemical cell compositions correspond to compositions of an electrode of the electrochemical cell, compositions of an electrolyte of the electrochemical cell, or compositions or more than one electrode of the electrochemical cell.

3. The method of claim 1, wherein the reference $\Delta G$, $\Delta S$, $\Delta H$ or any combination thereof are $\Delta G$, $\Delta S$, $\Delta H$ or any combination thereof for the electrochemical cell at a previous charge or discharge cycle.

4. The method of claim 1, wherein the plurality of electrochemical cell compositions corresponds to a plurality of states of charge of the electrochemical cell for a single electrochemical cell temperature.

5. The method of claim 1, further comprising a step of controlling the temperature of the electrochemical cell, monitoring the temperature of the electrochemical cell or both controlling and monitoring the temperature of the electrochemical cell.

6. The method of claim 1, further comprising the step of:
    determining a change in open circuit voltages of the electrochemical cell for thermochemically stabilized conditions between two or more of the selected electrochemical cell temperatures for each of the selected electrochemical cell compositions.

7. The method of claim 1, further comprising the step of:
    generating plots of the open circuit voltages of the electrochemical cell for thermochemically stabilized conditions versus temperature for each of the selected electrochemical cell compositions.

8. The method of claim 7, further comprising the step of: determining slopes and intercepts for each plot, wherein the slopes correspond to $\Delta S$ and the intercepts correspond to $\Delta H$.

9. The method of claim 1, further comprising the step of: computing a linear regression of the open circuit voltages of the electrochemical cell for one or more of said selected electrochemical cell compositions as a function of temperature, wherein a slope of said linear regression corresponds to $\Delta S$ of said electrochemical cell and an intercept of said linear regression corresponds to $\Delta H$ of said electrochemical cell.

10. The method of claim 1, wherein $\Delta G$ of the electrochemical cell is determined by measuring an open circuit voltage of the electrochemical cell.

11. The method of claim 10, wherein $\Delta G$ of the electrochemical cell is determined using the equation $\Delta G = -nFE_0$, where n is the charge number of an ion exchanged at an electrode of said electrochemical cell, F is Faraday constant and $E_0$ is a measured open circuit voltage of the electrochemical cell.

12. The method of claim 1, wherein the step of determining $\Delta G$, $\Delta S$, $\Delta H$ or any combination thereof of the electrochemical cell comprises establishing said plurality of selected electrochemical cell compositions using a composition controller.

13. The method of claim 12, wherein said composition controller is an electrochemical cell charger for charging said electrochemical cell, an electrochemical cell discharger configured for discharging said electrochemical cell or both.

14. The method of claim 12, wherein said composition controller comprises a coulometer.

15. The method of claim 1, wherein the step of determining $\Delta G$, $\Delta S$, $\Delta H$ or any combination thereof of the electrochemical cell comprises establishing a plurality of electrochemical cell temperatures using a temperature controller.

16. The method of claim 15, wherein said temperature controller comprises a heater or cooler.

17. The method of claim 16, wherein said heater or cooler is selected from the group consisting of a thermoelectric cooler, a thermoelectric heater, a resistive heater, a temperature bath, heat pump and a radiative cooler.

18. The method of claim 1, wherein the step of determining states of charge of the electrochemical cell comprises measuring current delivered to or provided by the electrochemical cell as a function of time or measuring a total charge delivered to or provided by the electrochemical cell between two points in time.

19. The method of claim 18, wherein the step of determining states of charge of the electrochemical cell further comprises dividing the total charge delivered to or provided by the electrochemical cell between two points in time by a charge capacity of the electrochemical cell.

20. The method of claim 1, wherein the step of determining states of charge of the electrochemical cell comprises determining a charge delivered to or by the electrochemical cell.

21. The method of claim 20, wherein the states of charge (SOC) of the electrochemical cell are determined using the equation $SOC = 100 \, Q(t)/Q_{th}$, where $Q(t)$ is the charge delivered to or by the electrochemical and $Q_{th}$ is a charge capacity of the electrochemical cell.

22. The method of claim 1, wherein said host material comprises an intercalating electrode.

23. The method of claim 22, wherein said plurality of selected electrochemical cell compositions correspond to different stoichiometries of an intercalant incorporated within said intercalating electrode.

24. The method of claim 22, wherein said intercalating electrode is selected from the group consisting of a carbon electrode, a nanostructured metal oxide electrode, and a nano-phosphate electrode.

25. The method of claim 22, wherein said intercalating electrode comprises a carbonaceous material.

26. The method of claim 22, wherein said intercalating electrode comprises graphite.

27. The method of claim 22, wherein said intercalating electrode comprises disordered carbon or partially-graphitized carbon.

28. The method of claim 22, wherein said intercalating electrode comprises coke.

29. The method of claim 22, wherein said intercalating electrode comprises cobalt oxide.

30. The method of claim 1, wherein said electrochemical cell comprises $Mn_2O_4$, $FePO_4$, $PbO_2$, $CoO_2$, $NiOOH$, or $MnO_2$.

31. The method of claim 1, wherein said electrochemical cell comprises $LiCoO_2$, $LiMn_2O_4$, or $LiFePO_4$.

32. The method of claim 22, wherein said intercalant is lithium.

33. The method of claim 1, wherein said electrochemical cell comprises a lithium battery, a lithium ion battery, lead acid battery, manganese oxide alkaline battery, nickel cadmium battery, or a lithium polymer battery.

* * * * *